US012749153B2

(12) United States Patent
Nielsen et al.

(10) Patent No.: US 12,749,153 B2
(45) Date of Patent: Sep. 29, 2026

(54) IMAGE PROCESSING APPARATUS, IMAGE PROCESSING METHOD, AND MAGNETIC RESONANCE IMAGING APPARATUS

(71) Applicant: Canon Kabushiki Kaisha, Tokyo (JP)

(72) Inventors: Matthew Nielsen, Yokohama (JP); Mitsuhiro Bekku, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 438 days.

(21) Appl. No.: 18/461,033

(22) Filed: Sep. 5, 2023

(65) Prior Publication Data

US 2024/0078636 A1 Mar. 7, 2024

(30) Foreign Application Priority Data

Sep. 5, 2022 (JP) ................................ 2022-140931

(51) Int. Cl.
*G06T 5/50* (2006.01)
*G01R 33/48* (2006.01)
(Continued)

(52) U.S. Cl.
CPC ............ *G06T 5/50* (2013.01); *G01R 33/4818* (2013.01); *G01R 33/5608* (2013.01);
(Continued)

(58) Field of Classification Search
CPC .................... G06T 5/50; G06T 11/006; G06T 2207/10088; G06T 2207/20212; G01R 33/4818; G01R 33/5608; G01R 33/56545
See application file for complete search history.

(56) References Cited

U.S. PATENT DOCUMENTS

| | | | | |
|---|---|---|---|---|
| 9,207,301 B2 * | 12/2015 | Kim | ................. | G01R 33/56518 |
| 2022/0065967 A1 * | 3/2022 | Wang | ............... | G01R 33/56518 |
| 2024/0233093 A1 * | 7/2024 | Novikov | .................. | G06T 5/50 |

FOREIGN PATENT DOCUMENTS

| | | |
|---|---|---|
| JP | 2005-278736 A | 10/2005 |
| JP | 2013-202245 A | 10/2013 |

(Continued)

OTHER PUBLICATIONS

Kellner, Elias, et al. "Gibbs-ringing artifact removal based on local subvoxel-shifts." Magnetic resonance in medicine 76.5 (2016): 1574-1581. (Year: 2016).*

(Continued)

*Primary Examiner* — Oneal R Mistry
*Assistant Examiner* — Jongbong Nah
(74) *Attorney, Agent, or Firm* — Oblon, McClelland, Maier & Neustadt, L.L.P.

(57) ABSTRACT

An image processing apparatus according to an embodiment includes processing circuitry. The processing circuitry obtains, on the basis of a magnetic resonance image, a plurality of shift images resulting from shifting the position of the pixel sampling grid of the magnetic resonance image by a plurality of mutually-different shift amounts. The processing circuitry generates a plurality of ringing-corrected images, by determining, with respect to each of the pixels included in each of the plurality of shift images, a shift amount from the position of the pixel to a position where ringing artifacts will be reduced and further performing a ringing correction to correct the ringing artifacts occurring in the shift images on the basis of the determined shift amounts. The processing circuitry combines, while interleaving, pixels included in each of the plurality of ringing-corrected images.

10 Claims, 32 Drawing Sheets

(51) Int. Cl.
*G01R 33/56* (2006.01)
*G06T 11/00* (2026.01)
*G06T 12/20* (2026.01)

(52) U.S. Cl.
CPC .... *G06T 12/20* (2026.01); *G06T 2207/10088* (2013.01); *G06T 2207/20212* (2013.01)

(56) References Cited

FOREIGN PATENT DOCUMENTS

| | | | | |
|---|---|---|---|---|
| JP | 2020-120704 A | 8/2020 | | |
| WO | WO-2011026923 A1 * | 3/2011 | ............. | G01R 33/56 |

OTHER PUBLICATIONS

Kellner, E. et al. "Gibbs-ringing artifact removal based on local subvoxel-shifts", Magn Reson Med 76:1574-1581, 2016 (8 pages).
Penkin, M.A. et al. "Hybrid Method for Gibbs-Ringing Artifact Suppression in Magnetic Resonance Images", ISSN 0361-7688, Programming and Computer Software, 2021, vol. 47, No. 3 , pp. 207-214, 2021 (8 pages).

* cited by examiner

IMAGE PROCESSING APPARATUS, IMAGE PROCESSING METHOD, AND MAGNETIC RESONANCE IMAGING APPARATUS

CROSS-REFERENCE TO RELATED APPLICATIONS

This application is based upon and claims the benefit of priority from Japanese Patent Application No. 2022-140931, filed on Sep. 5, 2022; the entire contents of which are incorporated herein by reference.

FIELD

Embodiments described herein relate generally to an image processing apparatus, an image processing method, and a magnetic resonance imaging apparatus.

BACKGROUND

Generally speaking, it is known that Magnetic Resonance (MR) images taken by Magnetic Resonance Imaging (MRI) apparatuses may contain stripe artifacts, called ringing or truncation artifacts, in the vicinity of signal intensity boundaries where the intensity changes drastically and sharply. Conventionally, various types of methods for correcting such ringing artifacts have been proposed.

It is also generally known that MR images can be resampled at a higher spatial resolution using a conventionally known method, for example the k-space zero-fill interpolation method, and that under certain conditions, such a method not only improves the nominal resolution, but also improves the resolving power apparent to users of the MR images.

Further, generally speaking, it is known that combining a conventional method for countering ringing artifacts with a conventional method for resampling at a higher spatial resolution tends to produce images that contain residual ringing artifacts.

In both clinical and research fields, there is a demand for MR images in which ringing artifacts have been corrected and in which the spatial resolution is higher than that of the original MR image.

BRIEF DESCRIPTION OF THE DRAWINGS

FIG. 22B illustrates improved continuity of shift amount obtained during the final relative to the initial shift amount determination;

FIG. 23B illustrates improved continuity of shift amount obtained during the final relative to the initial shift amount determination;

DETAILED DESCRIPTION

An image processing apparatus according to an embodiment includes an acquiring unit, a shifting unit, a correcting unit, and a combining unit. The acquiring unit is configured to acquire a magnetic resonance image. The shifting unit is configured to obtain, on the basis of the magnetic resonance image, a plurality of shift images resulting from shifting the positions of pixels included in the magnetic resonance image by a plurality of mutually-different shift amounts. The correcting unit is configured to generate a plurality of ringing-corrected images, by determining, with respect to each of the pixels included in each of the plurality of shift images, a shift amount from the position of the pixel to a position where ringing artifacts will be reduced and further performing a ringing correction to correct the ringing artifacts occurring in the shift images on the basis of the determined shift amounts. The combining unit is configured to generate a combined image by combining, while interleaving along either the X or Y direction, pixels included in each of the plurality of ringing-corrected images. Here, the meaning of "pixel" includes grayscale intensity as well as the pixel's coordinate along the direction that is being interleaved.

Exemplary embodiments of an image processing apparatus, an image processing method, and an MRI apparatus will be explained in detail below, with reference to the accompanying drawings.

First Embodiment

Figure 1:
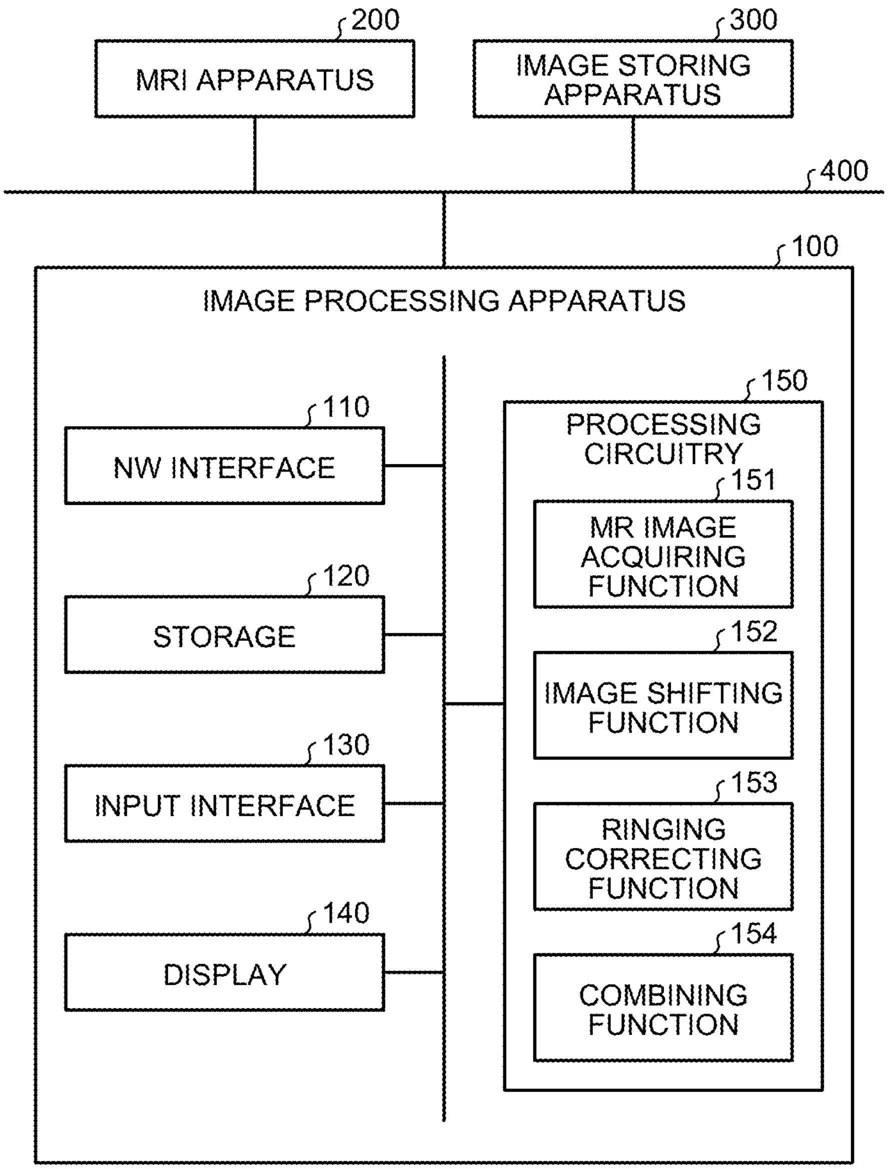
FIG. 1 is a diagram illustrating an exemplary configuration of an image processing apparatus according to a first embodiment.

FIG. 1 is a diagram illustrating an exemplary configuration of an image processing apparatus according to a first embodiment.

For example, as illustrated in FIG. 1, an image processing apparatus 100 according to the present embodiment is connected to an MRI apparatus 200 and an image storing apparatus 300 via a network 400 so as to be able to communicate with one another.

The MRI apparatus 200 is configured to take an image of a subject by employing magnetic resonance phenomena. More specifically, the MRI apparatus 200 is configured to apply a Radio Frequency (RF) pulse to the subject by executing any of various types of imaging sequences on the basis of an image acquisition condition set by an operator, to receive operations radiating from the subject owing to the influence of the RF pulse, and to acquire NMR data based on the NMR signal as k-space data. Further, the MRI apparatus 200 is configured to generate a two- or three-dimensional MR image by performing, on the acquired k-space data, image processing that may include a Fourier transform process or the like.

The image storing apparatus 300 is configured to store therein the MR image taken by the MRI apparatus 200. For example, the image storing apparatus 300 is realized by using a computer machine such as a Picture Archiving and Communication System (PACS) server and is configured to store therein the MR image in a format compliant with a Digital Imaging and Communications in Medicine (DICOM) scheme.

The image processing apparatus 100 is configured to process the MR image related to the subject. More specifically, the image processing apparatus 100 is configured to acquire the MR image from the MRI apparatus 200 or the image storing apparatus 300 via the network 400 and to process the acquired MR image. For example, the image processing apparatus 100 is realized by using a computer machine such as a workstation.

For example, the image processing apparatus 100 includes a network (NW) interface 110, a storage 120, an input interface 130, a display 140, and processing circuitry 150.

The NW interface 110 is configured to control transfer of various types of data and communication performed between the image processing apparatus 100 and other apparatuses via the network 400. More specifically, the NW interface 110 is connected to the processing circuitry 150 and is configured to transmit data received from any of the other apparatuses to the processing circuitry 150 and to transmit data received from the processing circuitry 150 to any of the other apparatuses. For example, the NW interface 110 is realized by using a network card, a network adaptor, a Network Interface Controller (NIC), or the like.

The storage 120 is configured to store therein various types of data and various types of programs. More specifically, the storage 120 is connected to the processing circuitry 150 and is configured to store therein data received from the processing circuitry 150 and to read and transmit data stored therein to the processing circuitry 150. For example, the storage 120 is realized by using a semiconductor memory element such as a Random Access Memory (RAM) or a flash memory, or a hard disk, an optical disk, or the like.

The input interface 130 is configured to receive operations that specify various types of instructions and various types of information from the operator. More specifically, the input interface 130 is connected to the processing circuitry 150 and is configured to convert the input operations received from the operator into electrical signals and to transmit the electrical signals to the processing circuitry 150. For example, the input interface 130 is realized by using a trackball, a switch button, a mouse, a keyboard, a touchpad on which an input operation can be performed by touching an operation surface thereof, a touch screen in which a display screen and a touchpad are integrally formed, a contactless input interface using an optical sensor, an audio input interface, and/or the like. In the present disclosure, the input interface 130 does not necessarily have to include physical operation component parts such as a mouse, a keyboard, and/or the like. For instance, possible examples of the input interface 130 include electrical signal processing circuitry configured to receive an electrical signal corresponding to an input operation from an external input machine provided separately from the apparatus and to transmit the electrical signal to controlling circuitry.

The display 140 is configured to display various types of information and various types of data. More specifically, the display 140 is connected to the processing circuitry 150 and is configured to display various types of information and various types of data received from the processing circuitry 150. For example, the display 140 is realized by using a liquid crystal monitor, a Cathode Ray Tube (CRT) monitor, a touch panel, or the like.

The processing circuitry 150 is configured to perform various types of processes by controlling constituent elements included in the image processing apparatus 100. For example, the processing circuitry 150 is configured to perform the various types of processes in accordance with input operations received from the operator via the input interface 130. Further, for example, the processing circuitry 150 is configured to store the data received by the NW interface 110 from the other apparatuses into the storage 120. Also, for example, the processing circuitry 150 is configured to transmit data read from the storage 120 to any of the other apparatuses, by transmitting the data to the NW interface 110. Further, for example, the processing circuitry 150 is configured to cause the display 140 to display any of the data read from the storage 120.

The image processing apparatus 100 according to the present embodiment configured as described above has a function to correct ringing artifacts in the MR image.

In relation to the above, various types of methods have hitherto been proposed as methods for correcting ringing artifacts. In both clinical and research fields, there is a demand for MR images in which ringing artifacts have been corrected and which have a higher resolution.

For example, the methods for correcting ringing artifacts include a ringing correcting method using sub-voxel shifts (for example, refer to Elias Kellner, Bibek Dhital, Valerij G. Kiselev, Marco Reisert, "Gibbs-ringing artifact removal based on local subvoxel-shifts", Magn Reson Med 76:1574-1581, 2016). According to this method, with respect to each of the pixels included in an MR image, and with respect to each dimension expressed in the MR image (for example, a readout dimension "X" and a phase-encoding dimension "Y"), a shift amount from the position of the pixel to a position where ringing artifacts will be reduced is determined such that the new position is within the same X or Y raster of the image as the original position, and such that the absolute value of the shift amount is no more than ½ pixel, so as to correct the ringing artifacts occurring in the MR image on the basis of the determined shift amounts.

Further, for example, as a method for improving the perceived resolutions of MR images, a method called zero-fill interpolation is known. According to this method, the superficial resolution of a reconstructed MR image is improved by lengthening one or more dimensions of the k-space data to be reconstructed, keeping the measured data at the center of k-space, and placing 0s in the unmeasured periphery. This method may be applied along any dimension of an MR image that was Fourier-encoded, and may be applied simultaneously along two or three such dimensions.

Accordingly, one idea is to use both the ringing correcting method that employs sub-voxel shifts and the zero-fill interpolation method. However, this ringing correcting method assumes that the spatial period of the ringing (its "wavelength") is very close to 2 pixels, a situation that occurs when an image is reconstructed from k-space data that is completely filled with measured data points. Accordingly, if the zero-fill interpolation were to be carried out before applying the ringing correction method, then effects of the ringing correction would be weakened, and ringing artifacts would tend to remain. In contrast, if the zero-fill interpolation were to be carried out after applying the ringing correction method, then new ringing artifacts may be caused thereby, with their severity depending on characteristics of the MR image being processed.

To improve on the situation described above, the image processing apparatus 100 according to the present embodiment is configured to be able to provide an output image in which ringing artifacts have been corrected or reduced, and which has a higher resolution, such as that provided by zero-fill interpolation, than the MR image selected as an input.

More specifically, the processing circuitry 150 includes an MR image acquiring function 151, an image shifting function 152, a ringing correcting function 153, and a combining function 154. In this situation, the MR image acquiring function 151 is an example of the acquiring unit. The image shifting function 152 is an example of the shifting unit. The ringing correcting function 153 is an example of the correcting unit. The combining function 154 is an example of the combining unit.

From the MRI apparatus 200 or the image storing apparatus 300, the MR image acquiring function 151 is configured to acquire an MR image on which a ringing artifact correction process is to be performed.

More specifically, from the MRI apparatus 200 or the image storing apparatus 300, the MR image acquiring function 151 is configured to acquire the MR image to be processed and to store the acquired MR image into the storage 120.

For example, the MR image acquiring function 151 is configured to receive, from the operator, an operation to designate the MR image to be processed, via the input interface 130. After that, from the MRI apparatus 200 or the image storing apparatus 300, the MR image acquiring function 151 is configured to acquire the MR image designated by the operator through the operation and to store the acquired MR image into the storage 120.

On the basis of the MR image acquired by the MR image acquiring function 151, the image shifting function 152 is configured to obtain a plurality of shift images resulting from shifting positions of pixels included in the MR image by a plurality of mutually-different shift amounts.

More specifically, the image shifting function 152 is configured to read the MR image acquired by the MR image acquiring function 151 from the storage 120 and to obtain the plurality of shift images on the basis of the read MR image. The image shifting is performed in k-space and requires that the read MR image be first transformed into k-space. Thus, the resulting shift images may be passed to the next process as k-space data without transforming them back to image space.

The ringing correcting function 153 is configured to generate a plurality of ringing-corrected images, by determining, with respect to each of the pixels included in each of the plurality of shift images generated by the image shifting function 152, a shift amount from the position of the pixel to a position where the ringing artifacts will be reduced and further performing a ringing correction to correct the ringing artifacts occurring in the shift images on the basis of the determined shift amounts.

In this situation, the ringing correcting function 153 is configured to perform the ringing correction on each of the plurality of shift images, by using a ringing correcting method that employs sub-voxel shifts.

Specifically, with respect to each of the plurality of shift images generated by the image shifting function 152, the ringing correcting function 153 is configured to generate an output that is a ringing-corrected image in which ringing artifacts have been corrected, by using the shift image as an input and performing ringing correction on the input. In the present example, a situation will be explained in which the MR image to be processed is a two-dimensional MR image defined with an X direction (a readout direction) and a Y direction (a phase-encoding direction) that are orthogonal to each other. Equivalently, the meaning of the two directions could be reversed so that the X direction represents a phase-encoding direction, and the Y direction represents a readout direction.

First, a first ringing correction method performed by the ringing correcting function 153 according to the first embodiment will be explained.

Figure 2A:
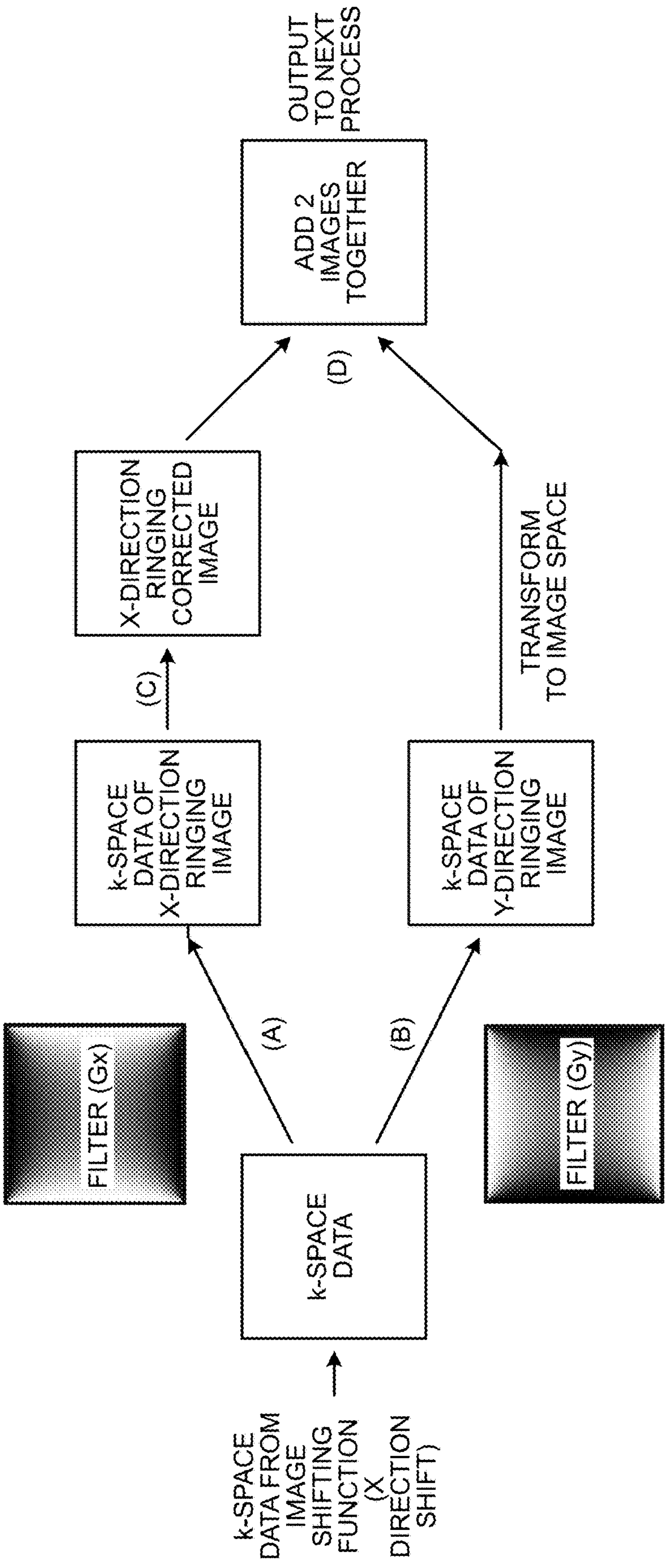
FIG. 2A is a chart illustrating an example of process flow of a ringing correction for an x direction in a first ringing correction method performed by a ringing correcting function according to the first embodiment.
Figure 2B:
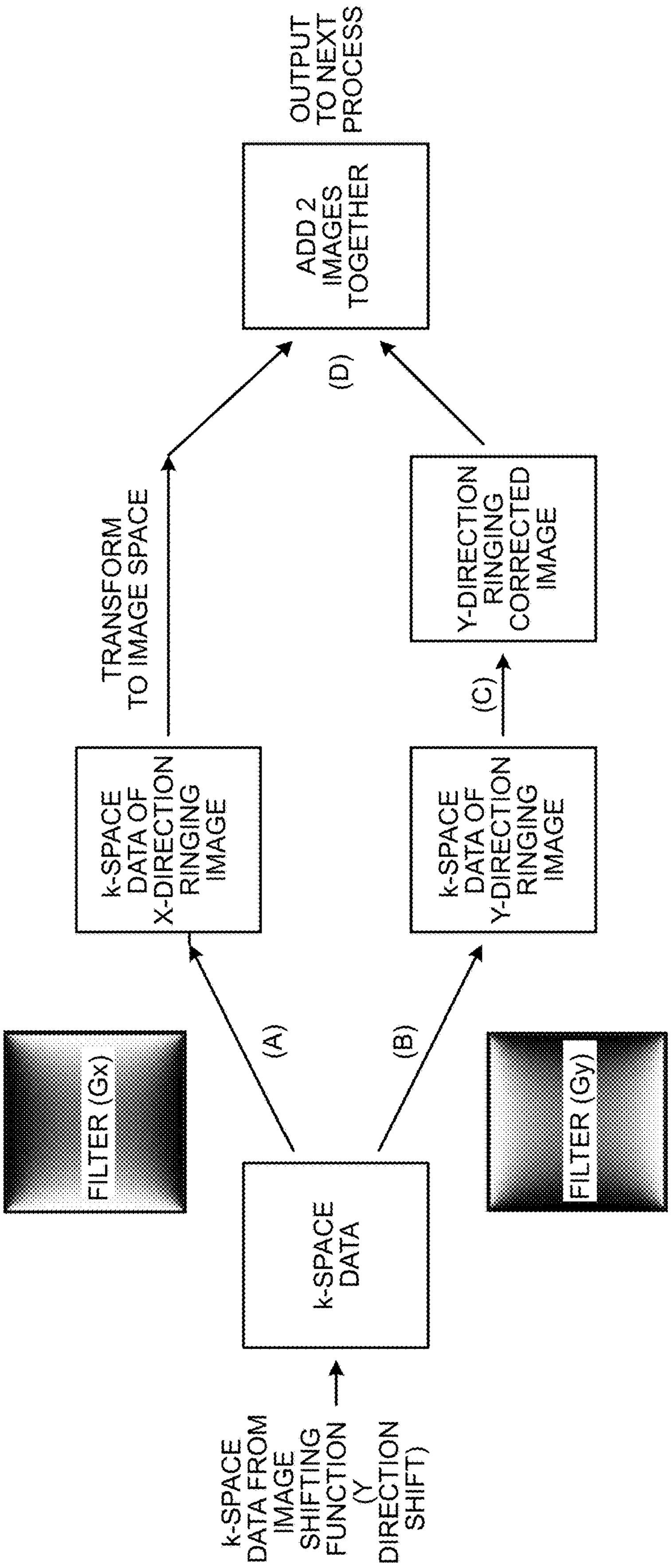
FIG. 2B is a chart illustrating an example of process flow of a ringing correction for a Y direction in the first ringing correction method performed by a ringing correcting function according to the first embodiment.

FIG. 2A is a chart illustrating an example of process flow of a ringing correction for the x direction in the first ringing correction method performed by the ringing correcting function 153 according to the first embodiment. Further, FIG. 2B is a chart illustrating an example of process flow of a ringing correction for the Y direction in the first ringing correction method performed by the ringing correcting function 153 according to the first embodiment.

In the first ringing correction method, as illustrated in FIG. 2A, regarding the X direction, the ringing correcting function 153 is configured, while using an X-direction shift image resulting from shifting the positions of the pixels in the X direction as an input, to generate the k-space data of a ringing image in which ringing artifacts remain along the X direction only, by applying a filter (Gx) that suppresses higher spatial frequency components in the Y direction, to the k-space data of the input (FIG. 2A, (A)). In the following sections, this ringing image will be referred to as an X-direction ringing image.

Further, similarly to the X direction, the ringing correcting function 153 is configured, regarding the Y direction also, to generate the k-space data of a ringing image in which ringing artifacts remain along the Y direction only, by applying a filter (Gy) that suppresses higher spatial frequency components in the X direction, to the k-space data of the input (FIG. 2A, (B)). In the following sections, this ringing image will be referred to as a Y-direction ringing image.

The two filters are configured such that the pixelwise sum of Gx and Gy results in a matrix of 1s, or a matrix of is multiplied by a scalar.

After that, the ringing correcting function 153 is configured to generate a ringing-corrected image in which ringing artifacts along the X direction have been corrected, by performing a ringing correction on the k-space data of the X-direction ringing image (FIG. 2A, (C)). In the following sections, this ringing-corrected image will be referred to as an X-direction ringing-corrected image.

More specifically, the ringing correcting function 153 is configured to generate images Is(x), the quantity of which is equal to 2M, by calculating with respect to each of the pixels included in the X-direction ringing image a signal value at the position reached by shifting the X-direction coordinate x within the image space, by the shift amounts s/2M, according to Expression (1) presented below.

$$I_s(x) = \frac{1}{N}\sum_{k=0}^{N-1} c_0(k)\cdot e^{\frac{-2\pi i}{N}k\left(x+\frac{s}{2M}\right)} \tag{1}$$

In Expression (1) presented above, sub-voxel shifts are introduced into a calculation formula expressing the mathematical function known as an inverse Fourier transform. In Expression (1), x denotes the X-direction coordinate within the image space; k denotes the X-direction spatial frequency coordinate in the k-space; N is the number of signals to be sampled; and $c_0(k)$ denotes a Fourier expansion coefficient.

Further, s denotes an integer from a set of integers for defining the shift amounts used in the ringing correction.

The set of integers may be expressed as −M, . . . , and M, or a subset of this set may be used instead. For example, if M is 4, and if the subset −M, . . . , and M−1 is used, then s has values of −4, −3, −2, −1, 0, 1, 2, and 3. The resulting shift amounts of the images would be −0.5, −0.375, −0.25, −0.125, 0, 0.125, 0.25, and 0.375 pixel.

After that, on the basis of the 2M images that were generated, the ringing correcting function 153 is configured, with respect to each of the pixels included in the ringing image, to determine a shift amount from the position of the pixel to a position where ringing artifacts will be reduced.

Figure 3A:
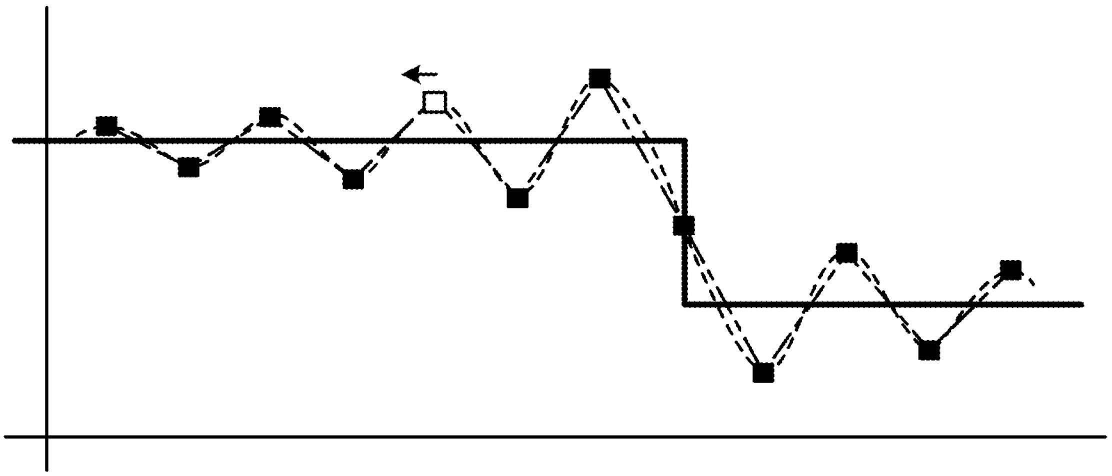
FIGS. 3A and 3B are charts illustrating an example of estimating the optimal shift amount along one axis, for one pixel, in the ringing correction performed by the ringing correcting function according to the first embodiment.
Figure 3B:
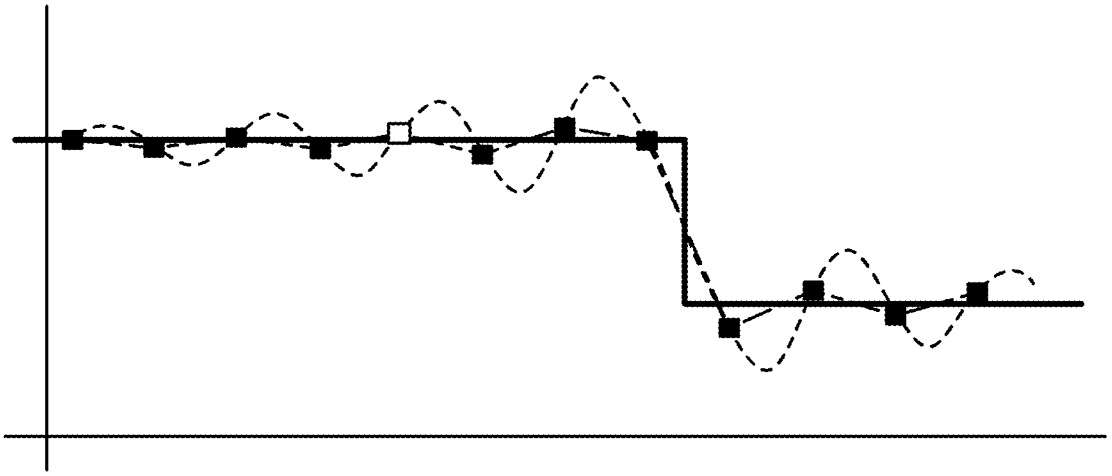

FIGS. 3A and 3B are charts illustrating an example of estimating the optimal shift amount along one axis, for one pixel, in the ringing correction performed by the ringing correcting function 153 according to the first embodiment. (With respect to this estimating method, for example, refer to Elias Kellner, Bibek Dhital, Valerij G. Kiselev, Marco Reisert, "Gibbs-ringing artifact removal based on local subvoxel-shifts", Magn Reson Med 76:1574-1581, 2016.)

More specifically, FIG. 3A illustrates changes in signal values in the vicinity of boundaries in an image before the positions of the pixels are shifted. FIG. 3B illustrates changes in signal values in the vicinity of boundaries in an image after the positions of the pixels are shifted in the X direction. Further, in FIGS. 3A and 3B, the vertical axis of the charts expresses the signal values, whereas the horizontal axis serves as the coordinate axis within one raster along the X direction within the image space. Furthermore, the solid lines in the charts express ideal changes in the signal values in the vicinity of boundaries in real space, whereas broken lines express changes in the signal values in the vicinity of boundaries in the image space. The sections exhibiting larger undulation changes correspond to ringing artifacts. Further, the plurality of square dots in the charts represent positions of the pixels included in the image. The dashed lines express signal values obtained when a linear interpolation is performed between the pixels.

For example, as illustrated in FIG. 3B, the ringing correcting function 153 is configured, in the image after the positions of the pixels have been shifted, to calculate the difference in signal values between each of the pixels (e.g., the white square dot in FIG. 3B) and a predetermined number of pixels in the surroundings of the pixel and to determine a shift amount that minimizes the sum of the calculated differences. In the following sections, the sum of the differences in the signal values with respect to the predetermined number of pixels in the surroundings of the pixel will be referred to as the total variation for that pixel.

After that, by performing a linear interpolation while using the signal values in the positions reached by shifting the positions of the pixels by the determined shift amounts, the ringing correcting function 153 is configured to calculate, with respect to each of the pixels, a signal value at the original unshifted position of the pixel and to set the pixel value to this calculated signal value. As a result, the ringing image in which ringing artifacts along the X direction have been corrected, i.e., the X-direction ringing-corrected image, has been generated.

Returning to the description of FIG. 2A, subsequently, the ringing correcting function 153 is configured to add the generated X-direction ringing-corrected image and the Y-direction ringing image which has been transformed to image space together, so as to generate a final X-direction ringing-corrected image (FIGS. 2A, (D)). Then, the generated final X-direction ringing-corrected image is output to the next process.

Further, as illustrated in FIG. 2B, regarding the Y direction, similarly to the ringing correction for the X direction, the ringing correcting function 153 is configured, while using a Y-direction shift image resulting from shifting the positions of the pixels in the Y direction as an input, after generating the k-space data of the X-direction ringing image and the k-space data of the Y-direction ringing image (FIGS. 2B, (A) and (B)), to generate a ringing-corrected image in which ringing artifacts along the Y direction have been corrected, by performing a ringing correction on the k-space data of the Y-direction ringing image (FIG. 2B, (C)). In the following sections, this ringing-corrected image will be referred to as a Y-direction ringing-corrected image.

subsequently, the ringing correcting function 153 is configured to add the generated Y-direction ringing-corrected image and the X-direction ringing image which has been transformed to image space together, so as to generate a final Y-direction ringing-corrected image (FIG. 2B, (D)). Then, the generated final Y-direction ringing-corrected image is output to the next process.

Next, a second ringing correction method performed by the ringing correcting function 153 according to the first embodiment will be explained.

Figure 2C:
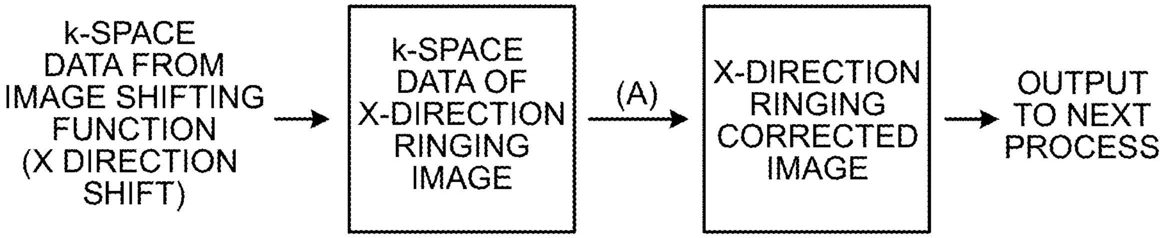
FIG. 2C is a chart illustrating an example of process flow of a ringing correction for an x direction in a second ringing correction method performed by a ringing correcting function according to the first embodiment.

FIG. 2C is a chart illustrating an example of process flow of a ringing correction for the x direction in the second ringing correction method performed by the ringing correcting function 153 according to the first embodiment. Further, FIG. 2D is a chart illustrating an example of process flow of a ringing correction for the Y direction in the second ringing correction method performed by the ringing correcting function 153 according to the first embodiment.

In the second ringing correction method, as illustrated in FIG. 2C, regarding the X direction, the ringing correcting function 153 is configured, while using an X-direction shift image resulting from shifting the positions of the pixels in the X direction as an input and using k-space data of the input as the k-space data of an X-direction ringing image, to generate an X-direction ringing-corrected image, by performing a ringing correction to the k-space data of the x-direction ringing image, similarly to the ringing correction for the X direction in the first ringing correction method (FIG. 2C, (A)).

Figure 2D:
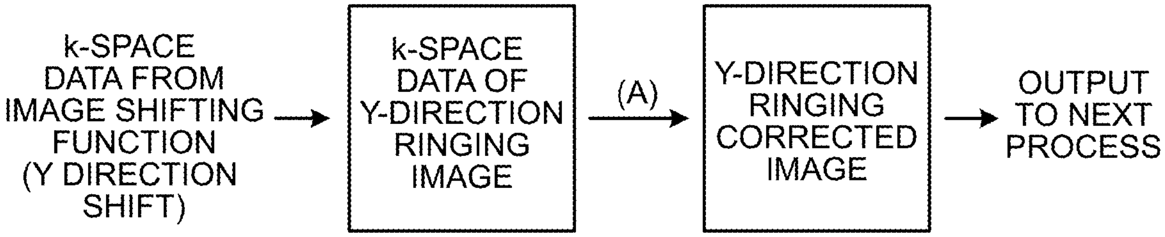
FIG. 2D is a chart illustrating an example of process flow of a ringing correction for a Y direction in the second ringing correction method performed by a ringing correcting function according to the first embodiment.

Further, as illustrated in FIG. 2D, regarding the Y direction, the ringing correcting function 153 is configured, while using an Y-direction shift image resulting from shifting the positions of the pixels in the Y direction as an input and using k-space data of the input as the k-space data of an Y-direction ringing image, to generate an Y-direction ringing-corrected image, by performing a ringing correction to the k-space data of the Y-direction ringing image, similarly to the ringing correction for the Y direction in the first ringing correction method (FIG. 2D, (A)).

In this manner, the ringing correcting function 153 is configured to generate a plurality of ringing-corrected images by performing the first or second ringing correction method described above on each of the plurality of shift images that were expressed as k-space data and received as such by the ringing correcting function 153.

Returning to the description of FIG. 1, the combining function 154 is configured to generate a combined image resulting from combining the plurality of ringing-corrected images, by combining, while interleaving, the pixels included in each of the plurality of ringing-corrected images generated by the ringing correcting function 153.

After that, the output image, in which ringing artifacts along both the X direction and the Y direction have been corrected, is generated as the last process of each embodiment. Possible methods for generating such an output image are presented within the Embodiment Examples below. One possible method is included in Embodiment Example 1, while one other possible method is included in Embodiment Examples 2, 3, and 4 as the final process within those embodiments.

In this situation, the output image is displayed by the display 140 according to an instruction from the operator, for example. Further, the output image may be transmitted to the MRI apparatus 200 or the image storing apparatus 300 so as to be displayed or stored therein, according to an instruction from the operator, for example.

With the configuration described above, it is possible to obtain an MR image in which the ringing artifacts have been corrected and which has resolving power similar to that obtained from zero-fill interpolation, by obtaining on the basis of the MR image to be processed the plurality of shift images having mutually-different shift amounts, performing ringing correction on the shift images, and subsequently, combining, while interleaving, the pixels in the plurality of ringing-corrected images resulting from the ringing correction. As a result, it is possible to provide an MR image in which ringing artifacts have been corrected and which has a higher resolution.

Next, specific examples related to processes performed by the image shifting function 152, the ringing correcting function 153, and the combining function 154 described above will be explained as embodiment examples.

Embodiment Example 1

First, Embodiment Example 1 will be explained. In Embodiment Example 1, an example will be explained in which an MR image having resolving power that is twice higher in the X direction and in the Y direction is generated on the basis of the MR image to be processed.

Figure 4:
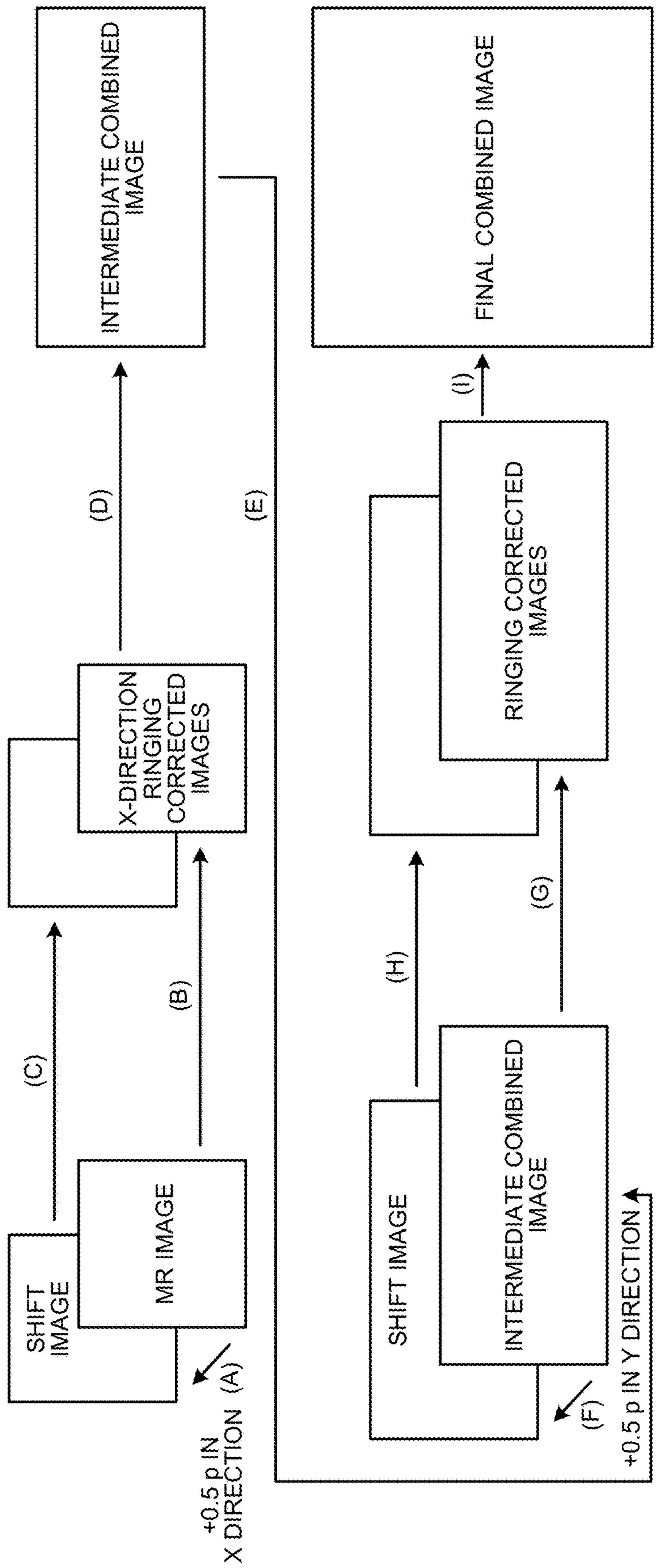
FIG. 4 is a chart illustrating an example of processes performed by an image shifting function, a ringing correcting function, and a combining function according to Embodiment Example 1.

FIG. 4 is a chart illustrating an example of processes performed by the image shifting function 152, the ringing correcting function 153, and the combining function 154 according to Embodiment Example 1.

For example, as illustrated in FIG. 4, on the basis of the MR image to be processed, the image shifting function 152 is configured to obtain a plurality of X-direction shift images resulting from shifting the position of the pixel sampling grid of the MR image in the X direction (FIG. 4, (A)).

In this situation, in the present embodiment example, the image shifting function 152 is configured to obtain the plurality of shift images, by using the MR image to be processed as a first shift image of which the shift amount is 0 and generating a shift image resulting from shifting the position of the pixel sampling grid of the MR image to be processed by a shift amount different from 0, as a second shift image.

More specifically, the image shifting function 152 is configured to obtain two X-direction shift images by using the MR image to be processed as the first shift image of which the shift amount is 0 and generating a shift image resulting from shifting the position of the pixel sampling grid of the MR image to be processed by a shift amount of +0.5 pixels in the X direction, as the second shift image, and both shift images may be expressed as k-space data and passed as such to the next process.

In this situation, the image shifting function 152 is configured to generate the second shift image by applying a linear phase in the k-space as indicated in Expression (1) presented above to each of the pixels included in the MR image to be processed so as to calculate a signal value in the position reached by shifting the X-direction coordinate within the image space by the shift amount of +0.5 pixels in the X direction.

Further, the ringing correcting function 153 is configured to generate a plurality of X-direction ringing-corrected images by performing the ringing correction for the X direction in the first ringing correction method illustrated in FIG. 2A on each of the plurality of X-direction shift images, which were generated and expressed as k-space data by the image shifting function 152 (FIGS. 4, (B) and (C)). Within the ringing correction function, the two filters Gx and Gy are configured such that each one has a two-dimensional size equal to that of the inputs to the ringing correcting function 153, and these inputs are each of the X-direction shift images expressed as k-space data. At this stage, both shift images have a size equal to that of the MR image to be processed. The two filters are configured such that the pixelwise sum of Gx and Gy results in a matrix of 1s, or a matrix of 1s multiplied by a scalar.

Also, the combining function 154 is configured to generate an intermediate combined image by combining, while interleaving, the pixels included in each of the plurality of X-direction ringing-corrected images generated by the ringing correcting function 153 (FIG. 4, (D)).

Further, on the basis of the intermediate combined image generated by the combining function 154, the image shifting function 152 is configured to obtain a plurality of Y-direction shift images resulting from shifting the position of the pixel sampling grid of the intermediate combined image in the Y direction (FIGS. 4, (E) and (F)).

In this situation, in the present embodiment example, the image shifting function 152 is configured to obtain the plurality of shift images, by using the intermediate combined image as a first shift image of which the shift amount is 0 and generating a shift image resulting from shifting the positions of pixels included in the intermediate combined image by a shift amount different from 0, as a second shift image.

More specifically, the image shifting function 152 is configured to obtain two Y-direction shift images, by using the intermediate combined image as the first shift image of which the shift amount is 0 and generating a shift image grid of the intermediate combined image by a shift amount of +0.5 pixels in the Y direction, as the second shift image, and both shift images may be expressed as k-space data and passed as such to the next process.

In this situation, the image shifting function 152 is configured to generate the second shift image by applying a linear phase in the k-space as indicated in Expression (1) presented above to each of the pixels included in the intermediate combined image, so as to calculate a signal value in the position reached by shifting the Y-direction coordinate within the image space by the shift amount of +0.5 pixels in the Y direction.

Further, the ringing correcting function 153 is configured to generate a plurality of ringing-corrected images by performing the ringing correction for the Y direction in the first ringing correction method illustrated in FIG. 2B on each of the plurality of Y-direction shift images, which were generated and expressed as k-space data by the image shifting function 152 (FIGS. 4, (G) and (H)). Within the ringing correcting function, the two filters Gx and Gy are again configured such that each one has a two-dimensional size equal to that of the inputs to the ringing correcting function 153, and this time, the inputs are the Y-direction shift images, both of which have a size equal to that of the intermediate combined image. The two filters are again configured such that the pixelwise sum of Gx and Gy results in a matrix of 1s, or a matrix of 1s multiplied by a scalar.

After that, the combining function 154 is configured to generate a final combined image, by combining, while interleaving, the pixels included in each of the plurality of ringing-corrected images generated by the ringing correcting function 153 (FIG. 4, (I)). This is the output image in which ringing artifacts along both the X direction and the Y direction have been corrected.

According to Embodiment Example 1, the two shift images having mutually-different shift amounts with respect to the X direction were obtained first; they were ringing corrected, and then they were combined, while interleaving, to obtain the intermediate combined image, which was then used to obtain two more shift images having mutually-different shift amounts with respect to the Y direction. Embodiment Example 1 could be expressed equally well by an embodiment that first obtains two shift images having mutually-different shift amounts with respect to the Y direction. In this case, all X-direction steps in FIG. 4 would be replaced by the same operation in the Y direction, and all Y-direction steps in FIG. 4 would be replaced by the same operation in the X direction.

According to Embodiment Example 1 described above, it is possible to obtain an MR image in which ringing artifacts have been corrected and which has resolving power that is twice higher in the X direction and in the Y direction, by obtaining, on the basis of the MR image to be processed, the two shift images having mutually-different shift amounts with respect to the X direction and the Y direction and further combining, while interleaving, the pixels in the ringing-corrected images obtained by performing ringing correction on the shift images.

Embodiment Example 2

Next, Embodiment Example 2 will be explained. In Embodiment Example 2, another example will be explained in which an MR image having resolving power that is twice higher in the X direction and in the Y direction is generated, on the basis of the MR image to be processed. In this embodiment, the k-space filters Gx and Gy are not included in the ringing correcting function 153, but are instead included in the image shifting function 152.

Figure 5A:
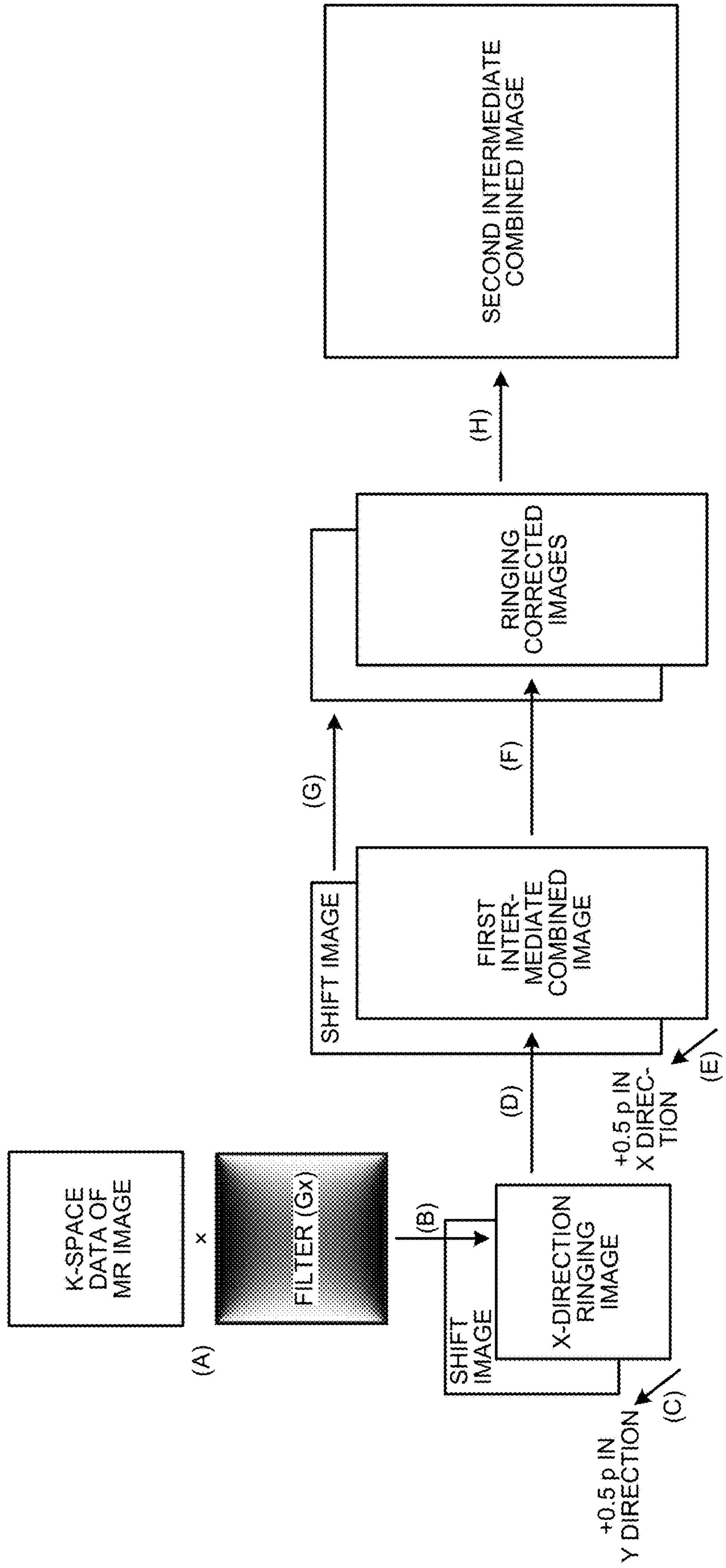
FIG. 5A is a chart illustrating an example of processes performed by an image shifting function, a ringing correcting function, and a combining function according to Embodiment Example 2.
Figure 5B:
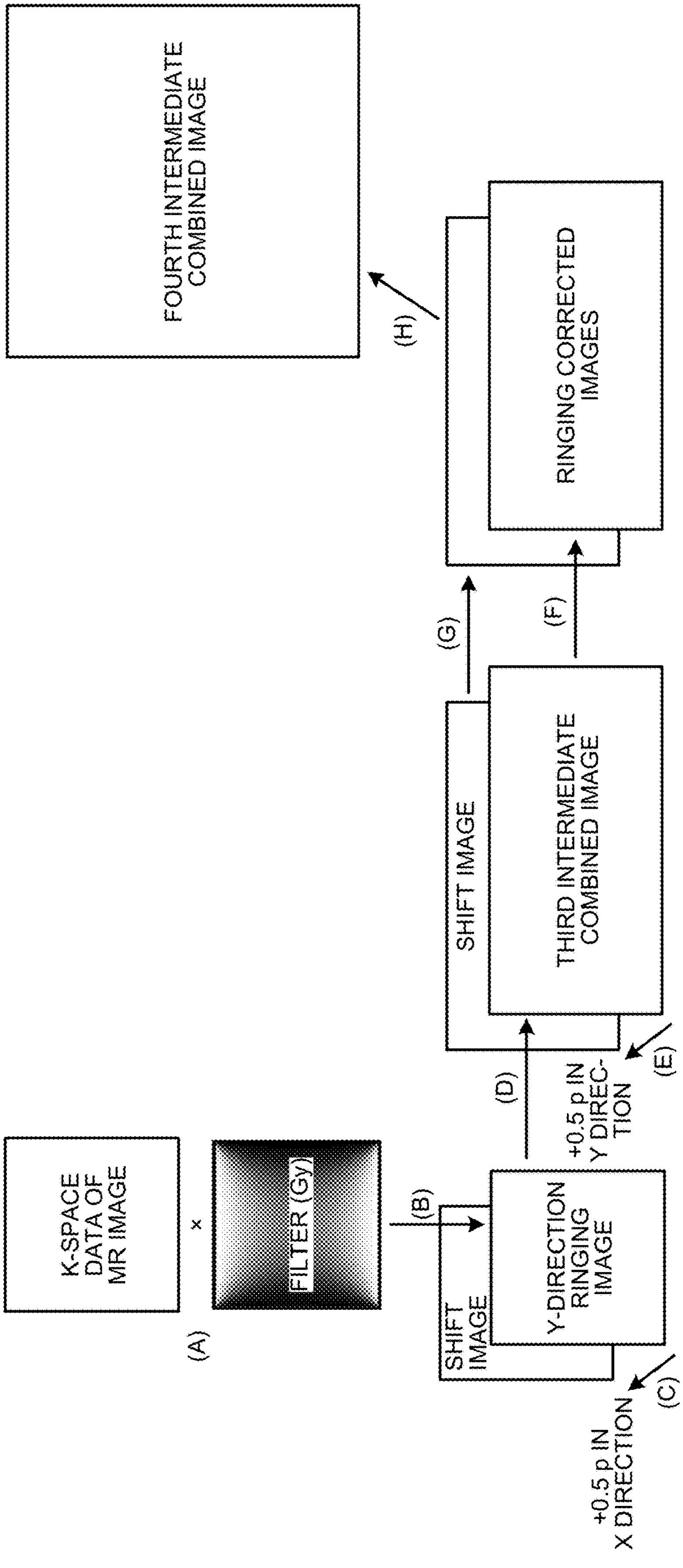
FIG. 5B is a chart illustrating another example of processes performed by an image shifting function, a ringing correcting function, and a combining function according to Embodiment Example 2.
Figure 5C:
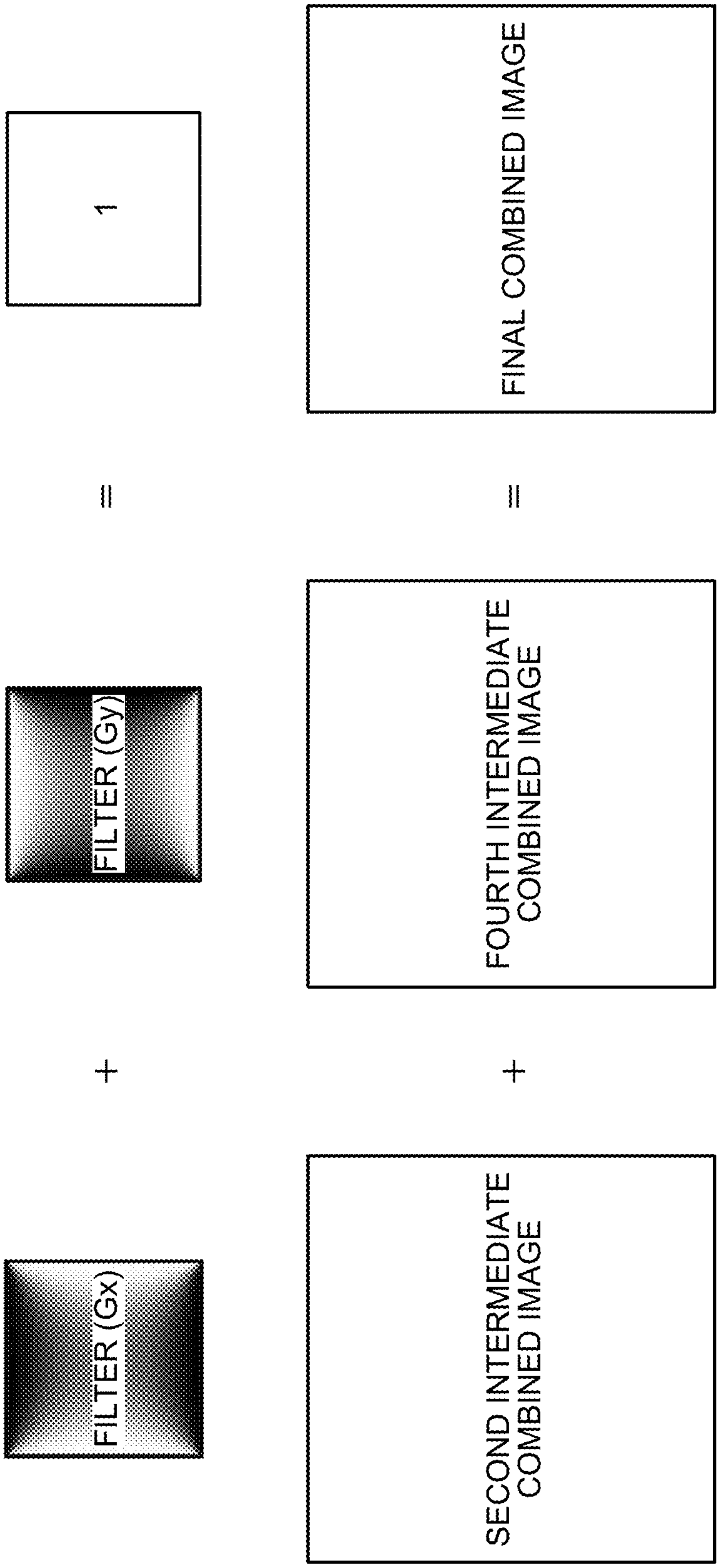
FIG. 5C is a chart illustrating an example of a process that receives the respective outputs of the combining function (the last stage in FIGS. 5A and 5B, respectively) and produces a final output according to Embodiment Example 2.

FIGS. 5A to 5C are charts illustrating examples of processes performed by the image shifting function 152, the ringing correcting function 153, and the combining function 154 according to Embodiment Example 2.

For example, as illustrated in FIG. 5A, in the present embodiment example, on the basis of the MR image to be processed, the image shifting function 152 is configured to obtain a plurality of Y-direction shift images resulting from shifting the position of the pixel sampling grid of the MR image in the Y direction.

More specifically, by applying the filter (Gx) that suppresses the higher spatial frequency components in the Y direction, to the k-space data of the MR image to be processed (FIG. 5A, (A)), the image shifting function 152 is configured to generate the k-space data of an X-direction ringing image in which ringing artifacts remain along the X direction only, and in which ringing artifacts along the Y direction are suppressed (FIG. 5A, (B)). After that, on the basis of the generated k-space data of the X-direction ringing image, the image shifting function 152 is configured to obtain a plurality of Y-direction shift images in which ringing artifacts along the X direction still remain, and in which ringing artifacts along the Y direction are still suppressed (FIG. 5A, (C)).

In this situation, in the present embodiment example, the image shifting function 152 is configured to obtain the plurality of shift images, by using the X-direction ringing image as a first shift image of which the shift amount is 0 and generating a shift image resulting from shifting the position of the pixel sampling grid of the X-direction ringing image by a shift amount different from 0, as a second shift image.

More specifically, the image shifting function 152 is configured to obtain two Y-direction shift images, by using the X-direction ringing image as the first shift image of which the shift amount is 0 and generating a shift image grid of the X-direction ringing image by a shift amount of +0.5 pixels in the Y direction, as the second shift image.

In this situation, the image shifting function 152 is configured to generate the second shift image by applying a linear phase in the k-space as indicated in Expression (1) presented above to each of the pixels included in the X-direction ringing image, so as to calculate a signal value in the position reached by shifting the Y-direction coordinate by the shift amount of +0.5 pixels in the Y direction.

Further, the combining function 154 is configured to generate a first intermediate combined image by combining, while interleaving, the pixels included in each of the plurality of Y-direction shift images obtained by the image shifting function 152 (FIGS. 5A, (D)), and as such, ringing artifacts along the X direction still remain while ringing artifacts along the Y direction are still suppressed in this first intermediate combined image.

This first intermediate combined image could also be obtained by an alternative method that does not employ image shifting. This alternative method begins with the X-direction ringing image and applies to it zero-fill interpolation along the Y direction only. In the current embodiment example, this step produces an interpolated image whose Y dimension is twice as high as that of both the X-direction ringing image and the MR image to be processed.

Further, on the basis of the first intermediate combined image generated by the combining function 154, the image shifting function 152 is configured to obtain a plurality of X-direction shift images resulting from shifting the position of the pixel sampling grid of the first intermediate combined image in the X direction (FIG. 5A, (E)).

In this situation, in the present embodiment example, the image shifting function 152 is configured to obtain the plurality of shift images by using the first intermediate combined image as a first shift image of which the shift amount is 0 and generating a shift image resulting from shifting the position of the pixel sampling grid of the first intermediate combined image by a shift amount different from 0 as a second shift image. Now in both of these shift images, ringing artifacts along the X direction still remain while ringing artifacts along the Y direction are still suppressed.

More specifically, the image shifting function 152 is configured to obtain two X-direction shift images by using the first intermediate combined image as the first shift image of which the shift amount is 0 and generating a shift image resulting from shifting the position of the pixel sampling grid of the first intermediate combined image by a shift amount of +0.5 pixels in the X direction as the second shift image.

In this situation, the image shifting function 152 is configured to generate the second shift image by applying a linear phase in the k-space as indicated in Expression (1) presented above to each of the pixels included in the first intermediate combined image, so as to calculate a signal value in the position reached by shifting the X-direction coordinate by the shift amount of +0.5 pixels in the X direction.

The above plurality of shift images could also be obtained by an alternative method that does not employ image shifting explicitly. This alternative method begins with the first intermediate combined image and applies to it zero-fill interpolation along the X direction only. In the current embodiment example, this step produces an interpolated image whose X dimension is twice as long as that of the first intermediate combined image. This interpolated image is then raster-wise de-interleaved along the X direction, resulting in a plurality of shift images which have mutually different shift amounts along the X direction.

Further, the ringing correcting function 153 is configured to generate a plurality of ringing-corrected images, by performing the ringing correction for the X direction in the second ringing correction method illustrated in FIG. 2C on each of the plurality of X-direction shift images obtained by the image shifting function 152 (FIGS. 5A, (F) and (G)).

Further, the combining function 154 is configured to generate a second intermediate combined image, by combining, while interleaving, the pixels included in each of the plurality of ringing-corrected images generated by the ringing correcting function 153 (FIG. 5A, (H)).

In addition, for example, as illustrated in FIG. 5B, the image shifting function 152 is configured, on the basis of the MR image to be processed, to obtain a plurality of X-direction shift images resulting from shifting the position of the pixel sampling grid of the MR image in the X direction.

More specifically, by applying a filter (Gy) that suppresses the higher spatial frequency components in the X direction, to the k-space data of the MR image to be processed (FIG. 5B, (A)), the image shifting function 152 is configured to generate the k-space data of a Y-direction ringing image in which ringing artifacts remain along the Y direction only, and in which ringing artifacts along the X direction are suppressed (FIG. 5B, (B)). Further, on the basis of the generated k-space data of the Y-direction ringing image, the image shifting function 152 is configured to obtain a plurality of X-direction shift images resulting from shifting the position of the pixel sampling grid of the MR image to be processed in the X direction, in which ringing artifacts along the X direction still remain, and in which ringing artifacts along the Y direction are still suppressed (FIG. 5B, (C)).

In this situation, in the present embodiment example, the image shifting function 152 is configured to obtain the plurality of shift images, by using the Y-direction ringing image as a first shift image of which the shift amount is 0 and generating a shift image resulting from shifting the position of the pixel sampling grid of the Y-direction ringing image by a shift amount different from 0 as a second shift image.

More specifically, the image shifting function 152 is configured to obtain two X-direction shift images, by using the Y-direction ringing image as the first shift image of which the shift amount is 0 and generating a shift image resulting from shifting the position of the pixel sampling grid of the Y-direction ringing image by a shift amount of +0.5 pixels in the X direction as the second shift image.

In this situation, the image shifting function 152 is configured to generate the second shift image by applying a linear phase in the k-space as indicated in Expression (1) presented above to each of the pixels included in the Y-direction ringing image, so as to calculate a signal value in the position reached by shifting the X-direction coordinate by the shift amount of +0.5 pixels in the X direction.

Further, the combining function 154 is configured to generate a third intermediate combined image, by combining, while interleaving, the pixels included in each of the plurality of X-direction shift images obtained by the image shifting function 152 (FIGS. 5B, (D)), and as such, ringing artifacts along the Y direction still remain while ringing artifacts along the X direction are still suppressed in this first intermediate combined image.

Further, the image shifting function 152 is configured to obtain a plurality of Y-direction shift images resulting from shifting the position of the pixel sampling grid of the third intermediate combined image in the Y direction, on the basis of the third intermediate combined image generated by the combining function 154 (FIG. 5B, (E)).

In this situation, in the present embodiment example, the image shifting function 152 is configured to obtain the plurality of shift images, by using the third intermediate combined image as a first shift image of which the shift amount is 0 and generating a shift image resulting from shifting the position of the pixel sampling grid of the third intermediate combined image by a shift amount different from 0 as a second shift image. Now in both of these shift images, ringing artifacts along the Y direction still remain while ringing artifacts along the X direction are still suppressed.

More specifically, the image shifting function 152 is configured to obtain two Y-direction shift images by using the third intermediate combined image as the first shift image of which the shift amount is 0 and generating a shift image resulting from shifting the position of the pixel sampling grid of the third intermediate combined image by a shift amount of +0.5 pixels in the Y direction as the second shift image.

In this situation, the image shifting function 152 is configured to generate the second shift image, by applying a linear phase as indicated in Expression (1) presented above to each of the pixels included in the third intermediate combined image, so as to calculate a signal value in the position reached by shifting the Y-direction coordinate in the image space by the shift amount of +0.5 pixels in the Y direction.

Further, the ringing correcting function 153 is configured to generate a plurality of ringing-corrected images, by performing the ringing correction for the Y direction in the second ringing correction method illustrated in FIG. 2D on each of the plurality of Y-direction shift images obtained by the image shifting function 152 (FIGS. 5B, (F) and (G)).

Further, the combining function 154 is configured to generate a fourth intermediate combined image, by combining, while interleaving, the pixels included in each of the plurality of ringing-corrected images generated by the ringing correcting function 153 (FIG. 5B, (H)).

After that, for example, as illustrated in FIG. 5C, the combining function 154 is configured to generate a final combined image by adding together the second intermediate combined image and the fourth intermediate combined image.

In this situation, as described above, the second intermediate combined image is obtained after applying the filter (Gx) that suppresses the higher spatial frequency components in the Y direction, to the k-space data of the MR image to be processed. The fourth intermediate combined image is obtained after applying the filter (Gy) that suppresses the higher spatial frequency components in the X direction to the k-space data of the MR image to be processed. Accordingly, as illustrated in FIG. 5C, since the two filters Gx and Gx are configured such that their pixelwise sum equals a matrix of 1s, or a matrix of 1s multiplied by a scalar, adding together the second and fourth intermediate combined images yields a final combined image in which the higher spatial frequency components in the X-direction and the Y-direction previously suppressed by the two k-space filters, Gx and Gy, are restored.

In Embodiment Example 2 described above, similarly to Embodiment Example 1, it is possible to obtain an MR image in which ringing artifacts have been corrected and which has resolving power that is twice higher in the X direction and in the Y direction, by obtaining, on the basis of the MR image to be processed, the two shift images having mutually-different shift amounts with respect to the X direction and the Y direction and further combining, while interleaving, the pixels in the ringing-corrected images obtained by performing ringing correction on the shift images.

Further, in Embodiment Example 2, it is possible to accomplish the above processes within two parallel processing channels (illustrated in FIGS. 5A and 5B, respectively) that (a) do not depend on one another, and (b) are identical to each other except for the roles played by the X direction and the Y direction. Therefore, (a) the two channels can be processed in parallel and can be initiated simultaneously, for example on separate hardware processors, without any communication between the channels. In addition, (b) the MR image, in which ringing artifacts have been corrected and which has twice higher resolving power, will be obtained identically regardless of the orientation of the MR image to be processed. In other words, if the MR image to be processed is processed twice, once with its original orientation and once after rotating it by 90 degrees, the two MR images obtained will be identical for clinical or research purposes except for the image orientation. Likewise, if the MR image to be processed is processed twice, once with its original orientation and once after matrix transposition, the two MR images obtained will be identical for clinical or research purposes. These two advantageous features, (a) and (b), are characteristics of Embodiment Example 2 (and of Embodiment Examples 3 and 4 too), but are not characteristics of Embodiment Example 1.

In Embodiment Examples 1 and 2 described above, each examples was explained such that the MR image to be processed, the intermediate combined image, or the ringing image is used as the first shift image (zero shift), whereas the shift image resulting from shifting the position of the pixel sampling grid of each of the images is generated as the second shift image. The example was thus explained using shift amounts of 0 and +0.5 pixels. Alternatively, shift amounts of 0 and −0.5 pixels may be used. However, possible embodiments are not limited to these examples.

For example, the image shifting function 152 may obtain a plurality of shift images, by generating a shift image grid of any one of the abovementioned images by a first shift amount different from 0 as a first shift image and generating another shift image resulting from shifting the position of the pixel sampling grid of the image by a second shift amount in the opposite direction from the direction used for the first shift image, as a second shift image.

For example, the image shifting function 152 may obtain the plurality of shift images, by generating a shift image resulting from shifting the position of the pixel sampling grid of any one of the abovementioned images by a shift amount of −¼ pixels as the first shift image and generating another shift image resulting from shifting the position of the pixel sampling grid of the image by a shift amount of +¼ pixels, as the second shift image.

Further, in Embodiment Examples 1 and 2 described above, the shift amounts used at the time of generating the shift images are not limited to those presented in the above explanations. It is acceptable to use other shift amounts, though fidelity with the input image is improved by choosing a pair of shift amounts that are separated from each other by ½ pixel or approximately ½ pixel, for example, −⅜ and +⅛, or −¼ and +¼, or −⅛ and +⅜ pixel. Typically, as in these examples, both members of the pair are larger than or equal to −½ pixel, and smaller than or equal to +½ pixel, which ensures that the subject appears in the same position in the output image as in the input image, but this is not a requirement. The farther outside of this range (−½ to +½ pixel) the chosen shift amounts are, the more the position of the subject will appear shifted relative to the position in the input image.

Embodiment Example 3

Next, Embodiment Example 3 will be explained. In Embodiment Example 3, an example will be explained in which an MR image having resolving power that is three times higher in the X direction and in the Y direction is generated on the basis of the MR image to be processed.

Figure 6:
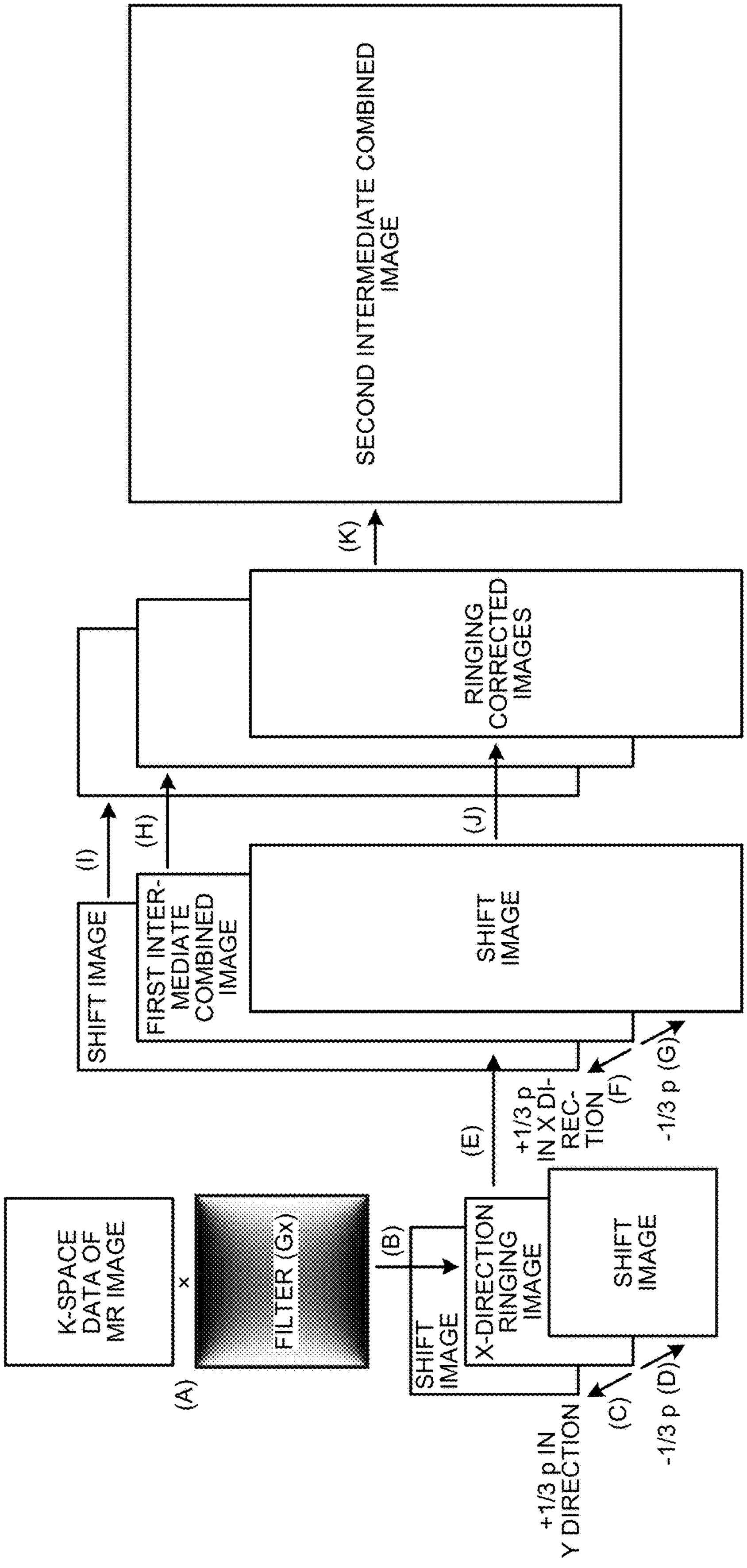
FIG. 6 is a chart illustrating an example of processes performed by an image shifting function, a ringing correcting function, and a combining function according to Embodiment Example 3.

FIG. 6 is a chart illustrating an example of processes performed by the image shifting function 152, the ringing correcting function 153, and the combining function 154 according to Embodiment Example 3.

For example, as illustrated in FIG. 6, on the basis of the MR image to be processed, the image shifting function 152 is configured to obtain a plurality of Y-direction shift images resulting from shifting the position of the pixel sampling grid of the MR image in the Y direction.

More specifically, by applying the filter (Gx) that suppresses the higher spatial frequency components in the Y direction, to the k-space data of the MR image to be processed (FIG. 6, (A)), the image shifting function 152 is configured to generate the k-space data of an X-direction ringing image in which ringing artifacts remain along the X direction only, and in which ringing artifacts along the Y direction are suppressed (FIG. 6, (B)). After that, on the basis of the generated k-space data of the X-direction ringing image, the image shifting function 152 is configured to obtain a plurality of Y-direction shift images in which ringing artifacts along the X direction still remain, and in which ringing artifacts along the Y direction are still suppressed (FIGS. 6, (C) and (D)).

In this situation, in the present embodiment example, the image shifting function 152 is configured to obtain the plurality of shift images, by using the X-direction ringing image as a first shift image of which the shift amount is 0, generating a shift image resulting from shifting the position of the pixel sampling grid of the X-direction ringing image by a shift amount different from 0 as a second shift image, and generating another shift image resulting from shifting the position of the pixel sampling grid of the X-direction ringing image by a second shift amount equal to the first shift amount in the opposite direction from the direction used for the second shift image, as a third shift image.

More specifically, the image shifting function 152 is configured to obtain three Y-direction shift images, by using the X-direction ringing image as the first shift image of which the shift amount is 0, generating a shift image resulting from shifting the position of the pixel sampling grid of the X-direction ringing image by a shift amount of +⅓ pixel in the Y direction as the second shift image, and generating another shift image resulting from shifting the position of the pixel sampling grid of the X-direction ringing image by a shift amount of −⅓ pixel in the Y direction as the third shift image.

In this situation, the image shifting function 152 is configured to generate the second shift image by applying a linear phase in the k-space as indicated in Expression (1) presented above to each of the pixels included in the X-direction ringing image, so as to calculate a signal value in the position reached by shifting the Y-direction coordinate in the image space by the shift amount of +⅓ pixel in the Y direction. Also, the image shifting function 152 is configured to generate the third shift image by applying a linear phase in the k-space as indicated in Expression (1) presented above to each of the pixels included in the X-direction ringing image, so as to calculate a signal value in the position reached by shifting the Y-direction coordinate in the image space by the shift amount of −⅓ pixel in the Y direction.

Further, the combining function 154 is configured to generate a first intermediate combined image, by combining, while interleaving, the pixels included in each of the plurality of Y-direction shift images obtained by the image shifting function 152 (FIG. 6, (E)).

This first intermediate combined image could also be obtained by an alternative method that does not employ image shifting. This alternative method begins with X-direction ringing image and applies to it zero-fill interpolation along the Y direction only.

Furthermore, on the basis of the first intermediate combined image generated by the combining function 154, the image shifting function 152 is configured to obtain a plurality of X-direction shift images resulting from shifting the position of the pixel sampling grid of the first intermediate combined image in the X direction (FIGS. 6, (F) and (G)).

In this situation, in the present embodiment example, the image shifting function 152 is configured to obtain three X-direction shift images, by using the first intermediate combined image as a first shift image of which the shift amount is 0, generating a shift image resulting from shifting the position of the pixel sampling grid of the first intermediate combined image by a shift amount of +⅓ pixel in the X direction as a second shift image, and generating another shift image resulting from shifting the position of the pixel sampling grid of the first intermediate combined image by a shift amount of −⅓ pixel in the X direction as a third shift image.

In this situation, the image shifting function 152 is configured to generate the second shift image by applying a linear phase in the k-space as indicated in Expression (1) presented above to each of the pixels included in the first intermediate combined image, so as to calculate a signal value in the position reached by shifting the X-direction coordinate in the image space by the shift amount of +⅓ pixel in the X direction. Also, the image shifting function 152 is configured to generate the third shift image by applying a linear phase in the k-space as indicated in Expression (1) presented above to each of the pixels included in the first intermediate combined image, so as to calculate a signal value in the position reached by shifting the X-direction coordinate in the image space by the shift amount of −⅓ pixel in the X direction.

Further, the ringing correcting function 153 is configured to generate a plurality of ringing-corrected images, by performing the ringing correction for the X direction in the second ringing correction method illustrated in FIG. 2C on each of the plurality of X-direction shift images obtained by the image shifting function 152 (FIG. 6, (H) to (J)).

Furthermore, the combining function 154 is configured to generate a second intermediate combined image, by combining, while interleaving, the pixels included in each of the plurality of ringing-corrected images generated by the ringing correcting function 153 (FIG. 6, (K)).

In addition, in the present embodiment example, the image shifting function 152, the ringing correcting function 153, and the combining function 154 are configured to generate a fourth intermediate image to which the filter (Gx) that suppresses the higher spatial frequency components in the Y direction is applied, by replacing, in the example illustrated in FIG. 5B, the process of obtaining the two shift images with the process of obtaining three shift images similarly to the X direction.

After that, similarly to the example illustrated in FIG. 5C, the combining function 154 is configured to generate a final combined image by adding together the second intermediate combined image and the fourth intermediate combined image.

According to Embodiment Example 3 described above, it is possible to obtain the MR image in which the ringing artifacts have been corrected and which has resolving power that is three times higher in the X direction and in the Y direction, by obtaining, on the basis of the MR image to be processed, the three shift images having the mutually-different shift amounts with respect to the X direction and the Y direction and further combining, while interleaving, the pixels in the ringing-corrected images obtained by performing the ringing correction on the shift images. Further, in Embodiment Example 3, similarly to Embodiment Example 2, it is possible to obtain the MR image in which the ringing artifacts have been corrected with a higher level of precision, by performing the ringing correction after applying the filters to the k-space data with respect to the X direction and the Y direction so as to emphasize the ringing artifacts along the two directions.

In Embodiment Example 3 described above, the shift amounts used at the time of generating the shift images are not limited to those presented in the above explanations. It is acceptable to use other shift amounts that are different from 0, while being larger than −1 pixel and smaller than +1 pixel.

Further, in Embodiment Examples 1, 2, and 3 above, on the basis of the MR image to be processed, the MR image is generated so as to have the resolving power that is twice or three times higher in the X direction and the Y direction. However, possible embodiment examples are not limited to these examples. For instance, an alternative embodiment example could have a resolving power that is twice higher in the X direction and three times higher in the Y direction, and yet another embodiment example could have a resolving power that is three times higher in the X direction and twice higher in the Y direction. It is also possible to generate an MR image having resolving power that is four or more times higher, by obtaining four or more shift images having mutually-different shift amounts with respect to the X direction and the Y direction and further combining, while interleaving, the pixels in the ringing-corrected images obtained by performing the ringing correction on the shift images.

Embodiment Example 4

Next, Embodiment Example 4 will be explained. In Embodiment Example 4, an example with a more specific process will be explained in which, in the embodiment examples described above, the combining function 154 combines, while interleaving, the pixels included in each of the plurality of ringing-corrected images.

FIGS. 7 to 10 are charts illustrating examples of processes performed by the image shifting function 152, the ringing correcting function 153, and the combining function 154 according to Embodiment Example 4.

The present example uses an example in Embodiment Example 3 where the combining function 154 performs the process (FIG. 6, (K)) to generate the second intermediate combined image from the plurality of ringing-corrected images.

Figure 7:
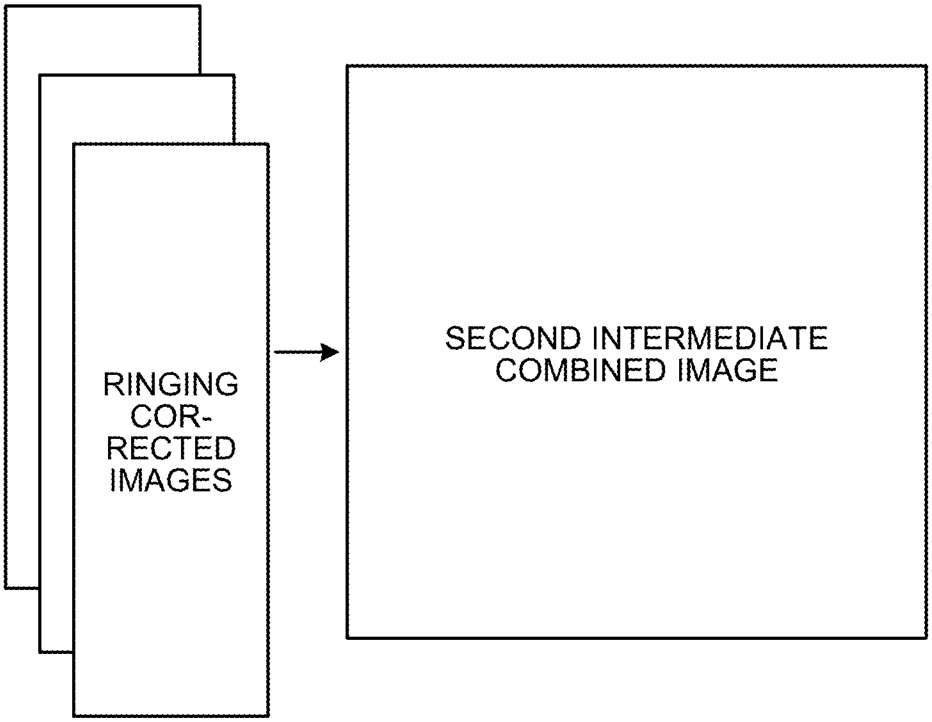
FIG. 7 is a chart illustrating an example of processes performed by an image shifting function, a ringing correcting function, and a combining function according to Embodiment Examples 3 and 4.

For example, as illustrated in FIG. 7, in Embodiment Example 4, the combining function 154 generates a second intermediate combined image by combining, while interleaving, the pixels included in each of the plurality of ringing-corrected images generated by the ringing correcting function 153.

In this situation, as explained above, the ringing correction performed by the ringing correcting function 153 is to determine, with respect to each of the pixels included in the input to the ringing correction function 153, a shift amount from the position of the pixel to a position where the ringing artifacts will be reduced. For this reason, in the situation where the input to the ringing correction function 153 has ringing artifacts, with respect to each of the pixels, the position of the signal value used as the pixel value in the ringing-corrected image, for the purpose of correcting ringing artifacts, is different from the position of the pixel in the input to the ringing correction.

Further, like in Embodiment Example 4, for instance, when three shift images having mutually-different shift amounts are obtained so as to perform the ringing correction on the shift images, the shift amount with respect to each of the pixels also varies among the three ringing-corrected images generated from that process.

Figure 8:
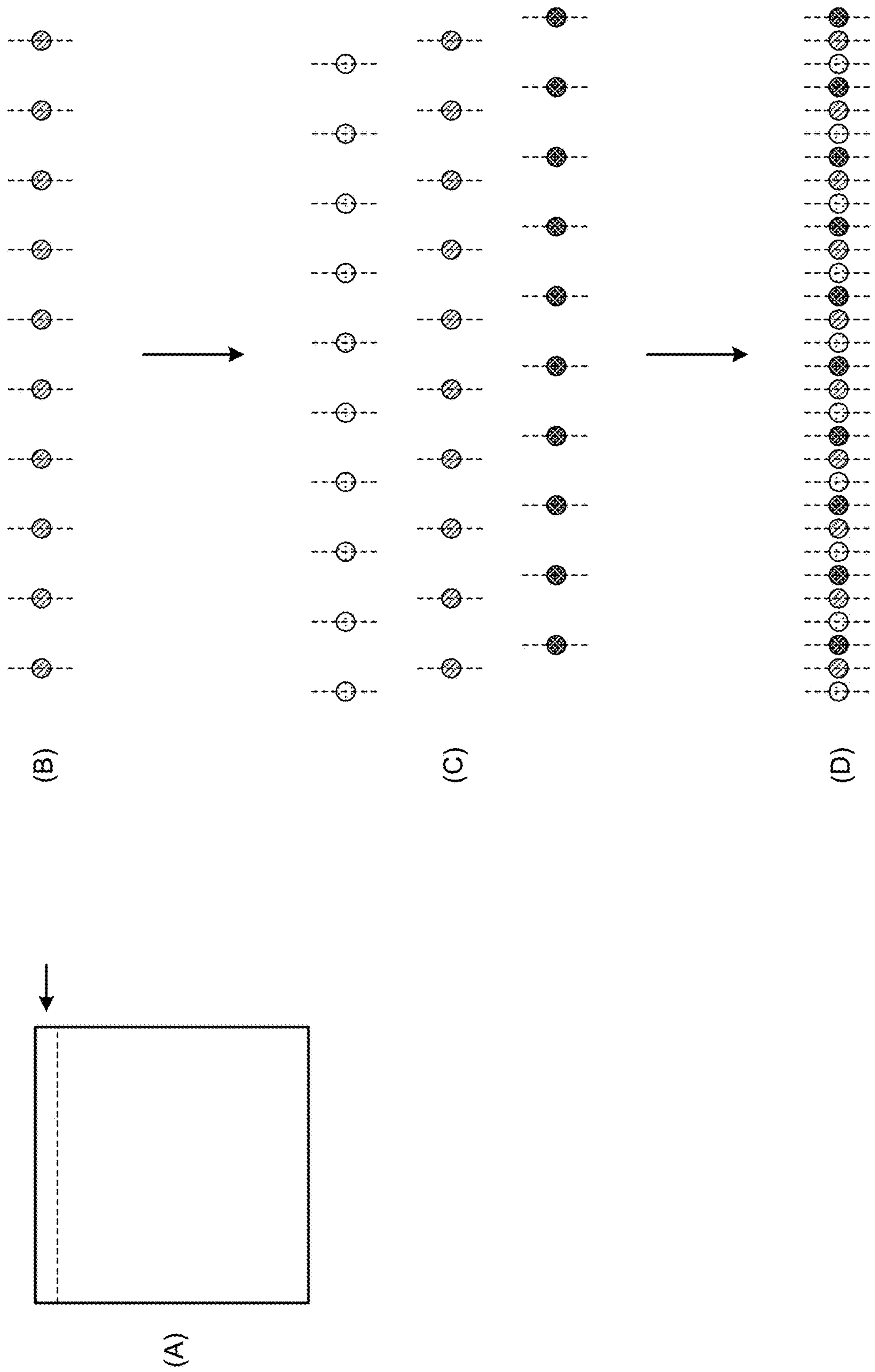
FIG. 8 is a chart illustrating an example of a process performed by the combining function according to Embodiment Examples 3 and 4; This chart illustrates the process as it would be performed for a row of pixels in the input image that does not contain any ringing.
Figure 9:
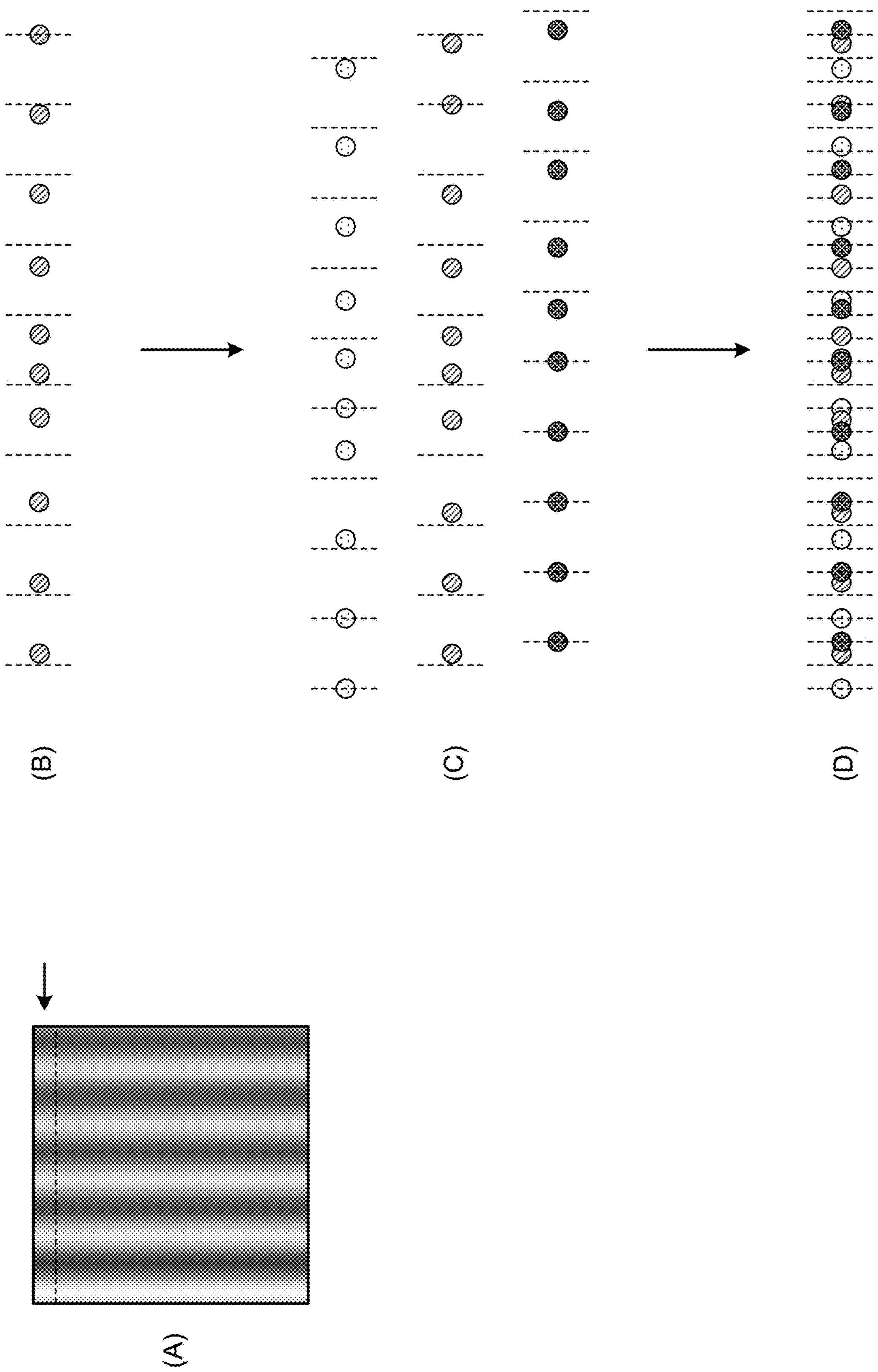
FIG. 9 is a chart illustrating another example of the same process as that illustrated in FIG. 8, performed by the combining function according to Embodiment Examples 3 and 4; This chart illustrates the process as it would be performed for a row of pixels in the input image that contains ringing.

For example, as illustrated in (A) of FIGS. 8 and (A) of FIG. 9, let us discuss a row of pixels along the X direction in the MR image to be processed. In this situation, in (B) pf FIGS. 8 and (B) of FIG. 9, the plurality of broken lines indicate the positions of the pixels included in the row of pixels illustrated in (A) of the respective drawings, whereas the plurality of dots represent examples of the positions of the signal values used as the pixel values in the ringing-corrected images for the purpose of correcting the ringing artifacts with respect to the pixels included in the row. Further, the plurality of broken lines in (C) and (D) of FIGS. 8 and (C) and (D) of FIG. 9 indicate the positions of the pixels included in the row of pixels in the three shift images, respectively, whereas the plurality of dots represent examples of the positions of the signal values used as the pixel values in the three ringing-corrected images for the purpose of correcting the ringing artifacts with respect to the pixels included in the row. Further, (D) of FIGS. 8 and (D) of FIG. 9 illustrate states in which the positions of the signal values in (C) of the respective drawings are arranged in the X direction.

For example, as illustrated in (A) of FIG. 8, when the MR image to be processed has no ringing artifacts, because the positions of the pixels are not shifted by the ringing correction, the position of the signal value used as the pixel value in each of the ringing-corrected images is the same as the position of the pixel in the MR image to be processed, as illustrated in (B) of FIG. 8.

Further, in that situation, as illustrated in (C) of FIG. 8, the position of the signal value used as the pixel value in each of the ringing-corrected images respectively generated from the three shift images is also the same as the position of the pixel in the corresponding shift image. As a result, as illustrated in (D) of FIG. 8, when the positions of the signal values used as the pixel values in the three ringing-corrected images are arranged, the signal values in the three images are arranged so as to take turns in the same order.

In contrast, in the situation where the MR image to be processed has ringing artifacts, as illustrated in (A) of FIG. 9, for example, because the positions of the pixels are shifted by the ringing correction, the position of the signal value used in the ringing-corrected images with respect to each of the pixels is different from the position of the pixel in the MR image to be processed, as illustrated in (B) of FIG. 9.

Further, in that situation, as illustrated in (C) of FIG. 9, the position of the signal value used as the pixel value in each of the ringing-corrected images respectively generated from the three shift images is, with respect to each of the pixels, also different from the position of the pixel in the corresponding shift image. In addition, the shift amounts with respect to each of the pixels vary among the three ringing-corrected images. As a result, as illustrated in (D) of FIG. 9, when the positions of the signal values used as the pixel values in the three ringing-corrected images are arranged, the ordering of the signal values may be lost (see, for example, the 11th and the 12th dots and the 26th and the 27th dots from the left in (D) of FIG. 9).

Figure 10:
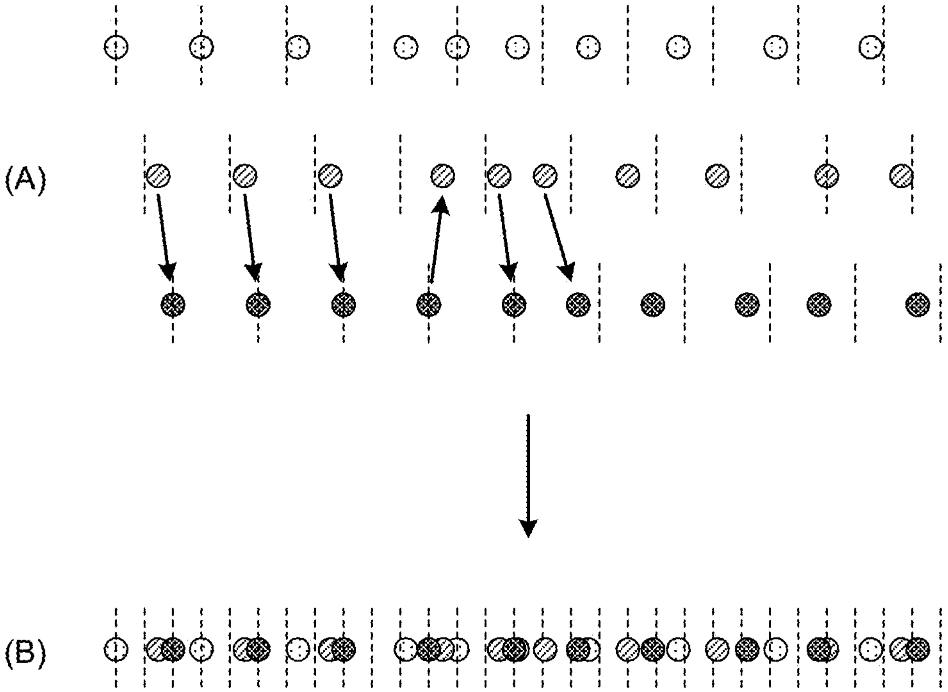
FIG. 10 is a chart illustrating an example of a process that immediately follows the process illustrated in FIG. 10 and FIGS. 11A and 11B, performed by the combining function according to Embodiment Example 4.

To cope with this situation, in the present embodiment example, as illustrated in (A) and (B) of FIG. 10, for example, the combining function 154 is configured to generate a combined image by first sorting the pixels included in the plurality of ringing-corrected images according to the order of the positions thereof within the MR Image to be processed and subsequently combining, while interleaving, the pixels in the sorted order.

With this configuration, it is possible to correctly generate the combined image, even in the situation where the ordering might otherwise be lost regarding the positions of the signal values used in each of the plurality of ringing-corrected images.

Further, when the ringing correction is performed on each of the plurality of shift images as explained in the above embodiment examples, as a result of the positions of the pixels being shifted with respect to each of the shift images, the position of the signal value used as a pixel value may be duplicated between the plurality of ringing-corrected images. In that situation, as a result of generating a combined image from the plurality of ringing-corrected images, adjacently positioned pixels would use an equal signal value as pixel values thereof, which would result in degradation of the resolving power.

To cope with this situation, for example, the combining function 154 may adjust the positions of the signal values to be used as pixels in the combined image so that the signal values in the same position will not be used, at the time of combining, while interleaving, the pixels included in the ringing-corrected images.

For example, the combining function 154 may set, in advance, a minimum distance Dmin tolerated between the positions of the signal values, so as to judge whether or not there is a set of signal values between which the distance is shorter than Dmin, at the time of combining, while interleaving, the pixels included in the ringing-corrected images. Further, when there is such a set of signal values, the combining function 154 is configured to adjust one or both of the positions of the signal values so that the distance between the signal values becomes Dmin. For example, the combining function 154 is configured to adjust the positions of the signal values, by performing a linear interpolation to calculate the signal values to be exhibited when one or both are moved so that the distance between the signal values becomes Dmin.

In this situation, the value of Dmin may be determined as appropriate in accordance with the ringing artifact correction effect and the resolving power required from the combined image. For example, when Dmin is set to 0.0, the resolving power of the combined image is permitted to be lower, locally, in the vicinity of severe ringing where a maximal ringing correction effect is most desirable. On the contrary, when Dmin is set such that $0<Dmin<<1/3$ is satisfied, for example, the resolving power of the combined image is higher in the vicinity of severe ringing, but the ringing correction effect there is lower, compared to the situation where Dmin was set to 0.0.

Further, in the above Embodiment Example 4, the process performed by the combining function 154 according to Embodiment Example 3 is explained as an example, an analogous method can be likewise applied to the process performed by the combining function 154 according to Embodiment Examples 1 and 2.

The processing functions of the processing circuitry 150 have thus been explained. The processing circuitry 150 described above may be realized by using one or more processors, for example. In that situation, the processing functions of the processing circuitry 150 may be stored in the storage 120 in the form of computer-executable programs, for example. Further, the processing circuitry 150 is configured to realize the processing functions corresponding to the programs, by reading and executing the programs stored in the storage 120. In other words, the processing circuitry 150 that has read the programs has the processing functions illustrated in FIG. 1.

Figure 11A:
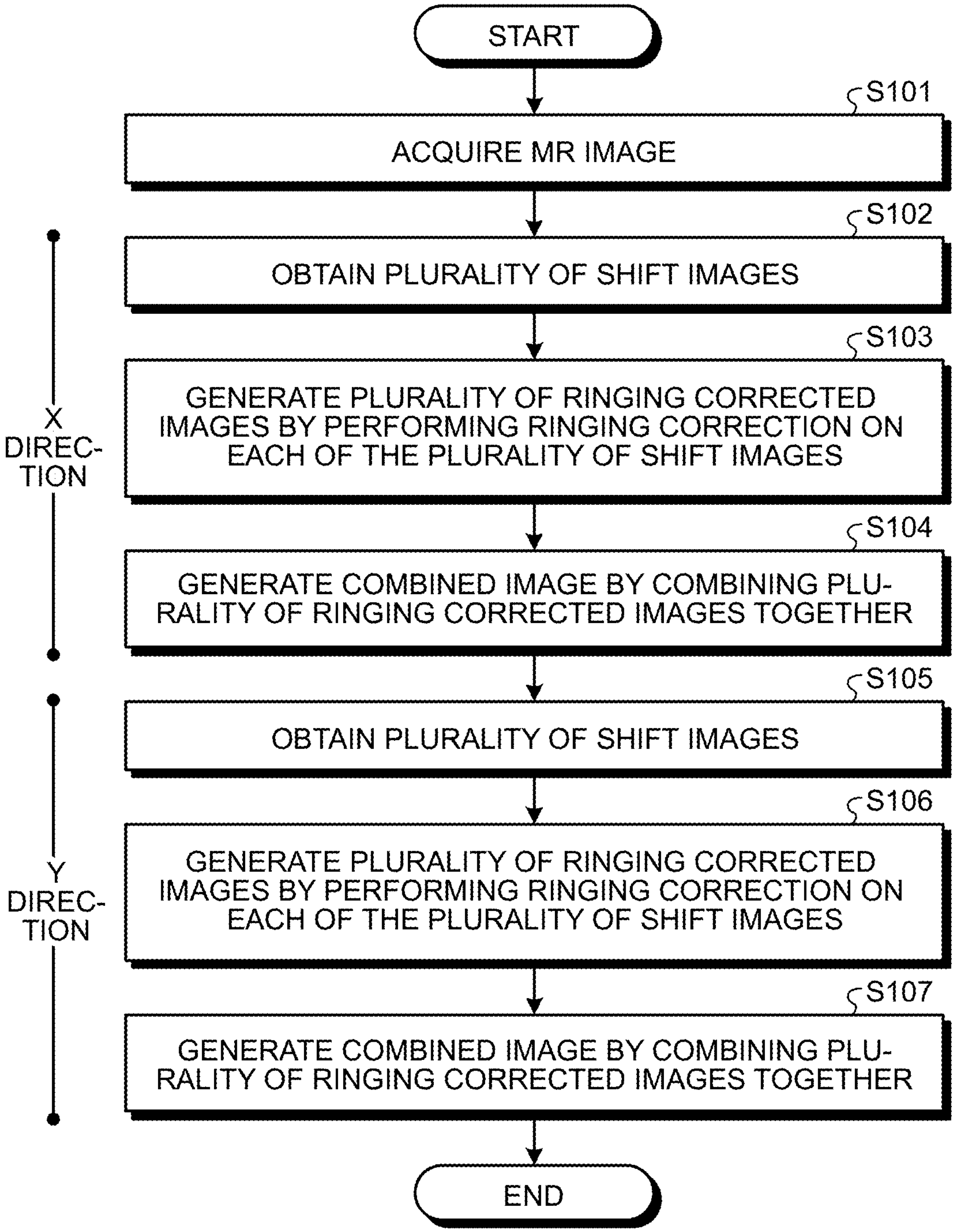
FIG. 11A is a flowchart illustrating a processing procedure in a process performed by the image processing apparatus according to Embodiment Example 1.

FIG. 11A is a flowchart illustrating a processing procedure in a process performed by the image processing apparatus 100 according to Embodiment Example 1.

For example, as illustrated in FIG. 11A, in Embodiment Example 1, to begin with, the MR image acquiring function 151 acquires an MR image to be processed in which the ringing artifacts are to be corrected, from the MRI apparatus 200 or the image storing apparatus 300 (step S101). The process is realized, for example, as a result of processing circuitry 150 which reads and executes a program corresponding to the MR image acquiring function 151 from the storage 120.

Subsequently, on the basis of the MR image acquired by the MR image acquiring function 151, the image shifting function 152 obtains a plurality of X-direction shift images resulting from shifting the position of the pixel sampling grid of the MR image in the X direction by a plurality of mutually-different shift amounts (step S102). This process is realized, for example, as a result of processing circuitry 150 reading and executing a program corresponding to the image shifting function 152 from the storage 120.

After that, the ringing correcting function 153 generates a plurality of X-direction ringing-corrected images, by performing the ringing correction for the X direction in the first ringing correction method illustrated in FIG. 2A on each of the plurality of X-direction shift images obtained by the image shifting function 152 (step S103). This process is realized, for example, as a result of processing circuitry 150 reading and executing a program corresponding to the ringing correcting function 153 from the storage 120.

Subsequently, the combining function 154 generates an intermediate combined image in which the plurality of X-direction ringing-corrected images are combined, by combining, while interleaving, the pixels included in each of the plurality of X-direction ringing-corrected images generated by the ringing correcting function 153 (step S104). This process is realized, for example, as a result of processing circuitry 150 reading and executing a program corresponding to the combining function 154 from the storage 120.

Subsequently, on the basis of the intermediate combined image generated by the combining function 154, the image shifting function 152 obtains a plurality of Y-direction shift images resulting from shifting the position of the pixel sampling grid of the intermediate combined image in the Y direction by a plurality of mutually-different shift amounts (step S105). This process is realized, for example, as a result of processing circuitry 150 reading and executing a program corresponding to the image shifting function 152 from the storage 120.

Subsequently, the ringing correcting function 153 generates a plurality of Y-direction ringing-corrected images, by performing the ringing correction for the Y direction in the first ringing correction method illustrated in FIG. 2B on each of the plurality of Y-direction shift images obtained by the image shifting function 152 (step S106). This process is realized, for example, as a result of processing circuitry 150 reading and executing a program corresponding to the ringing correcting function 153 from the storage 120.

Subsequently, the combining function 154 generates a final combined image in which the plurality of Y-direction ringing-corrected images are combined, by combining, while interleaving, the pixels included in each of the plurality of Y-direction ringing-corrected images generated by the ringing correcting function 153 (step S107). This process is realized, for example, as a result of processing circuitry 150 reading and executing a program corresponding to the combining function 154 from the storage 120.

Figure 11B:
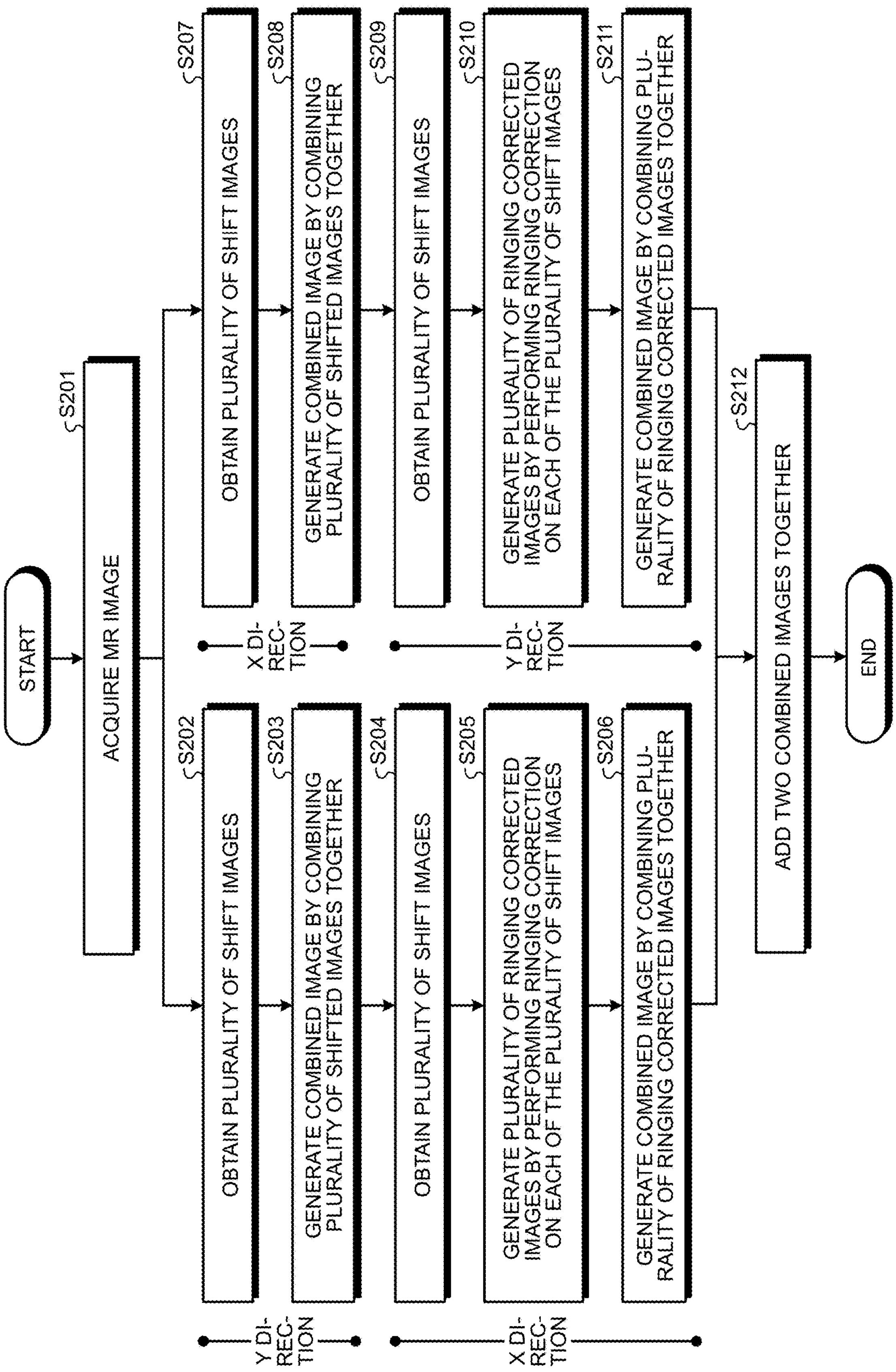
FIG. 11B is a flowchart illustrating a processing procedure in a process performed by the image processing apparatus according to Embodiment Examples 2 to 4.

FIG. 11B is a flowchart illustrating a processing procedure in a process performed by the image processing apparatus 100 according to Embodiment Examples 2 to 4.

For example, as illustrated in FIG. 11B, in Embodiment Examples 2 to 4, to begin with, the MR image acquiring function 151 acquires an MR image to be processed in which the ringing artifacts are to be corrected, from the MRI apparatus 200 or the image storing apparatus 300 (step S201). The process is realized, for example, as a result of processing circuitry 150 which reads and executes a program corresponding to the MR image acquiring function 151 from the storage 120.

Subsequently, on the basis of the MR image acquired by the MR image acquiring function 151, the image shifting function 152 obtains a plurality of Y-direction shift images resulting from shifting the position of the pixel sampling grid of the MR image in the Y direction by a plurality of mutually-different shift amounts (step S202). This process is realized, for example, as a result of processing circuitry 150 reading and executing a program corresponding to the image shifting function 152 from the storage 120.

Subsequently, the combining function 154 generates a first intermediate combined image in which the plurality of Y-direction ringing-corrected images are combined, by combining, while interleaving, the pixels included in each of the plurality of Y-direction ringing-corrected images generated by the image shifting function 152 (step S203). This process is realized, for example, as a result of processing circuitry 150 reading and executing a program corresponding to the combining function 154 from the storage 120.

Subsequently, on the basis of the first intermediate combined image generated by the combining function 154, the image shifting function 152 obtains a plurality of X-direction shift images resulting from shifting the position of the pixel sampling grid of the first intermediate combined image in the X direction by a plurality of mutually-different shift amounts (step S204). This process is realized, for example, as a result of processing circuitry 150 reading and executing a program corresponding to the image shifting function 152 from the storage 120.

Subsequently, the ringing correcting function 153 generates a plurality of X-direction ringing-corrected images, by performing the ringing correction for the X direction in the second ringing correction method illustrated in FIG. 2C on each of the plurality of X-direction shift images obtained by the image shifting function 152 (step S205). This process is realized, for example, as a result of processing circuitry 150 reading and executing a program corresponding to the ringing correcting function 153 from the storage 120.

Subsequently, the combining function 154 generates a second intermediate combined image in which the plurality of X-direction ringing-corrected images are combined, by combining, while interleaving, the pixels included in each of the plurality of X-direction ringing-corrected images generated by the ringing correcting function 153 (step S206). This process is realized, for example, as a result of processing circuitry 150 reading and executing a program corresponding to the combining function 154 from the storage 120.

In addition, on the basis of the MR image acquired by the MR image acquiring function 151, the image shifting function 152 obtains a plurality of X-direction shift images resulting from shifting the position of the pixel sampling grid of the MR image in the X direction by a plurality of mutually-different shift amounts (step S207). This process is realized, for example, as a result of processing circuitry 150 reading and executing a program corresponding to the image shifting function 152 from the storage 120.

Subsequently, the combining function 154 generates a third intermediate combined image in which the plurality of X-direction ringing-corrected images are combined, by combining, while interleaving, the pixels included in each of the plurality of X-direction ringing-corrected images generated by the image shifting function 152 (step S208). This process is realized, for example, as a result of processing circuitry 150 reading and executing a program corresponding to the combining function 154 from the storage 120.

Subsequently, on the basis of the third intermediate combined image generated by the combining function 154, the image shifting function 152 obtains a plurality of Y-direction shift images resulting from shifting the position of the pixel sampling grid of the third intermediate combined image in the Y direction by a plurality of mutually-different shift amounts (step S209). This process is realized, for example, as a result of processing circuitry 150 reading and executing a program corresponding to the image shifting function 152 from the storage 120.

Subsequently, the ringing correcting function 153 generates a plurality of Y-direction ringing-corrected images, by performing the ringing correction for the Y direction in the second ringing correction method illustrated in FIG. 2D on each of the plurality of Y-direction shift images obtained by the image shifting function 152 (step S210). This process is realized, for example, as a result of processing circuitry 150 reading and executing a program corresponding to the ringing correcting function 153 from the storage 120.

Subsequently, the combining function 154 generates a fourth intermediate combined image in which the plurality of Y-direction ringing-corrected images are combined, by combining, while interleaving, the pixels included in each of the plurality of Y-direction ringing-corrected images generated by the ringing correcting function 153 (step S211). This process is realized, for example, as a result of processing circuitry 150 reading and executing a program corresponding to the combining function 154 from the storage 120.

After that, the combining function 154 is configured to generate a final combined image by adding together the second intermediate combined image and the fourth intermediate combined image (step S212).

As explained above, in the image processing apparatus 100 according to the first embodiment, on the basis of the MR image to be processed, the image shifting function 152 is configured to obtain the plurality of shift images resulting from shifting the position of the pixel sampling grid of the MR image by the plurality of mutually-different shift amounts. Further, the ringing correcting function 153 is configured to generate the plurality of ringing-corrected images, by determining, with respect to each of the pixels included in each of the plurality of shift images generated by the image shifting function 152, the shift amount from the position of the pixel to the position where the ringing artifacts will be reduced, and further performing the ringing correction to correct the ringing artifacts occurring in the shift images on the basis of the determined shift amounts. Further, the combining function 154 is configured to generate the combined image in which the plurality of ringing-corrected images are combined, by combining, while interleaving, the pixels included in each of the plurality of ringing-corrected images generated by the ringing correcting function 153.

With the configuration described above, it is possible to obtain an MR image in which ringing artifacts have been corrected and which has resolving power similar to that from the zero-fill interpolation, by obtaining the plurality of shift images having the mutually-different shift amounts on the basis of the MR image to be processed, performing the ringing correction on the shift images, and subsequently, combining, while interleaving, the pixels in the plurality of ringing-corrected images resulting from the ringing correction.

Consequently, the image processing apparatus 100 according to the first embodiment is able to provide the MR image in which the ringing artifacts have been corrected and which has a higher resolution.

FIGS. 12A to 13B are drawings illustrating advantageous effects of the image processing apparatus 100 according to the first embodiment.

Figure 12B:
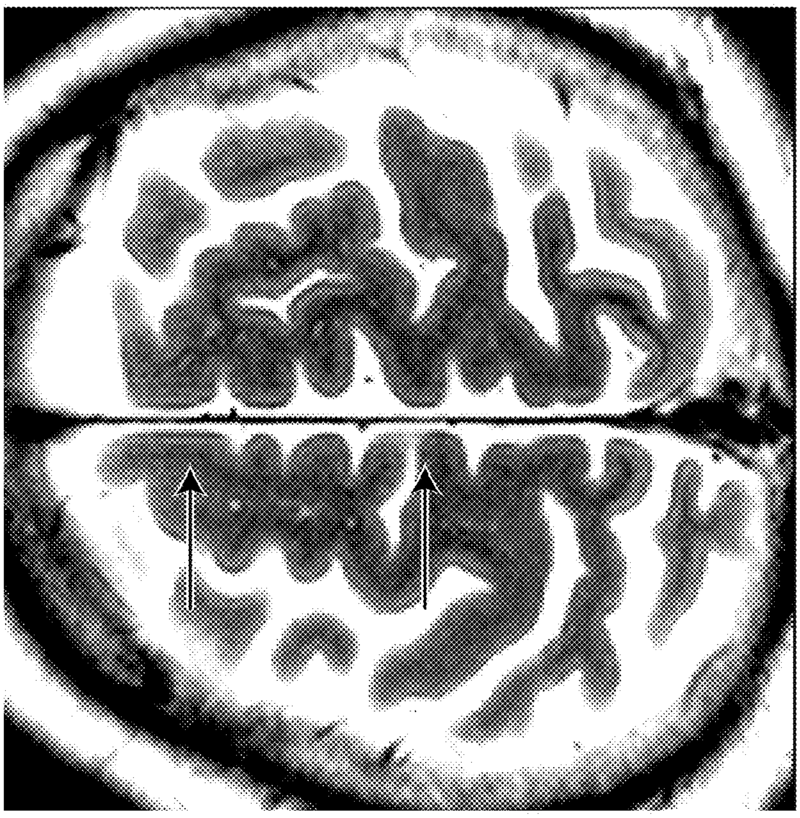
FIG. 12B is a drawing illustrating the result after applying two conventional methods, one for ringing reduction and one for increasing the resolution, to the MR image illustrated in FIG. 12A; specifically, it illustrates the image obtained when a spatial smoothing process that employs a low-pass filter, and a k-space zero-fill interpolation process, are both applied to the image in FIG. 12A.
Figure 12A:
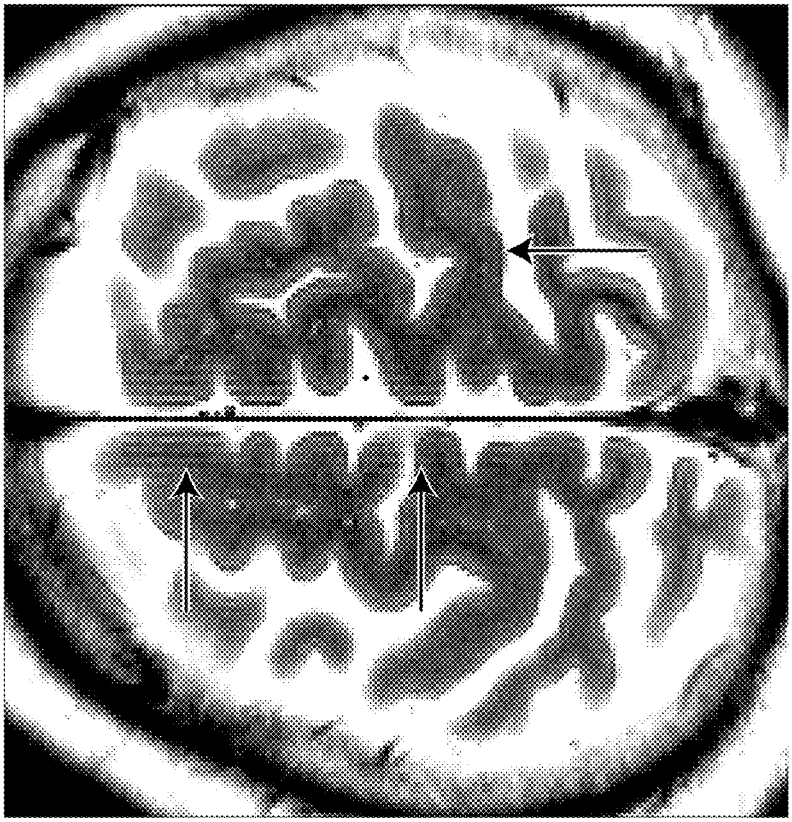
FIGS. 12A and 13A are drawings illustrating an MR image (both drawings are the same image) such as those that may be input to the image processing apparatus according to the first embodiment.
Figure 13B:
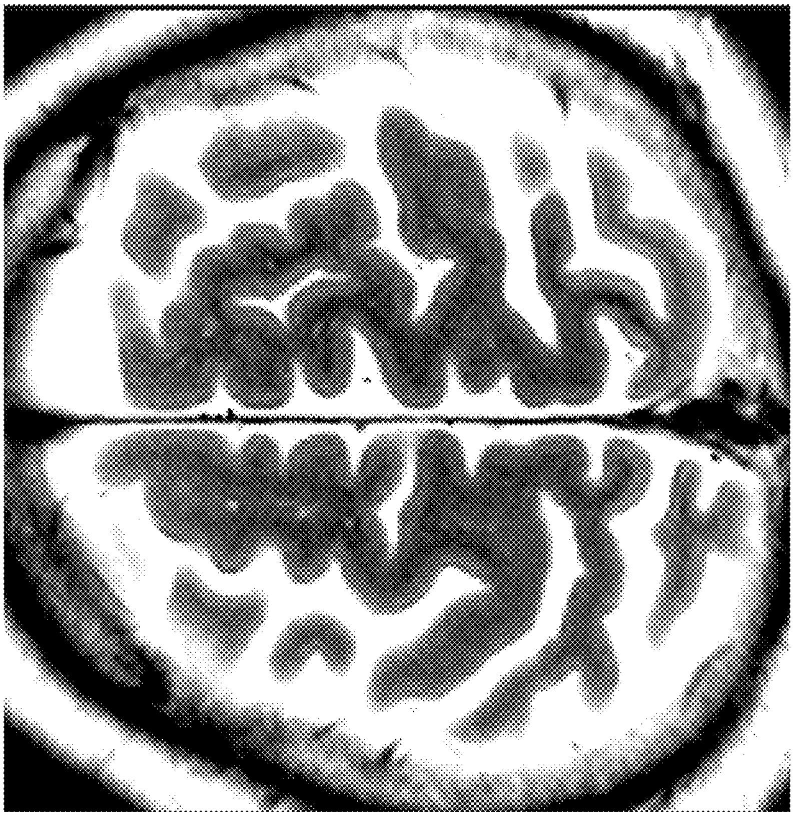
FIG. 13B is a drawing illustrating an output from, and illustrating advantageous effects of, the image processing apparatus according to the first embodiment.
Figure 13A:
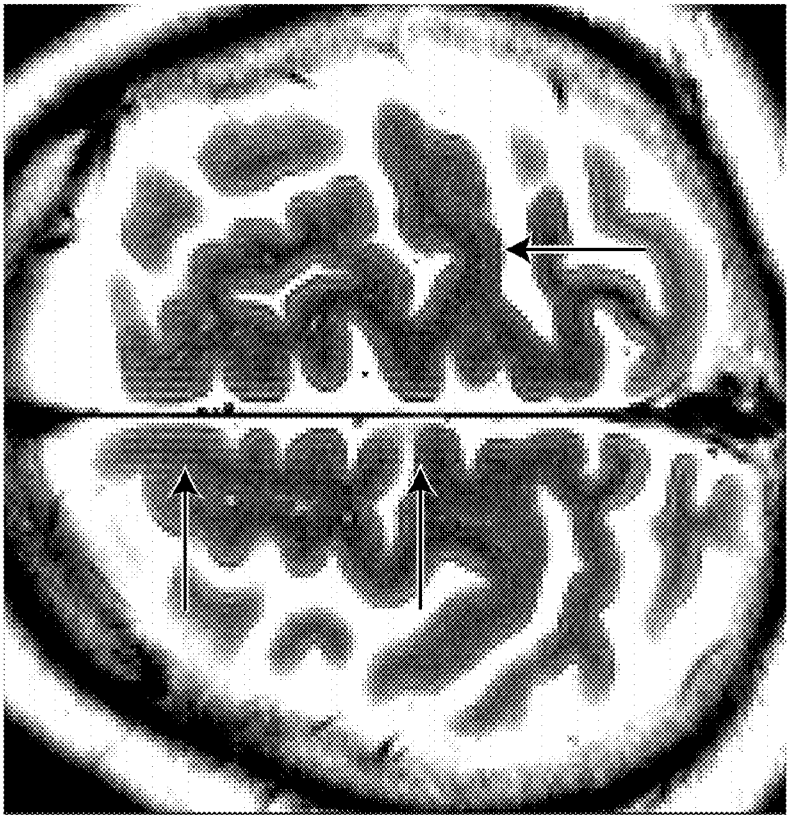

More specifically, FIGS. 12A and 13A are drawings illustrating an MR image (both drawings are the same image) such as those that may be input to the image processing apparatus 100 according to the first embodiment.

FIGS. 12B and 13B illustrate images obtained by performing different techniques on the same MR image. Both techniques increase the resolution and reduce ringing, but the effectiveness of the ringing reduction differs.

FIG. 12B illustrates the result obtained when a k-space zero-fill interpolation process, and a spatial smoothing process employing a low-pass filter, are both applied to the input image; FIG. 13B illustrates the result obtained when the processes described in the present embodiment are applied to the input image. In both cases, the same input was used (the image of a brain illustrated in FIGS. 12A and 13A).

For example, as illustrated in FIG. 13B, by performing the processes described in the present embodiment, it is possible, as compared to the example illustrated in FIG. 12B, to correct the ringing more completely (see the sections indicated by the arrows in the drawings) while achieving a resolution and resolving power similar to those resulting from zero-fill interpolation.

Second Embodiment

In the first embodiment above, the example was explained in which the ringing correcting function 153 performs the ringing correction by using the ringing correcting method that employs the sub-voxel shifts. However, in the ringing correction described above, if the shift amount of each of the pixels was determined from among the full range of shift amounts used in the ringing correction, continuity of shift amount between adjacently positioned pixels would be ignored, and as a result, the image would become blurred.

To improve on this situation, for example, the ringing correcting function 153 may be configured to perform the ringing correction described above, while taking into account the continuity of shift amount between adjacently positioned pixels (that is, from pixel to neighboring pixel). In the following sections, such an example will be explained as a second embodiment.

More specifically, in the present embodiment, the ringing correcting function 153 is configured to perform the ringing correction explained in the first embodiment on each of the plurality of shift images generated by the image shifting function 152, while taking into account the continuity of shift amount between adjacently positioned pixels as explained below.

Figure 14:
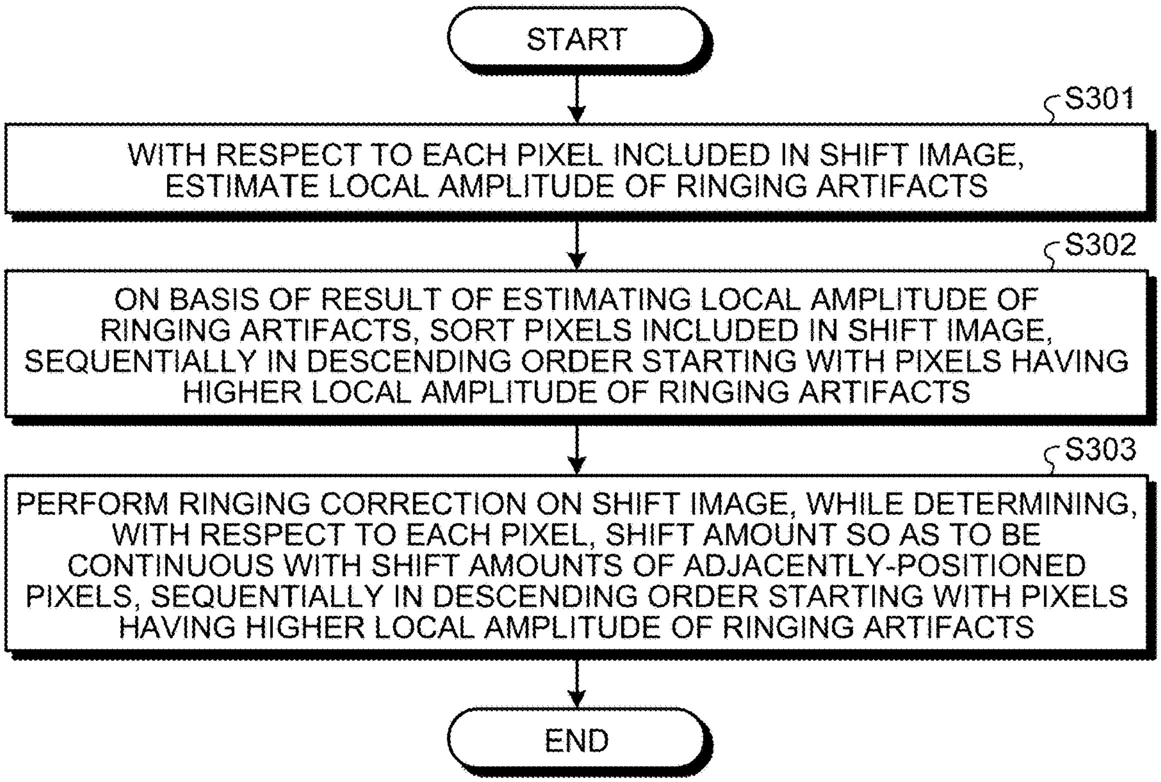
FIG. 14 is a flowchart illustrating a processing procedure in a ringing correction performed by a ringing correcting function according to a second embodiment.

FIG. 14 is a flowchart illustrating a processing procedure in the ringing correction performed by the ringing correcting function 153 according to the second embodiment.

For example, as illustrated in FIG. 14, to begin with, the ringing correcting function 153 estimates a local amplitude of ringing artifacts, with respect to each of the pixels included in the shift image (step S301).

More specifically, as a result of estimating the local amplitude of ringing artifacts, the ringing correcting function 153 generates a ringing map indicating the local amplitudes of ringing artifacts with respect to each of the pixels included in the shift image.

For example, by performing an initial ringing correction on the shift image, the ringing correcting function 153 generates a difference image between an image before ringing correction and the ringing-corrected image. Since MR images generally have complex numbers as pixel values, the ringing correcting function 153 can first compute the magnitude image of the shift image and the magnitude image of the ringing-corrected image. The ringing correcting function 153 then generates a difference image between these two magnitude images such that the difference image has pixel values that are real numbers (positive, negative, or zero). Finally, it computes the absolute value of each pixel value in the difference image as the ringing amplitude map, hereafter referred to simply as a "ringing map."

FIGS. 15 to 18 are drawings illustrating examples of the ringing map generating process performed by the ringing correcting function 153 according to the second embodiment.

Figure 15:
FIG. 15 is an MR image containing ringing artifacts that is an example of an input to the ringing correcting function according to the second embodiment.

For example, the ringing correcting function 153 generates an X-direction ringing image and an X-direction ringing-corrected image by performing the processes illustrated in (A) and (C) of FIG. 2A on an X-direction shift image of a slice of the brain as illustrated in FIG. 15, and generates a Y-direction ringing image and a Y-direction ringing image by performing the processes illustrated in (B) and (C) of FIG. 2B on a Y-direction shift image of the slice. In this situation, the ringing correcting function 153 determines a shift amount of each of the pixels from among the full range of shift amounts used in the ringing correction so as to generate ringing-corrected images in the X direction and in the Y direction.

Figure 16B:
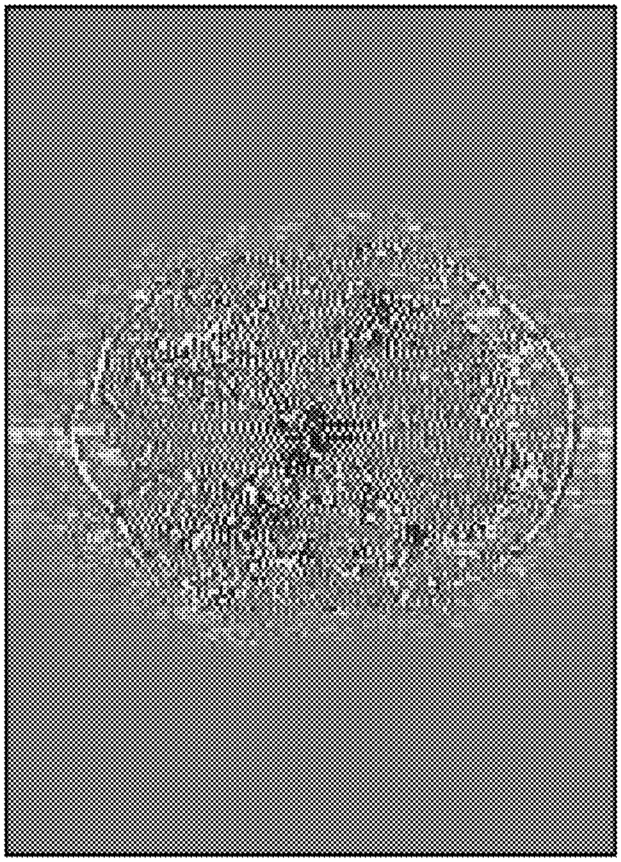
FIGS. 16A and 16B are drawings illustrating examples of a first step in the ringing map generation process performed by the ringing correcting function according to the second embodiment.
Figure 16A:
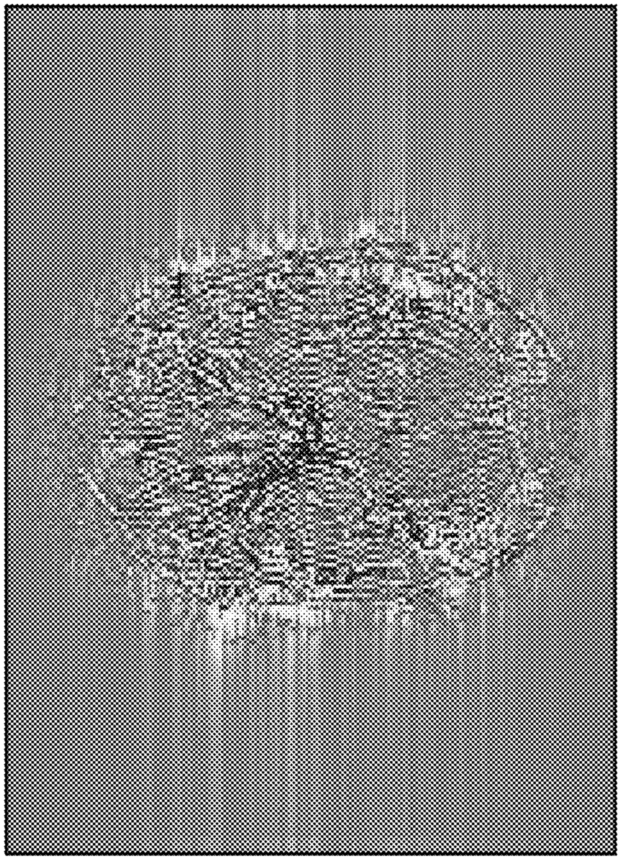

After that, the ringing correcting function 153 generates an X-direction ringing difference image as illustrated in FIG. 16A, by generating a magnitude image from the complex-valued X-direction ringing image and a magnitude image from the complex-valued X-direction ringing-corrected image and further generating a difference image of the two. Further, similarly, the ringing correcting function 153 generates a Y-direction ringing difference image as illustrated in FIG. 16B, by generating a magnitude image from the Y-direction ringing image and a magnitude image from the Y-direction ringing-corrected image, and further generating a difference image of the two.

Figure 17:
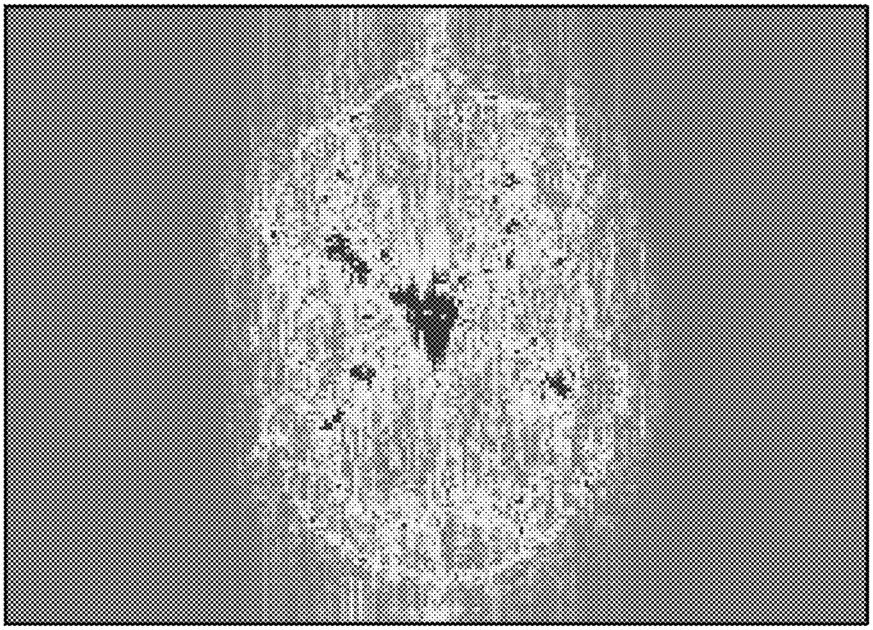
FIG. 17 is a drawing illustrating an example of a ringing amplitude map generated as a second step in the ringing map generation process performed by the ringing correcting function according to the second embodiment.

Subsequently, the ringing correcting function 153 generates an X-direction ringing amplitude map, as illustrated in FIG. 17, by computing the absolute value of each pixel value in the X-direction difference image. Further, similarly, the ringing correcting function 153 generates a Y-direction ringing amplitude map by computing the absolute value of each pixel value in the Y-direction difference image.

Figure 18:
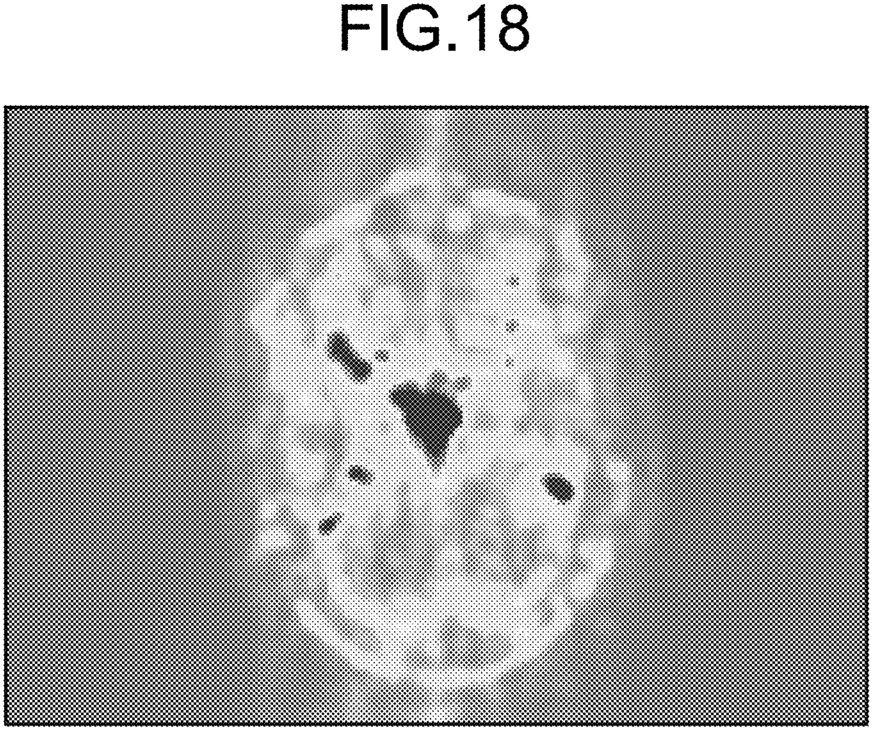
FIG. 18 is a drawing illustrating an example of a smoothed ringing amplitude map generated as a third step in the ringing map generation process performed by the ringing correcting function according to the second embodiment.

After that, the ringing correcting function 153 may further process the X- and Y-direction ringing amplitude maps according to a publicly known technique for a smoothing or filtering process, to obtain processed ringing maps. As an example of a processed ringing map, FIG. 18 illustrates a Y-direction ringing amplitude map that has been processed with a 2-dimensional smoothing filter.

In the description above, the example was explained in which the difference image between an image before ringing correction and an initial ringing-corrected image was used to generate a ringing amplitude map, a type of ringing map. However, possible methods for generating a ringing map are not limited to this example.

For instance, the ringing correcting function 153 may calculate a total variation with respect to each of the pixels included in each of the shift images, by using the method described above, so as to generate a ringing map directly on the basis of the calculated total variation values. In this case, an initial ringing correction, performed as a means to estimate the local amplitudes of ringing artifacts, is not necessary.

Returning to the description of FIG. 14, subsequently, on the basis of the result of estimating the local amplitude of ringing artifacts, the ringing correcting function 153 performs the ringing correction on the shift image, while determining the shift amount of each of the pixels so as to be approximately continuous with the shift amounts of the adjacently positioned pixels, sequentially in descending order starting with pixels having higher local amplitude.

More specifically, on the basis of the generated ringing map, the ringing correcting function 153 performs the ringing correction on the shift image, while determining the shift amount of each of the pixels, sequentially in the descending order starting with the pixels having higher local amplitude of ringing artifacts.

Even more specifically, on the basis of the result of estimating the local amplitude of ringing artifacts, the ringing correcting function 153 sorts the pixels included in the shift image, sequentially in the descending order starting with the pixels having higher local amplitude of ringing artifacts (step S302).

After that, the ringing correcting function 153 performs the ringing correction on the shift image, while determining, with respect to each of the pixels, the shift amount so as to be approximately continuous with the shift amounts of the adjacently positioned pixels, sequentially in the descending order starting with the pixels having higher local amplitude of ringing artifacts (step S303).

At first, the ringing correcting function 153 sets a first threshold value related to the local amplitudes of ringing artifacts and a second threshold value smaller than the first threshold value.

In this situation, the ringing correcting function 153 sets the first threshold value and the second threshold value on the basis of the range of amplitudes of ringing artifacts across the MR image and the number of pixels included in the MR image. The correcting unit may be further configured to compute the residual range of amplitudes of ringing artifacts after excluding trivially low amplitudes, or extremely high amplitudes, or both, as the range of amplitudes of ringing artifacts to consider when setting the threshold values.

For example, the ringing correcting function 153 sets a reference amplitude value on the basis of the range of amplitudes of ringing artifacts across the MR image and the number of pixels included in the MR image. After that, the ringing correcting function 153 sets the first threshold value by multiplying the reference value by a first parameter. Also, the ringing correcting function 153 sets the second threshold value by multiplying the reference value by a second parameter smaller than the first parameter.

Figure 19:
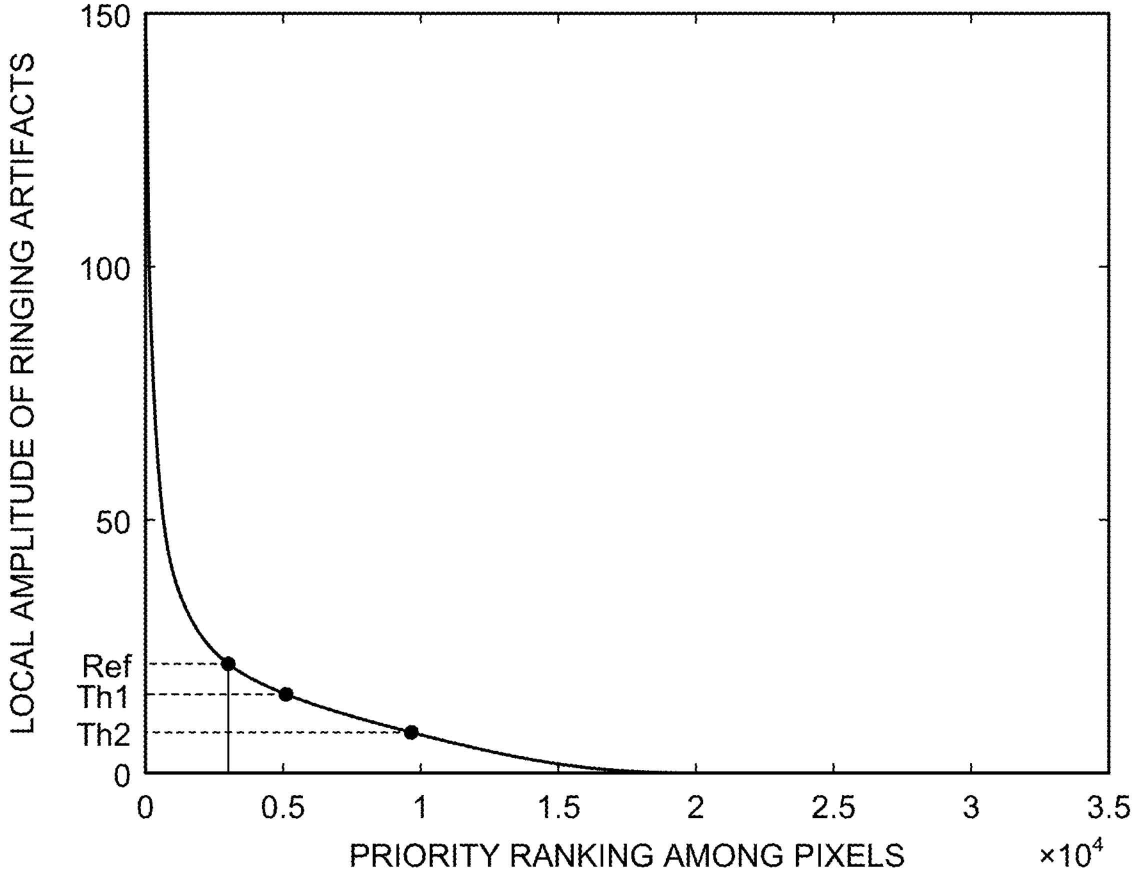
FIG. 19 is an example of a chart of local amplitude of ringing artifacts (chart y axis) and priority (chart x axis) for all pixels in an input image, illustrating a process of setting threshold values related to local amplitude of ringing artifacts, performed by the ringing correcting function according to the second embodiment.

FIG. 19 is a chart illustrating a first example of the process of setting the threshold values related to the local amplitude of ringing artifacts, performed by the ringing correcting function 153 according to the second embodiment.

More specifically, FIG. 19 illustrates a result of sorting the pixels, in descending order starting with pixels having higher local amplitude of ringing artifacts. Further, the vertical axis of the chart in FIG. 19 expresses the local amplitude of ringing artifacts, whereas the horizontal axis expresses a priority ranking among the pixels, when pixels are defined with priority ranks, sequentially in the descending order starting with the pixels having higher local amplitude of ringing artifacts. In this situation, FIG. 19 illustrates an example in which the quantity of the pixels included in the shift image is 35,000, while the local amplitude of ringing artifacts of the pixels are in the range from 0 to 150, and the pixels are defined with priority ranks from the 1st to the 35,000th places, sequentially in the descending order starting with the pixels having higher local amplitude of ringing artifacts.

In the first example, for example, as illustrated in FIG. 19, the ringing correcting function 153 derives a curve indicating changes in the local amplitude of ringing artifacts, with respect to the pixels sorted according to the descending order starting with the pixels having higher local amplitude of ringing artifacts. Subsequently, the ringing correcting function 153 divides the area defined by the derived curve, a straight line corresponding to the vertical axis, and another straight line corresponding to the horizontal axis of the chart in FIG. 19, into two sections in the horizontal axis direction and further sets the local amplitude of ringing artifacts in the priority rank at the position where the two sections have equal areas, as a reference value Ref.

After that, the ringing correcting function 153 sets a first threshold value Th1 by multiplying the set reference value Ref by the first parameter (e.g., 75%). Also, the ringing correcting function 153 sets a second threshold value Th2 by multiplying the reference value Ref by the second parameter (e.g., 40%) smaller than the first ratio. In this situation, the first parameter and the second parameter used by the ringing correcting function 153 are set by the operator in advance, for example.

FIGS. 20A to 20E are charts illustrating a second process of setting the threshold values related to the local amplitudes of ringing artifacts, performed by the ringing correcting function 153 according to the second embodiment.

In the second example, the ringing correcting function 153 first excludes background pixels from the shift image.

Figure 20A:
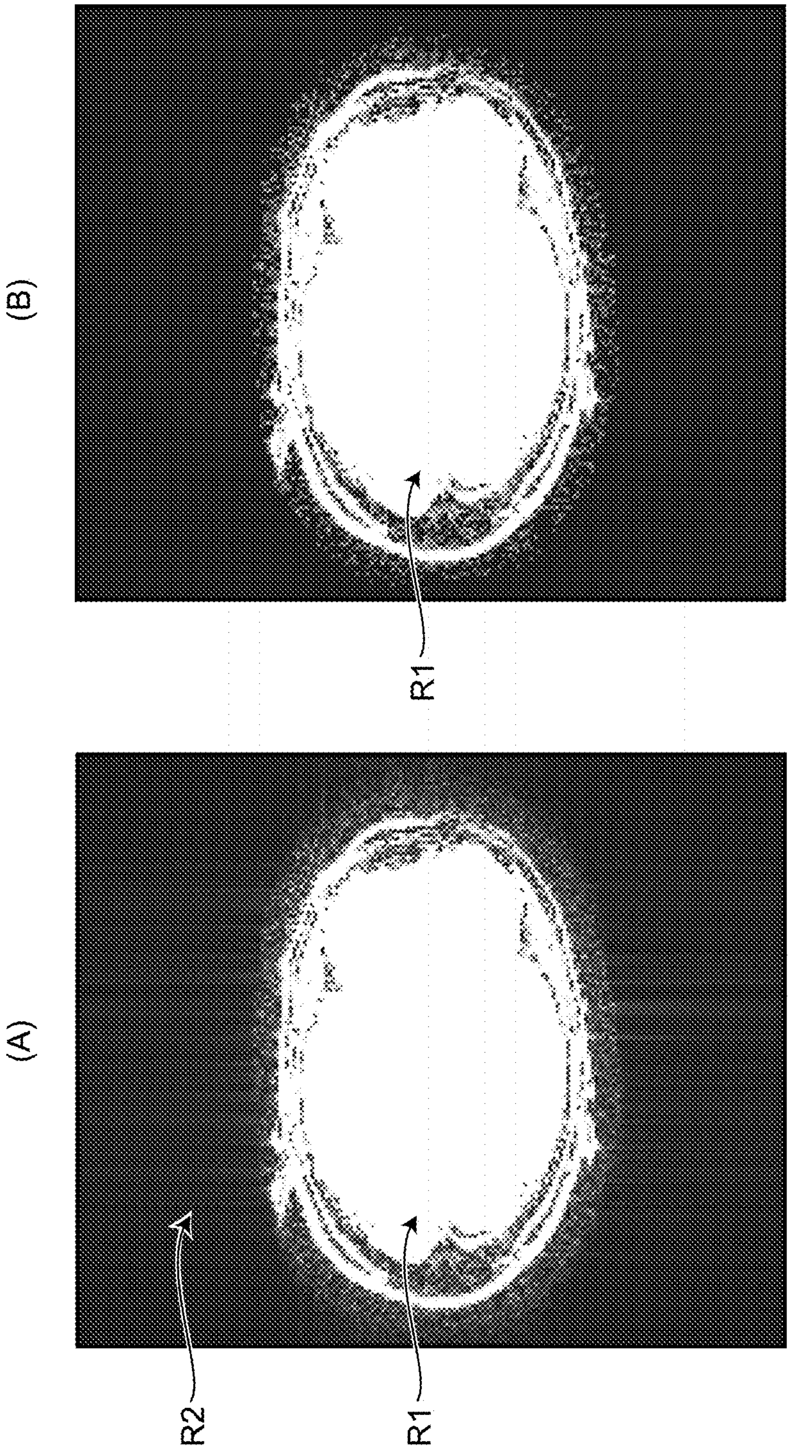
FIGS. 20A to 20E are charts illustrating a second of the process of setting the threshold values related to the local amplitude of ringing artifacts, performed by the ringing correcting function according to the second embodiment.

For example as, as illustrated in (A) of FIG. 20A, the shift image includes a region R1 depicting the subject and a background region R2. For example, the ringing correcting function 153 applies a masking process to the image based on pixel values thereof, and thereby, as illustrated in (B) of FIG. 20A, exclude the background region R2 from the shift image.

After that, the ringing correcting function 153 derives, based on the shift image from which the background has been excluded, similarly to the first example, a curve indicating changes in the local amplitude of ringing artifacts with respect to the pixels sorted in descending order according to their local amplitude of ringing artifacts.

Figure 20B:
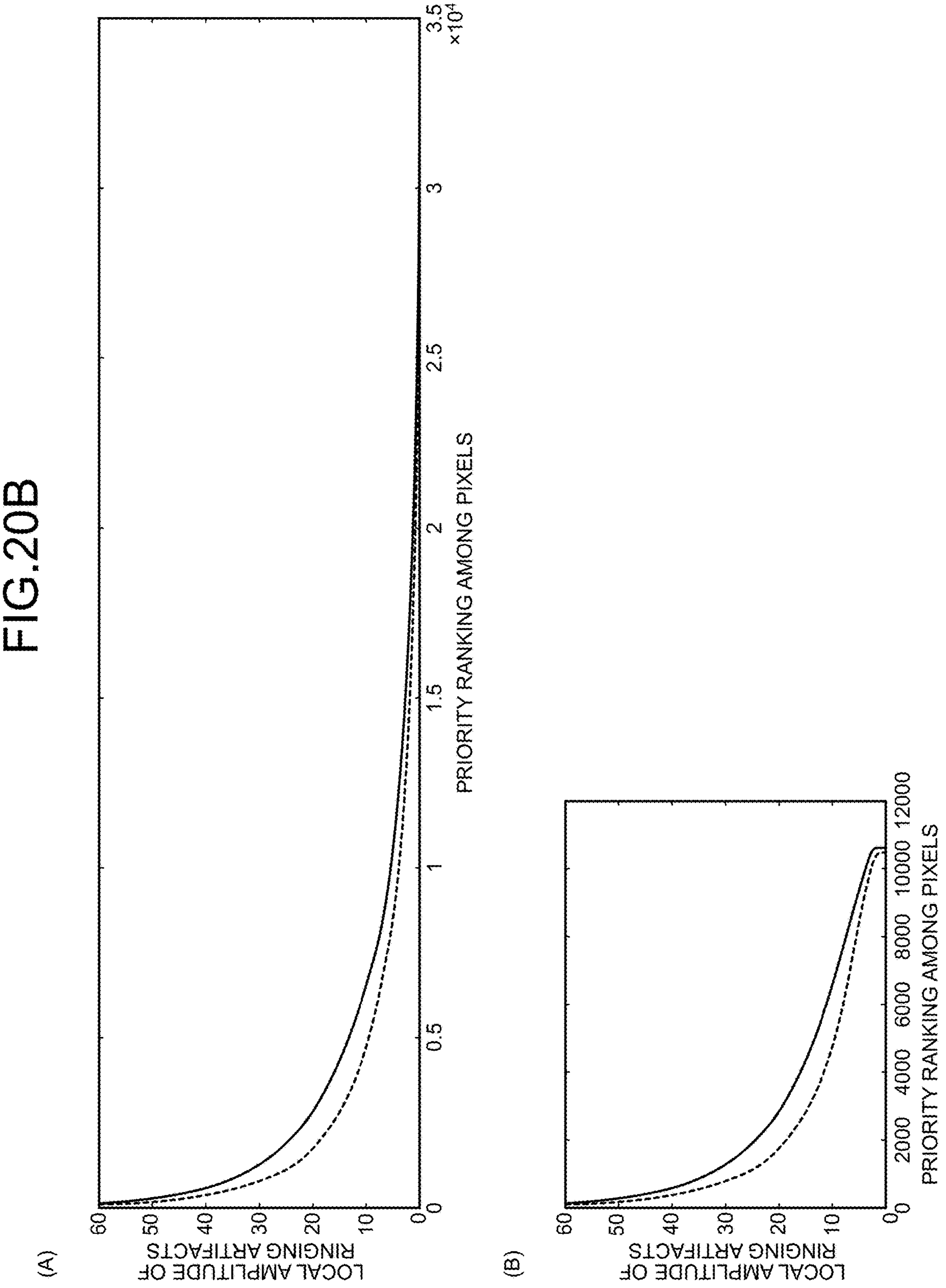

For example, (A) of FIG. 20B illustrates a curve derived based on the shift image before the background is excluded, and (B) of FIG. 20B illustrates a curve derived based on the shift image after the background is excluded. In FIG. 20B, in both (A) and (B), the solid-line curve and the dotted-line curve represent two different slices from one MRI scan.

If a curve is derived based on the shift image before the background is excluded, as illustrated in (A) of FIG. 20B, the curve includes pixels in the background that have low local amplitudes of ringing artifacts. In contrast, when a curve is derived based on the shift image after the background is excluded, as illustrated in (B) of FIG. 20B, the pixels in the background that have a low local amplitude of ringing artifacts are excluded from the curve.

After that, the ringing correcting function 153 excludes pixels having extremely high local amplitude of ringing artifacts deemed to be outliers.

Figure 20C:
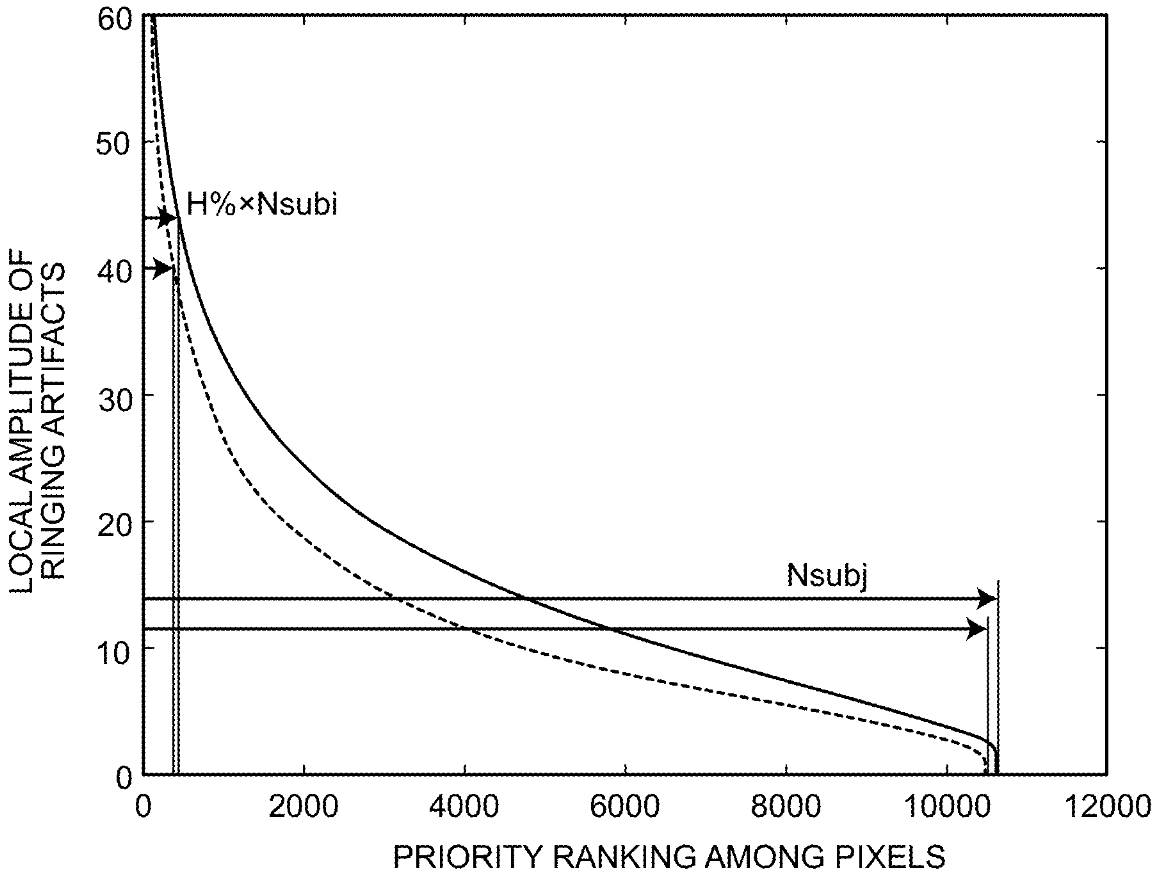

For example, as illustrated in FIG. 20C, the ringing correcting function 153 defines Nsubj, the number of pixels contained within the subject, and using a predetermined ratio H % (for example, 5%), excludes the H %×Nsubj pixels with the highest local amplitude. As illustrated in FIG. 20C, the number of pixels contained within the subject, Nsubj, depends on the slice position and many other variable factors, and accordingly, the number of excluded pixels H %×Nsubj also varies.

After that, the ringing correcting function 153 sets, based on the remaining (1−H %)×Nsubj pixels, a first threshold value and a second threshold value while considering the height of the curve's "tail" (a portion of pixels in the vicinity of the pixel with the lowest priority rank).

Figure 20D:
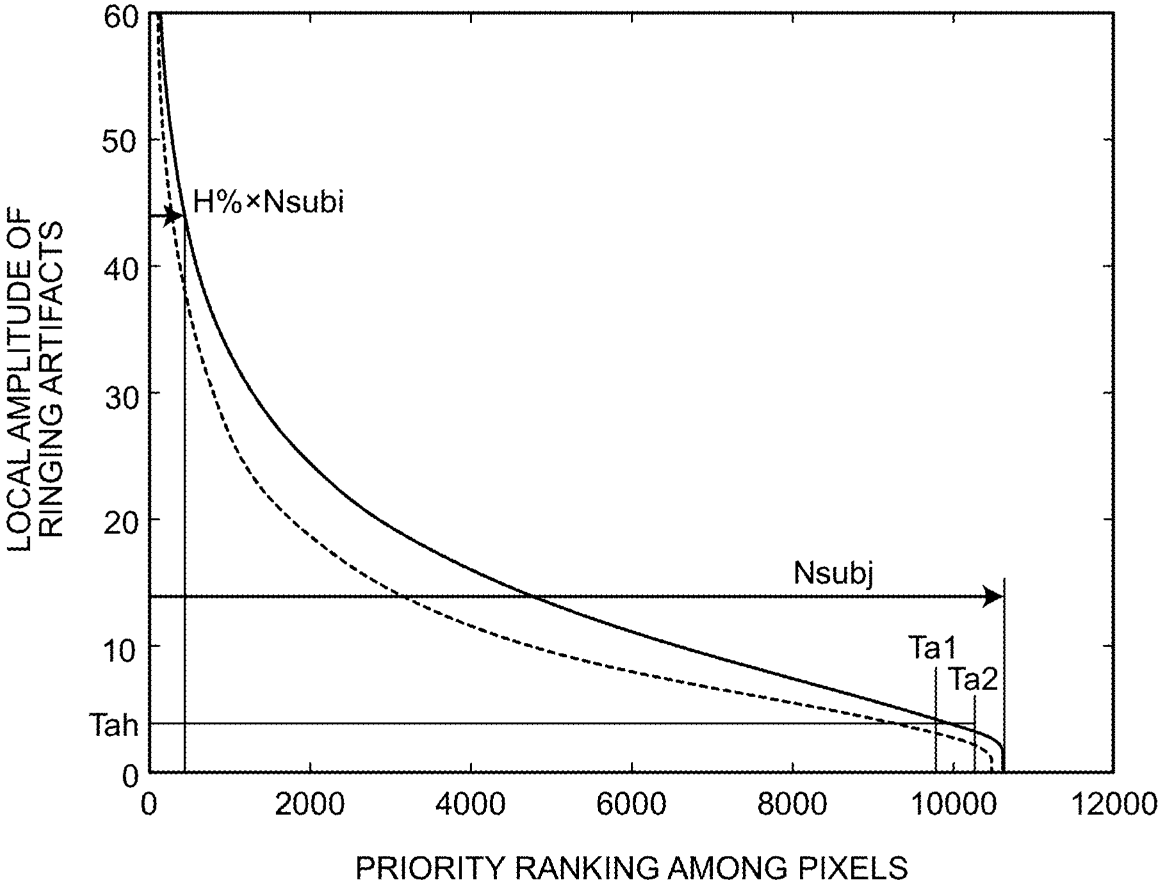

For example, as illustrated in FIG. 20D, the ringing correcting function 153, using a predetermined ratio RTa1 (for example, 5%), determines a pixel Ta1 such that the area under the curve to the right of Ta1 equals RTa1×(area under the curve), and using a predetermined ratio RTa2 (for example, 2.5%) which is lower than RTa1, determines a pixel Ta2 such that the area under the curve to the right of Ta2 equals RTa2×(area under the curve). In this situation, the ratios RTa1 and RTa2 used by the ringing correcting function 153 may be set identically for all slices, MRI sequences, subjects, etc., and may be set by the operator in advance, for example.

Then, the ringing correcting function 153 calculates the average height of the curve between the two pixels Ta1 and Ta2, and defines the calculated average as the height Tah of the curve's tail. One straightforward method to calculate Tah is provided by the following formula:

$$Tah=(\text{totalTailArea}-\text{steepTailArea})/(Ta2-Ta1)$$

where "totalTailArea" is the area under the curve between Ta1 and Nsubj, and "steepTailArea" is the area under the curve between Ta2 and Nsubj.

Although it is not illustrated in FIG. 20C, the height Tah depends on the characteristics of the input image, according to the curve thereof, and thus Tah will differ for each input image depending, for example, on the MRI sequence and parameters used to acquire it, and on the anatomy represented within the image.

Figure 20E:
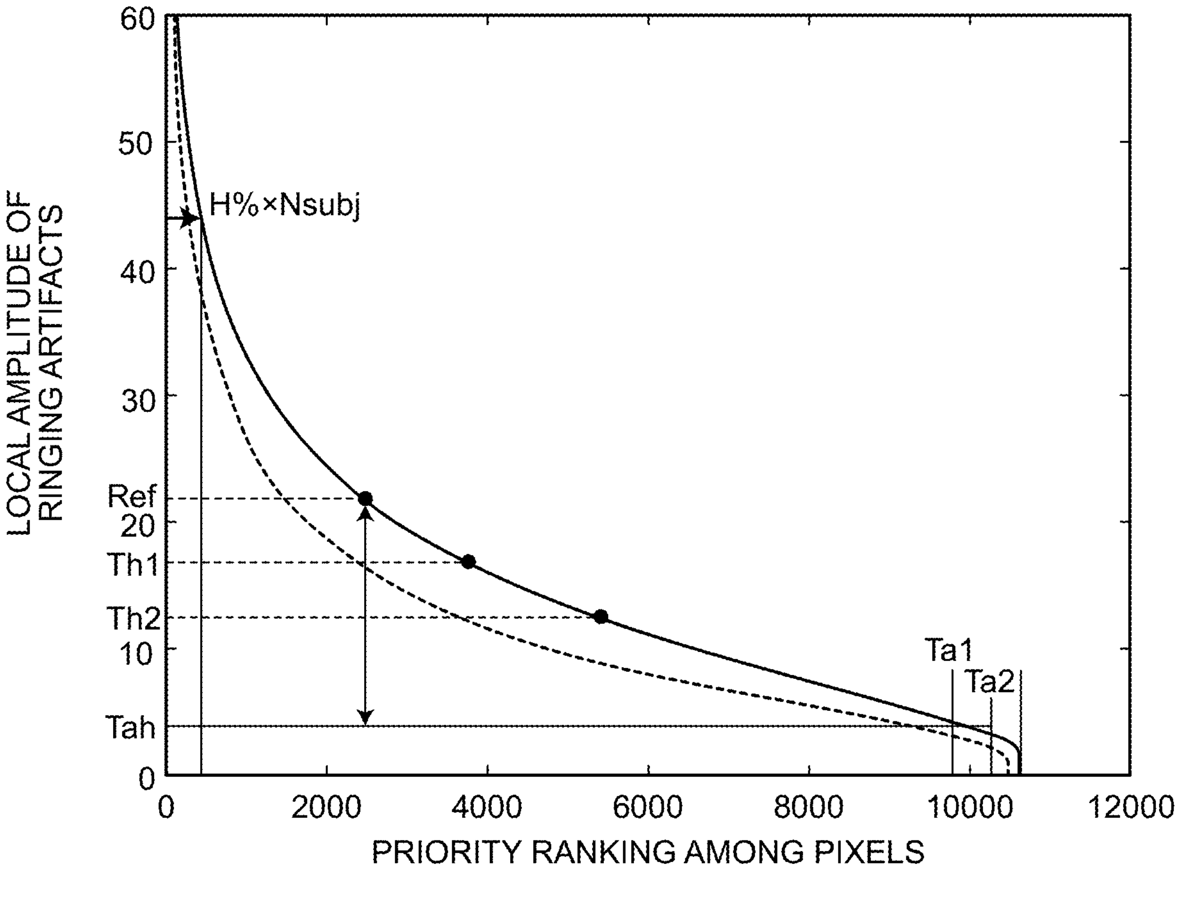

Subsequently, as illustrated in FIG. 20E, the ringing correcting function 153 computes the area under the curve, above a horizontal line with height Tah, to the right of a vertical line crossing the horizontal axis at H %×Nsubj. Further, it divides this area into two sections along the horizontal axis direction, and sets as a reference amplitude Ref the local amplitude in the priority rank at the position where the two sections have equal areas. Then a reference amplitude range can be defined as $$\text{RefRange}=\text{Ref}-Tah$$

After that, the ringing correcting function 153 sets, similarly to the first example, a first threshold value Th1 by multiplying the reference amplitude range RefRange by the first parameter (e.g., 30%). Also, the ringing correcting function 153 sets a second threshold value Th2 by multiplying RefRange by the second parameter (e.g., 20%) smaller than the first ratio. In this situation, the first parameter and the second parameter used by the ringing correcting function 153 are set by the operator in advance, for example. Although it is not illustrated in FIG. 20C, RefRange, Th1, and Th2 depend on the characteristics of the input image, according to the curve thereof, and thus RefRange, Th1, and Th2 will differ for each input image depending, for example, on the MRI sequence and parameters used to acquire it, and on the anatomy represented within the image.

Thus, the ringing correcting function 153 sets a first threshold value and a second threshold value for the X direction, based on the X-direction ringing map, and sets a first threshold value and a second threshold value for the Y direction, based on the Y-direction ringing map.

As explained above, the threshold values related to the local amplitudes of ringing artifacts are set on the basis of the range of amplitudes of ringing artifacts across the MR image and the number of pixels included in the MR image. Accordingly, it is possible to set the threshold values appropriately with consistent standards, even when the MR image to be processed has variations in the image size (the number of rows in the X direction×the number of columns in the Y direction in the matrix), in the number of pixels exhibiting ringing artifacts, in the amplitudes of ringing artifacts, and the like. For example, it is possible to appropriately set the threshold values even when the MR image to be processed is drawn from a broad range of targeted body regions, slice positions, subjects, imaging dates/times, imaging parameters (e.g., pixel size and field of view), image types (e.g., a T1-weighted image, a T2-weighted image, a diffusion-weighted image), and the like.

In particular, the method of the second example allows the first and second parameters to be applied over a wider range of MRI sequence types and image types, and is more robust compared with the method of the first example.

After that, the ringing correcting function 153 is configured to perform the ringing correction according to the flow illustrated in FIGS. 2A and 2B.

More specifically, to begin with, the ringing correcting function 153 is configured, while using an X-direction shift image as an input, to generate the k-space data of the X-direction ringing image in which ringing artifacts remain along the X direction only, by applying the filter (Gx) that suppresses the higher spatial frequency components in the Y direction, to the k-space data of the input (FIG. 2A, (A)).

Further, similarly to the X direction, the ringing correcting function 153 is configured, regarding the Y direction also, to generate the Y-direction ringing image in which ringing artifacts remain along the Y direction only, by applying the filter (Gy) that suppresses the higher spatial frequency components in the X direction, to the k-space data of the input (FIG. 2A, (B)).

After that, the ringing correcting function 153 is configured to generate the X-direction ringing-corrected image in which the ringing artifacts along the X direction have been corrected, by performing the ringing correction on the k-space data of the X-direction ringing image (FIG. 2A, (C)).

In this situation, in the present embodiment, on the basis of the first threshold value and the second threshold value that have been set, the ringing correcting function 153 is configured, with respect to each of the pixels, to determine the shift amount so as to be approximately continuous with the shift amounts of adjacently positioned pixels, sequentially in the descending order starting with the pixels having higher local amplitude of ringing artifacts.

More specifically, with respect to each of the pixels of which the local amplitude of ringing artifacts is equal to or higher than the first threshold value, the ringing correcting function 153 is configured to determine the shift amount so as to be close to the shift amounts of adjacently positioned pixels.

In contrast, with respect to each of the pixels of which the local amplitude of ringing artifacts is lower than the first threshold value, the ringing correcting function 153 is configured to determine the shift amount so as to be close to the shift amounts of adjacently positioned pixels and to subsequently adjust the determined shift amounts so that the shift amounts gradually diminish, sequentially in descending order starting with the pixels having higher local amplitude.

Further, with respect to each of the pixels of which the local amplitude of ringing artifacts is lower than the second threshold value, the ringing correcting function 153 is configured to set the shift amount to 0.

For example, the ringing correcting function 153 is configured, with respect to each of the pixels, to define a group comprised of the plurality of adjacently positioned pixels and to further set a shift amount tolerance range on the basis of pixels included in the pixel group for which a shift amount was already determined.

FIGS. 21A to 21G are drawings illustrating examples of a pixel groupings that could be employed by the ringing correcting function 153 according to the second embodiment.

Figure 21A:
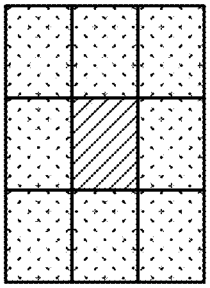
FIGS. 21A to 21G are drawings illustrating examples of a pixel grouping and weighting process that may be used to enforce continuity of shift amounts of adjacently positioned pixels, during determination of a shift amount for each pixel performed by the ringing correcting function according to the second embodiment.
Figure 21B:
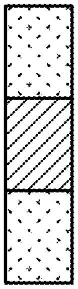
Figure 21C:
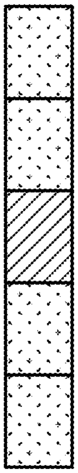

In this situation, among the examples illustrated in FIGS. 21A to 21G, the pixel groupings in FIGS. 21A to 21C are sufficient for correcting ringing in general; however, to improve the level of precision, the pixel groupings illustrated in FIGS. 21D to 21G may be used.

For example, as illustrated in FIG. 21A, with respect to a target pixel (the center pixel in FIG. 21A) of which a shift amount is to be determined, the ringing correcting function 153 sets a group S made up of eight pixels including the two adjacent pixels positioned on either side of the target pixel in terms of the X direction (the left-and-right direction in FIG. 21A) and the six adjacent pixels positioned on either side of the two pixels and the target pixel in terms of the Y direction (the up-and-down direction in FIG. 21A).

Further, while Ns denotes the quantity of pixels of which the shift amounts have been determined among the pixels included in the group S, the ringing correcting function 153 is configured to set a shift amount tolerance range for the target pixel in accordance with the value of Ns.

For example, when Ns=0 is true, the ringing correcting function 153 is configured to set the shift amount tolerance range for the target pixel to be the range from the minimum value to the maximum value of the shift amounts used in the ringing correction described above.

As a result, when the shift amounts used in the ringing correction range from −0.5 pixels to +0.5 pixels, for example, the shift amount tolerance range for the target pixel is calculated to be the range from −0.5 pixels to +0.5 pixels, if Ns=0 is true.

Further, when Ns>0 is true, the ringing correcting function 153 is configured to set the shift amount tolerance range for the target pixel to be a range from ARlow to ARhigh pixels, by calculating the lower limit value ARlow and the upper limit value ARhigh according to Expressions (2) to (7)

presented below where min(S) denotes the minimum value and max(S) denotes the maximum value among the shift amounts of pixels which are included in the group S and for which the shift amounts have already been determined.

$$Rs=Ns/8 \quad (2)$$

$$T1=h\times Rs\times[\max(S)-\min(S)] \quad (3)$$

$$T2low=[-0.5+\min(S)]/Ns \quad (4)$$

$$T2high=[+0.5-\max(S)]/Ns \quad (5)$$

$$ARlow=\min(S)+T1-T2low \quad (6)$$

$$ARhigh=\max(S)-T1+T2high \quad (7)$$

The coefficient h can be reasonably set to a constant value of ½, or h may be further optimized while observing the effect of its value on ringing correction quality, and on sub-voxel shift continuity which affects image sharpness.

Accordingly, when the shift amounts used in the ringing correction range from −0.5 pixels to +0.5 pixels, for example, and if Ns=1 when a certain pixel is processed, then Rs is ⅛, and the shift amount tolerance range for that pixel is calculated to be the range from approximately −0.5 pixels to approximately +0.5 pixels.

As another example, if Ns=8 when a certain other pixel is processed, then Rs is 1, and the shift amount tolerance range for that pixel is calculated to be the range from "min(S)+h×[max(S)−min(S)] pixels" to "max(S)−h×[max(S)−min(S)] pixels".

Figure 21D:
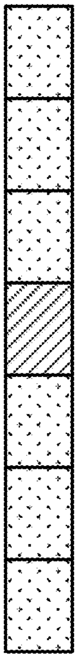

Alternatively, for example, as illustrated in FIG. 21B, with respect to the target pixel, the ringing correcting function 153 may set a group S including the two adjacent pixels positioned on either side of the target pixel in terms of the X direction. As another example, as illustrated in FIG. 21C, with respect to the target pixel, the ringing correcting function 153 may set a group S made up of four pixels including the two adjacent pixels positioned on either side of the target pixel in terms of the X direction; and the two adjacent pixels positioned on either side of the two pixels in terms of the X direction. As yet another example, as illustrated in FIG. 21D, with respect to the target pixel, the ringing correcting function 153 may set a group S made up of six pixels including the two adjacent pixels positioned on either side of the target pixel in terms of the X direction; the two adjacent pixels positioned on the outside of the two abovementioned adjacent pixels in terms of the X direction; and the two adjacent pixels positioned further on the outside of the two abovementioned adjacent pixels in terms of the X direction.

Figure 21E:
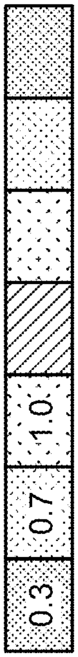
Figure 21F:
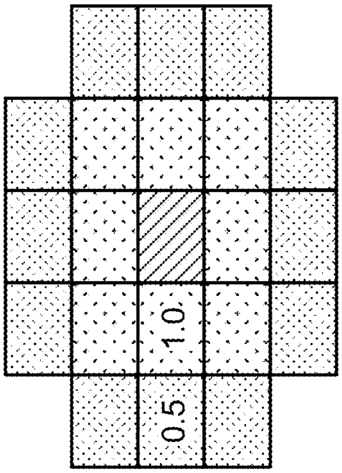

As yet another example, as illustrated in FIG. 21F, with respect to the target pixel, the ringing correcting function 153 may set a group S made up of 20 pixels further including, in addition to the four pixels included in the group S in the example in FIG. 21C, the ten adjacent pixels positioned on either side of the four pixels and the target pixel in terms of the Y direction; and the six adjacent pixels positioned on the outside, in terms of the Y direction, of the six inner pixels among the ten pixels in terms of the X direction. As yet another example, as illustrated in FIG. 21G, with respect to the target pixel, the ringing correcting function 153 may set a group S made up of twelve pixels further including, in addition to the six pixels included in the group S in the example in FIG. 21D, the six adjacent pixels positioned on either side, in terms of the Y direction, of the target pixel and the two inner pixels among the six pixels in terms of the X direction.

Further, when setting the shift amount tolerance range by using the method described above, the ringing correcting function 153 may apply weights to the shift amounts of the pixels included in the group S.

Figure 21G:
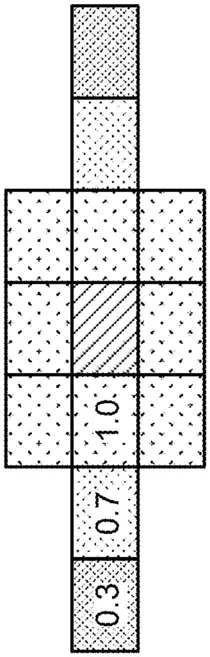

For example, as illustrated in FIGS. 21E to 21G, with respect to the pixels included in the group S, the ringing correcting function 153 may apply weights in such a manner that the farther a pixel is positioned from the target pixel, the smaller weight is applied to the shift amount thereof. For example, as illustrated in FIGS. 21E and 21F, the ringing correcting function 153 applies a weight 1.0 to the shift amount of each of the pixels positioned closest to the target pixel, applies a weight 0.7 to the shift amount of each of the second closest pixels, and applies a weight 0.3 to the shift amount of each of the third closest pixels.

Alternatively, as illustrated in FIG. 21G, the ringing correcting function 153 may vary, between the X direction and the Y direction, the magnitudes of the weights corresponding to the distances from the target pixel.

Further, with respect to the pixels of which the local amplitude of ringing artifacts are equal to or higher than the first threshold value, the ringing correcting function 153 is configured, with respect to each of the pixels, to determine the shift amount from the position of the pixel to the position where the ringing artifacts will be reduced, by using shift amounts within the set tolerance range.

In this situation, in the process described above, the shift amount tolerance range set by the ringing correcting function 153 changes in accordance with the quantity Ns of the pixels of which the shift amounts have already been determined. The smaller the value of Ns is, the larger is the range. The larger the value of Ns is, the smaller is the range.

In addition, in the process described above for a particular pixel, the higher the local amplitude of ringing artifacts, the earlier the shift amount thereof is determined, and therefore, the smaller is the value of Ns. On the contrary, the lower the local amplitude of ringing artifacts, the later the shift amount thereof is determined, and therefore, the larger is the value of Ns.

Consequently, in the process described above for a particular pixel, the higher the local amplitude of ringing artifacts, the larger is the range of possible shift amounts within which the pixel's shift amount is determined. On the contrary, the lower the local amplitude of ringing artifacts, the smaller is the range of possible shift amounts within which the pixel's shift amount is determined.

As a result, the shift amount of each pixel is determined in such a manner that pixels with the highest local amplitudes of ringing artifacts are granted the most freedom in obtaining shift values that are optimal for reducing ringing artifacts in those pixels, while pixels with lower local amplitudes of ringing artifacts are granted less freedom. In addition, regardless of the local amplitude of ringing artifacts, the shift amount for each pixel is determined such that differences from the shift amounts of adjacently positioned pixels are minimized. That is, the shift amount is determined so as to be approximately continuous with the shift amounts of adjacently positioned pixels.

With respect to each pixel for which the local amplitude of ringing artifacts is equal to or higher than the first threshold value, the shift amount of the pixel is determined according to the above process only.

Further, with respect to each pixel for which the local amplitude of ringing artifacts is lower than the first threshold value but is equal to or higher than the second threshold value, the ringing correcting function 153 is configured, with respect to each of the pixels, to determine the shift amount within a tolerance range computed in the same manner as for pixels which have a local amplitude equal to or higher than the first threshold value, and to subsequently multiply the determined shift amount by an adjustment coefficient. In this situation, the ringing correcting function 153 is configured to gradually diminish the values of the adjustment coefficients from 1 to 0, sequentially in the descending order starting with pixels having a higher local amplitude of ringing artifacts.

Further, with respect to each of the pixels of which the local amplitude of ringing artifacts is lower than the second threshold value, the ringing correcting function 153 is configured to set the shift amount to 0 for each of the pixels.

As a result, also with respect to each of the pixels for which the local amplitude of ringing artifacts is lower than the first threshold value, the shift amount of each pixel is determined so as to be approximately continuous with the shift amounts of adjacently positioned pixels.

Subsequently, the ringing correcting function 153 is configured to add the generated X-direction ringing-corrected image and the Y-direction ringing image which has been transformed to image space together, so as to generate a final X-direction ringing-corrected image (FIGS. 2A, (D)).

Further, similarly to the ringing correction for the X direction, the ringing correcting function 153 is configured, while using a Y-direction shift image as an input, after generating the k-space data of the X-direction ringing image and the k-space data of the Y-direction ringing image (FIGS. 2B, (A) and (B)), to generate the Y-direction ringing-corrected image in which ringing artifacts along the Y direction have been corrected, by performing the ringing correction on the k-space data of the Y-direction ringing image (FIG. 2B, (C)).

subsequently, the ringing correcting function 153 is configured to add the generated Y-direction ringing-corrected image and the X-direction ringing image which has been transformed to image space together, so as to generate a final Y-direction ringing-corrected image (FIG. 2B, (D)).

Further, the ringing correcting function 153 is configured to generate the final image in which ringing artifacts along the X direction and the Y direction have been corrected.

In this situation, the final image generated according to the process described above is obtained by implementing a ringing correcting method that employs sub-voxel shifts, and further, with respect to each of the shift images, determining a shift amount for each pixel so as to be approximately continuous with the shift amounts of adjacently positioned pixels. The final image therefore is an image in which ringing artifacts have been corrected and which is less blurred than a ringing-corrected image that was generated according to the original sub-voxel shift method.

For example, as explained above, if the shift amount of each pixel was determined from among the full range of shift amounts used in the ringing correction, the continuity between adjacently positioned pixels would be ignored, and as a result, the image would be blurred.

In contrast, according to the present embodiment, as explained above, the shift amount of each pixel is determined so as to be approximately continuous with the shift amounts of adjacently positioned pixels. In this situation, the shift amount can be regarded as a function of two variables, the pixel coordinates X and Y, that is sampled at the location of each pixel in the image. The present embodiment manages the determination of the shift amount at each pixel such that if the shift amount function were to be examined throughout the whole image, it would be smooth and would contain no spikes or sharp folds. In other words, it is a continuous function of the pixel coordinates X and Y.

FIGS. 22A to 23B are drawings illustrating examples of the shift amount determining process performed by the ringing correcting function 153 according to the second embodiment.

Figure 22B:
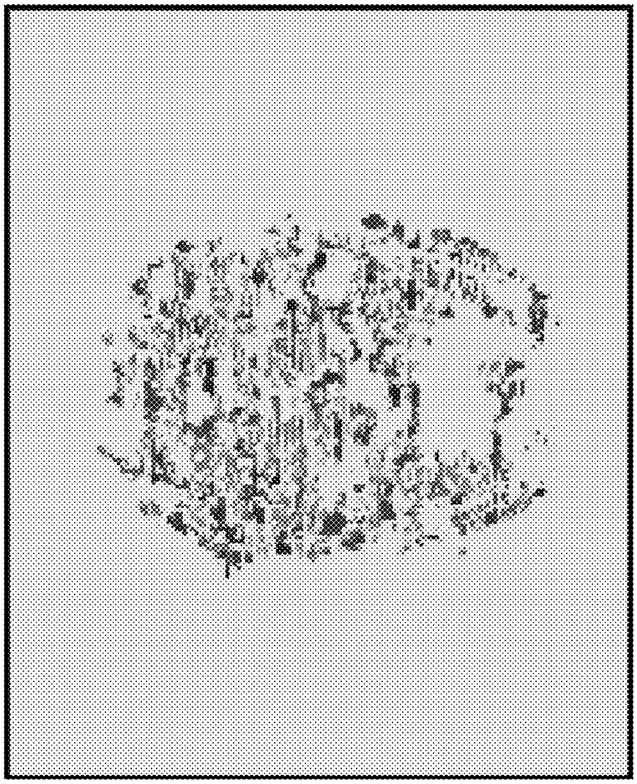
FIGS. 22A and 22B are drawings illustrating examples of, respectively, initial and final shift amount determination processes along an image x axis, performed by the ringing correcting function according to the second embodiment.
Figure 22A:
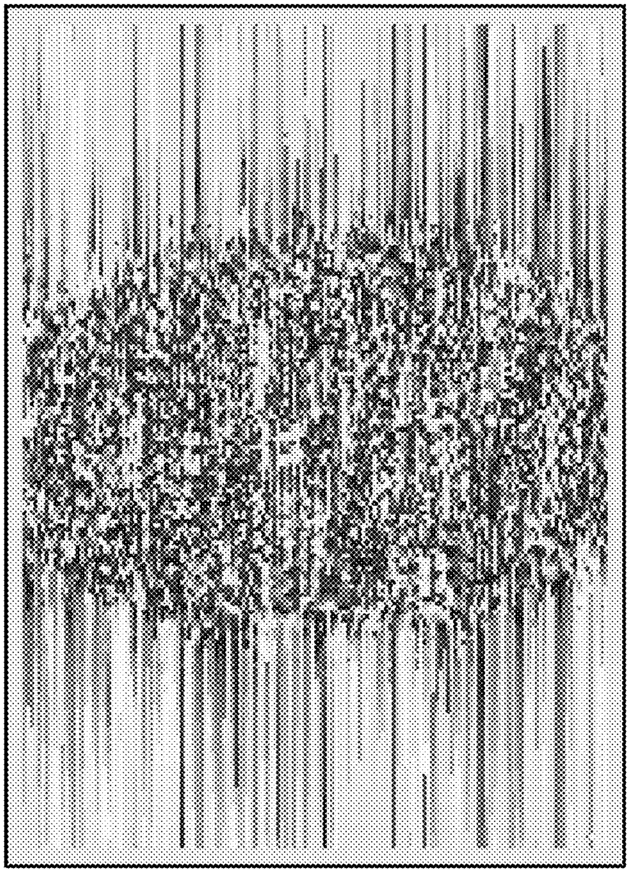
Figure 23B:
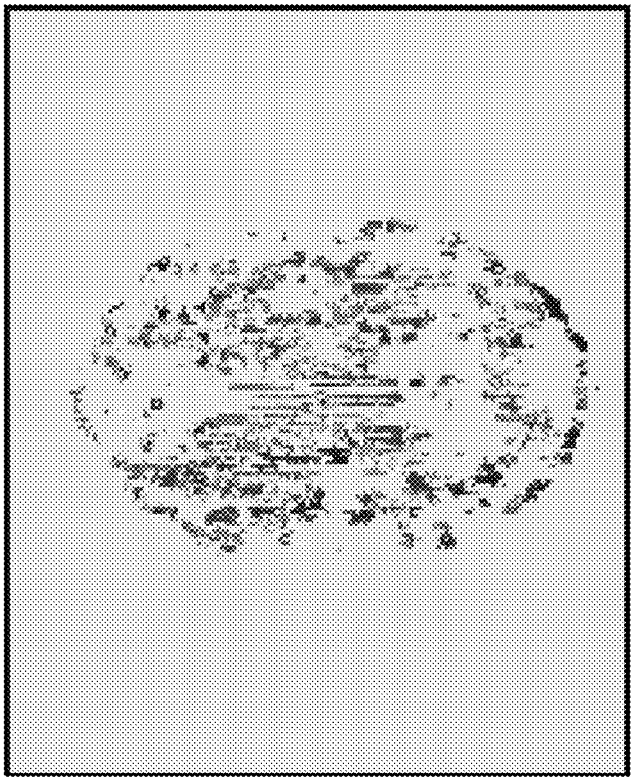
FIGS. 23A and 23B are drawings illustrating examples of, respectively, initial and final shift amount determination processes along an image y axis, performed by the ringing correcting function according to the second embodiment.
Figure 23A:
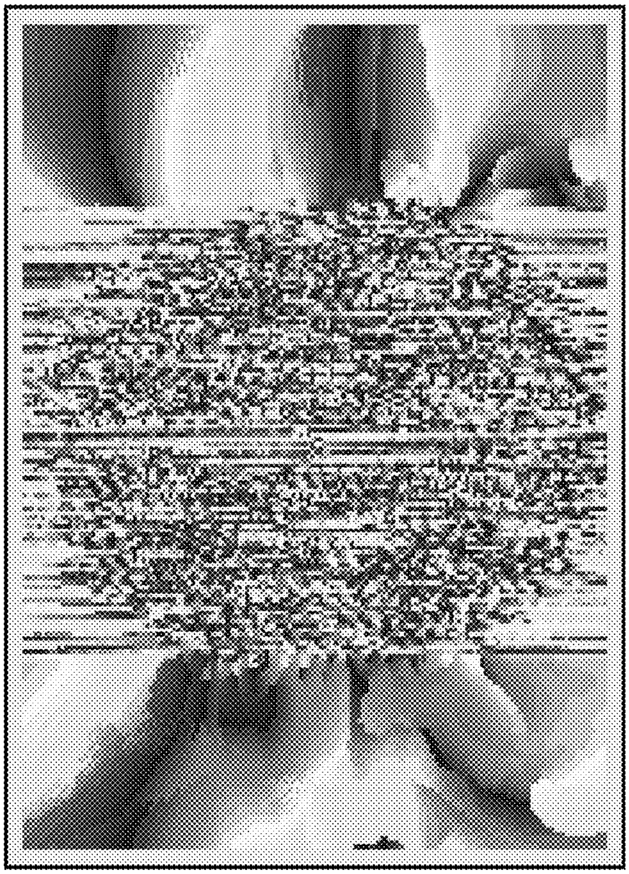

More specifically, FIGS. 22A to 23B illustrate shift maps obtained by mapping the shift amounts determined for each of the pixels. FIGS. 22A and 22B illustrate shift maps in the X direction, whereas FIGS. 23A and 23B illustrate shift maps in the Y direction. Further, FIGS. 22A and 23A illustrate shift maps obtained when the shift amount of each of the pixels is determined from among all the shift amounts used in the ringing correction, whereas FIGS. 22B and 23B illustrate shift maps obtained when the shift amount of each of the pixels is determined by using the shift amounts within the tolerance range described above.

For example, as illustrated in FIGS. 22A and 23B, when the shift amounts are determined from among the full range of shift amounts used in the ringing correction, the shift amount of each pixel is determined independently, and continuity with adjacently positioned pixels is ignored. As a result, although ringing artifacts are corrected, the final corrected image becomes blurred throughout the image.

In contrast, as illustrated in FIGS. 22B and 23B, when the shift amount of each of the pixels is determined while using shift amounts within the tolerance range described above, the shift amount of each of the pixels is determined so as to be approximately continuous with the shift amounts of the adjacently positioned pixels, and in addition, the shift amount determination is limited to pixels that have a non-trivial local amplitude of ringing artifacts. As a result, the final image to be generated is an image in which ringing artifacts have been corrected and which is less blurred than an image processed by a conventional method for countering ringing artifacts.

As explained above, in the image processing apparatus 100 according to the second embodiment, the ringing correcting function 153 is configured, with respect to each of the pixels included in each of the shift images, to determine the shift amount from the position of the pixel to the position where the ringing artifacts will be reduced and configured to perform the ringing correction to correct the ringing artifacts occurring in the shift images on the basis of the determined shift amounts. In this situation, the ringing correcting function 153 is configured, with respect to each of the pixels included in each of the shift images, to estimate the local amplitude of ringing artifacts and to perform the ringing correction on each of the shift images, while determining the shift amount of each of the pixels so as to be approximately continuous with the shift amounts of the adjacently positioned pixels, sequentially in the descending order starting with the pixels having higher local amplitude, on the basis of the result of estimating the local amplitude of ringing artifacts.

Consequently, the image processing apparatus 100 according to the second embodiment is able to provide an MR image in which ringing artifacts have been corrected, and which is less blurred than an image generated from the same data according to the original sub-voxel shift method.

Figure 24B:
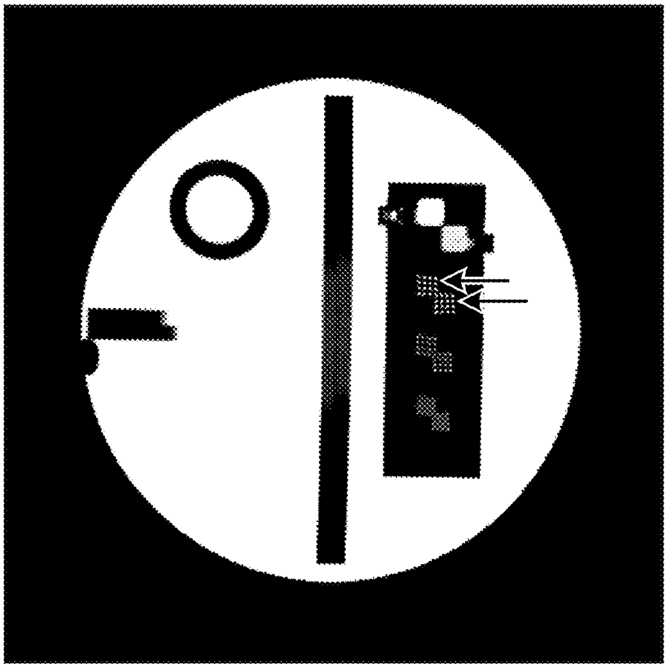
FIGS. 24A and 24B are drawings illustrating advantageous effects of the image processing apparatus according to the second embodiment.
Figure 24A:
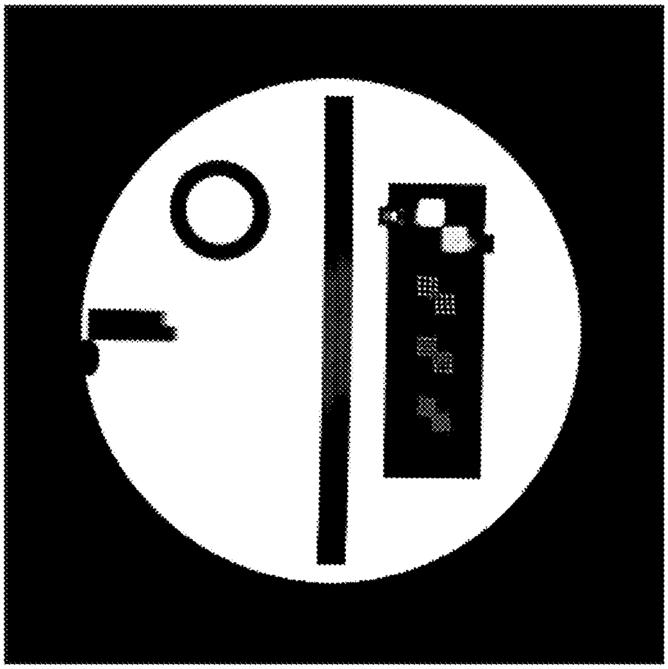

FIGS. 24A and 24B are drawings illustrating advantageous effects of the image processing apparatus 100 according to the second embodiment.

More specifically, FIG. 24A illustrates a result of performing a ringing correction on an MR image of a phantom, by using the ringing correcting method that employs sub-voxel shifts, without taking into account the continuity of shift amount between adjacently positioned pixels. FIG. 24B illustrates a result of performing the ringing correction described in the present embodiment on the same MR image as in FIG. 24A.

For example, when the ringing correction is performed by using the ringing correcting method that employs sub-voxels shifts without taking into account the continuity of shift amount between adjacently positioned pixels, a shift amount is determined for each and every pixel in the image, and the shift amount of each of the pixels is determined while ignoring continuity between adjacently positioned pixels. As a result, as illustrated in FIG. 24A, in the generated final image, although ringing artifacts have been corrected, the image is blurred throughout the image.

In contrast, when the ringing correction described in the present embodiment is performed, the shift amount of each of the pixels is determined so as to be approximately continuous with the shift amounts of adjacently positioned pixels. As a result, as illustrated in FIG. 24B, the generated final image is an image in which ringing artifacts have been corrected and which is less blurred than an image processed by a conventional method for countering ringing artifacts (see the sections indicated by the arrows in the drawing). Further, because the local amplitude of ringing artifacts is considered for each pixel, the shift amount determination can be limited to pixels that have a non-trivial local amplitude of ringing artifacts, while for all other pixels having a trivial local amplitude, the shift amount can be set to zero. It is therefore possible to reduce the number of computations and shorten the processing time.

Generally speaking, the ringing correcting method that employs sub-voxel shifts is frequently employed in studies of the brain. In this field, result images and statistics are often calculated based on pixel values in MR images. For this reason, it is considered to be advantageous to use a ringing correcting method that, as described in the present embodiment, yields an MR image in which ringing artifacts are corrected and which is less blurred than an image generated from the same data according to the original sub-voxel shift method.

Further, in the second embodiment described above, the ringing correcting function 153 is configured to estimate the local amplitudes of ringing artifacts once, and to perform the ringing correction once thereafter based on the estimated local amplitudes; however, possible embodiments are not limited to this example. For instance, the ringing correcting function 153 may be configured to improve the accuracy of the estimated local amplitudes and the quality of the ringing correction by re-estimating the local amplitudes of ringing artifacts multiple times in an iterative fashion and then performing the final ringing correction. As another example, the ringing correcting function 152 may be configured to iteratively repeat the cycle of estimating local amplitudes of ringing artifacts, performing a ringing correction based on the estimates, and using the results to improve the estimates and the ringing correction performed in the next cycle.

As a result, it is possible to improve the level of precision in estimating the local amplitudes of ringing artifacts and to provide an MR image in which ringing artifacts have been corrected with a higher level of precision, and which is less blurred than an MR image processed by a conventional method for countering ringing artifacts.

Further, in the first and the second embodiments described above, the example was explained in which the MR image to be processed is a two-dimensional MR image defined with an X direction (the readout direction) and a Y direction (the phase encoding direction) that are orthogonal to each other; however, possible embodiments are not limited to this example.

For instance, an MRI apparatus is typically configured to scan a stack of two-dimensional MR images to enable the examination of a three-dimensional volume within a subject. In such cases, the embodiment described above may be applied likewise to each slice in the stack of slices.

Further, in cases where the MR sequence Fourier-encodes all three dimensions, by performing a ringing correction process regarding the Z direction (the slice-encoding direction) similarly to those performed for the X direction and the Y direction, it is possible to similarly apply the embodiment described above to situations where the MR image to be processed is a three-dimensional MR image.

Still further, in the first and the second embodiments described above, examples were explained in which the acquiring unit, the shifting unit, the correcting unit, and the combining unit of the present disclosure are realized by the MR image acquiring function, the image shifting function, the ringing correcting function, and the combining function of the processing circuitry, respectively; however, possible embodiments are not limited to this example. For instance, instead of being realized by the MR image acquiring function, the image shifting function, the ringing correcting function, and the combining function described in the embodiments, the acquiring unit, the shifting unit, the correcting unit, and the combining unit of the present disclosure may be realized by hardware alone, software alone, or a combination of hardware and software.

Third Embodiment

Certain embodiments of the image processing apparatus have thus been explained. However, possible embodiments of the techniques in the present disclosure are not limited to the above examples. For instance, the techniques in the present disclosure may be applied to an MRI apparatus. Thus, in the following sections, an example in which the techniques in the present disclosure are applied to an MRI apparatus will be explained as a third embodiment.

Figure 25:
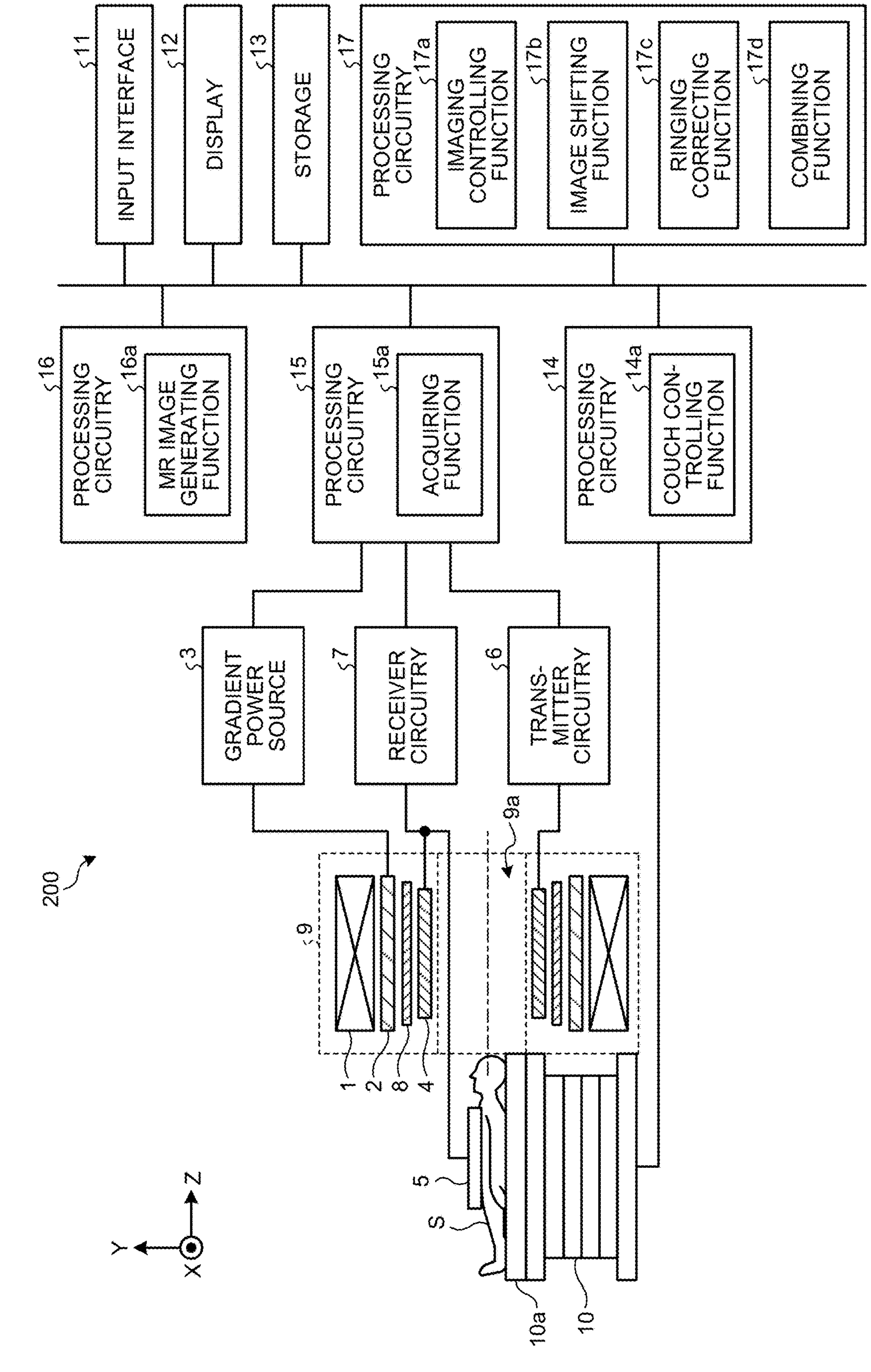
FIG. 25 is a diagram illustrating an exemplary configuration of an MRI apparatus according to a third embodiment.

FIG. 25 is a diagram illustrating an exemplary configuration of the MRI apparatus according to the third embodiment.

For example, as illustrated in FIG. 25, an MRI apparatus 200 includes a static magnetic field magnet 1, a gradient coil 2, a gradient power source 3, a whole-body RF coil 4, a local RF coil 5, transmitter circuitry 6, receiver circuitry 7, an RF shield 8, a gantry 9, a couch 10, an input interface 11, a display 12, a storage 13, and processing circuitry 14 to 17.

The static magnetic field magnet 1 is configured to generate a static magnetic field in an imaging space in which a subject S is placed. More specifically, the static magnetic field magnet 1 is formed to have a hollow and substantially circular cylindrical shape (which may have an oval cross-section orthogonal to the central axis thereof) and is configured to generate the static magnetic field in the imaging space formed on the inner circumferential side thereof. For example, the static magnetic field magnet 1 may be a superconductive magnet, a permanent magnet, or the like. In the present example, the superconductive magnet may be structured by using, for instance, a container filled with a cooling agent such as liquid helium and a superconductive coil immersed in the container.

The gradient coil 2 is arranged on the inside of the static magnetic field magnet 1 and is configured to generate gradient magnetic fields in the imaging space in which the subject S is placed. More specifically, the gradient coil 2 is formed to have a hollow and substantially circular cylindrical shape (which may have an oval cross-section orthogonal to the central axis thereof) and includes an X coil, a Y coil, and a Z coil respectively corresponding to an X-axis, a Y-axis, and a Z-axis that are orthogonal to one another. The X coil, the Y coil, and the Z coil are configured to generate, in the imaging space, the gradient magnetic fields that linearly change along the respective axial directions, on the basis of electric currents supplied thereto from the gradient power source 3. In this situation, the Z-axis is set along a magnetic flux in the static magnetic field generated by the static magnetic field magnet 1. Further, the X-axis is set along a horizontal direction orthogonal to the Z-axis. The Y-axis is set along a vertical direction orthogonal to the Z-axis. In this situation, the X-axis, the Y-axis, and the Z-axis structure an apparatus coordinate system unique to the MRI apparatus 200. In general, these X, Y, and Z axes do not correspond to the X (readout) axis, the Y (phase encoding) axis, and the Z (slice) axis that were referred to in explanations of other embodiments above, though the operator could choose them such that they correspond.

By supplying electric currents to the respective axis coils within the gradient coil 2, the gradient power source 3 is configured to cause the gradient magnetic fields to be generated. More specifically, by individually supplying the electric current to each of the X, Y, and Z coils in the gradient coil 2, the gradient power source 3 is configured to cause magnetic field gradients to be generated, so as to linearly change along the readout direction, the phase encoding direction, and the slice direction, respectively, that are orthogonal to one another. In this situation, the axis extending along the readout direction, the axis extending along the phase encoding direction, and the axis extending along the slice direction structure a logical coordinate system used for defining slice regions or a volume region subject to the imaging.

More specifically, as each being superimposed on the static magnetic field generated by the static magnetic field magnet 1, the magnetic field gradients generated along the readout direction, the phase encoding direction, and the slice direction append spatial position information to NMR signals emitted from the subject S. More specifically, the gradient magnetic field along the readout direction imparts position information along the readout direction to the NMR signal, by changing the frequency of the NMR signal in accordance with positions in the readout direction. Further, the gradient magnetic field along the phase encoding direction imparts position information along the phase encoding direction to the NMR signal, by changing the phase of the NMR signal in accordance with positions in the phase encoding direction. In addition, when two-dimensional MR images (slice images) are to be taken, the gradient magnetic field along the slice direction determines the positions, the thicknesses, and the quantity of the slices to be imaged, by changing the frequency of the NMR signal in accordance with positions in the slice direction. Further, when a three-dimensional MR image (a volume image) is to be taken, the gradient magnetic field along the slice direction imparts position information along the slice direction to the NMR signal, by changing the phase of the NMR signal in accordance with positions in the slice direction.

The whole-body RF coil 4 is arranged on the inner circumferential side of the gradient coil 2 and is configured to apply an RF pulse (an excitation pulse or the like) to the subject S placed in the imaging space and to receive the NMR signal (an echo signal or the like) emitted from the subject S due to the influence of the RF pulse. More specifically, the whole-body RF coil 4 is formed to have a hollow and substantially circular cylindrical shape (which may have an oval cross-section orthogonal to the central axis thereof) and is configured to apply the RF pulse to the subject S placed in the imaging space positioned on the inner circumferential side thereof, on the basis of an RF pulse signal supplied thereto from the transmitter circuitry 6. Further, the whole-body RF coil 4 is configured to receive the NMR signal emitted from the subject S due to the influence of the RF pulse and to output the received NMR signal to the receiver circuitry 7. For example, the whole-body RF coil 4 may be a birdcage coil or a Transverse Electromagnetic (TEM) coil.

The local RF coil 5 is arranged in the vicinity of the subject S at the time of imaging and is configured to receive the NMR signal emitted from the subject S. More specifically, a local RF coil 5 may be prepared for each anatomical region of the subject S. At the time of imaging the subject S, the local RF coil 5 is arranged in the vicinity of the site to be imaged and is configured to receive the NMR signal emitted from the subject S due to the influence of the RF pulse applied by the whole-body RF coil 4 and to output the received NMR signal to the receiver circuitry 7. For example, the local RF coil 5 may be a surface coil or a phased array coil structured by combining together a plurality of surface coils as coil elements. In addition, the local RF coil 5 may further have a transmitting function to apply an RF pulse to the subject.

The transmitter circuitry 6 is configured to output the RF pulse signal corresponding to a resonance frequency (a Larmor frequency) unique to targeted atomic nuclei placed in the static magnetic field, to the whole-body RF coil 4 or the local RF coil 5. More specifically, the transmitter circuitry 6 includes a pulse generator, an RF generator, a modulator, and an amplifier. The pulse generator is configured to generate a waveform of the RF pulse signal. The RF generator is configured to generate an RF signal having the resonance frequency. The modulator is configured to generate the RF pulse signal by modulating the amplitude of the RF signal generated by the RF generator, with the waveform generated by the pulse generator. The amplifier is configured to amplify the RF pulse signal generated by the modulator and to output the amplified signal to the whole-body RF coil 4 or the local RF coil 5.

The receiver circuitry 7 is configured to generate the NMR data on the basis of the NMR signal received from the whole-body RF coil 4 or the local RF coil 5 and to output the generated NMR data to the processing circuitry 15. More specifically, the receiver circuitry 7 includes a selector, a pre-amplifier, a phase detector, and an analog/digital (A/D) converter. The selector is configured to selectively receive an input of the NMR signal output from the whole-body RF coil 4 or the local RF coil 5. The pre-amplifier is configured to amplify the NMR signal received from the selector. The phase detector is configured to detect the phase of the NMR signal received from the pre-amplifier. The A/D converter is configured to generate the NMR data by converting an analog signal received from the phase detector into a digital signal and to output the generated NMR data to the processing circuitry 15. In this situation, the processes described as being performed by the receiver circuitry 7 do not all necessarily have to be performed by the receiver circuitry 7. One or more of the processes (e.g., the process performed by the A/D converter) may be performed by the whole-body RF coil 4 or the local RF coil 5.

The RF shield 8 is arranged between the gradient coil 2 and the whole-body RF coil 4 and is configured to shield the gradient coil 2 from the RF pulse generated by the whole-body RF coil 4. More specifically, the RF shield 8 is formed to have a hollow and substantially circular cylindrical shape (which may have an oval cross-section orthogonal to the central axis thereof) and is arranged in the space on the inner circumferential side of the gradient coil 2 so as to cover the outer circumferential surface of the whole-body RF coil 4.

The gantry 9 has a hollow bore 9*a* formed to have a substantially circular cylindrical shape (which may have an oval cross-section orthogonal to the central axis thereof) and houses therein the static magnetic field magnet 1, the gradient coil 2, the whole-body RF coil 4, and the RF shield 8. More specifically, the gantry 9 houses these elements therein, while the whole-body RF coil 4 is arranged on the outer circumferential side of the bore 9*a*; the RF shield 8 is arranged on the outer circumferential side of the whole-body RF coil 4; the gradient coil 2 is arranged on the outer circumferential side of the RF shield 8; and the static magnetic field magnet 1 is arranged on the outer circumferential side of the gradient coil 2. In this situation, the space inside the bore 9*a* included in the gantry 9 serves as the imaging space in which the subject S is placed at the time of the imaging.

The couch 10 includes a couchtop 10*a* on which the subject S is placed. At the time of imaging the subject S, the couchtop 10*a* on which the subject S is placed is moved into the imaging space. For example, the couch 10 is installed in such a manner that the longitudinal direction of the couchtop 10*a* extends parallel to the central axis of the static magnetic field magnet 1.

In the present example, the MRI apparatus 200 has a so-called tunnel-like structure in which the static magnetic field magnet 1, the gradient coil 2, and the whole-body RF coil 4 are each formed to have the substantially circular cylindrical shape; however, possible embodiments are not limited to this example. For instance, the MRI apparatus 200 may have a so-called open structure in which a pair of static magnetic field magnets, a pair of gradient coils, and a pair of RF coils are arranged so as to oppose each other, while the imaging space in which the subject S is placed is interposed therebetween. In the open structure, the space interposed between the pair of static magnetic field magnets, the pair of gradient coils, and the pair of RF coils corresponds to the bore in the tunnel-like structure.

The input interface 11 is configured to receive operations that convey various types of instructions and various types of information from the operator. More specifically, the input interface 11 is connected to the processing circuitry 17 and is configured to convert the input operations received from the operator into electrical signals and to output the electrical signals to the processing circuitry 17. For example, the input interface 11 is realized by using a trackball, a switch button, a mouse, a keyboard, a touchpad on which an input operation can be performed by touching an operation surface thereof, a touch screen in which a display screen and a touchpad are integrally formed, contactless input circuitry using an optical sensor, audio input circuitry, and/or the like that are used for setting image acquisition conditions, a Region Of Interest (ROI), and the like. In the present disclosure, the input interface 11 does not necessarily have to include one or more physical operational component parts such as a mouse, a keyboard, and/or the like. Examples of the input interface 11 include, for instance, electrical signal processing circuitry configured to receive an electrical signal corresponding to an input operation from an external input machine provided separately from the apparatus and to output the electrical signal to controlling circuitry.

The display 12 is configured to display various types of information. More specifically, the display 12 is connected to the processing circuitry 17 and is configured to convert data of various types of information sent thereto from the processing circuitry 17 into display-purpose electrical signals and to output the electrical signals. For example, the display 12 is realized by using a liquid crystal monitor, a Cathode Ray Tube (CRT) monitor, a touch panel, or the like.

The storage 13 is configured to store various types of data therein. More specifically, the storage 13 is connected to the processing circuitry 14 to 17 and is configured to store therein various types of data input and output by the processing circuitry. For example, the storage 13 is realized by using a semiconductor memory element such as a Random Access Memory (RAM) or a flash memory, or a hard disk, an optical disk, or the like.

The processing circuitry 14 includes a couch controlling function 14*a*. The couch controlling function 14*a* is configured to control operations of the couch 10 by outputting control-purpose electrical signals to the couch 10. For example, via the input interface 11, the couch controlling function 14*a* is configured to receive, from the operator, an instruction to move the couchtop 10*a* in a longitudinal direction, an up-and-down direction, or a left-and-right direction and to bring a moving mechanism of the couchtop 10*a* included in the couch 10 into operation, so as to move the couchtop 10*a* according to the received instruction.

The processing circuitry 15 includes an acquiring function 15*a*. The acquiring function 15*a* is configured to acquire k-space data of the subject S on the basis of an imaging sequence output from the processing circuitry 17. More specifically, the acquiring function 15*a* is configured to acquire the NMR data by driving the gradient power source 3, the transmitter circuitry 6, the receiver circuitry 7, and the whole-body RF coil 4 or local RF coil 5, according to any of various types of imaging sequences output from the processing circuitry 17. In this situation, each of the imaging sequences is information that defines: the timing with which the electric current is to be supplied by the gradient power source 3 to the gradient coil 2 and the intensity of the electric current to be supplied; the timing with which the RF pulse signal is to be supplied by the transmitter circuitry 6 to the whole-body RF coil 4 or local RF coil 5, and the intensity of the RF pulse signal to be supplied; the timing with which the NMR signal is sampled by the receiver circuitry 7; and the like. Further, the acquiring function 15*a* is configured to store the NMR data output by the receiver circuitry 7 and the local RF coil 5 into the storage 13. In this situation, the NMR data stored in the storage 13 is stored as the k-space data expressing a two- or three-dimensional k-space, as a result of having appended thereto the position information along the directions of the readout direction, the phase encoding direction, and the slice direction, by the gradient magnetic fields explained above.

The processing circuitry 16 includes an MR image generating function 16*a*. The MR image generating function 16*a* is configured to generate an MR image on the basis of the k-space data of the subject S acquired by the acquiring function 15*a* of the processing circuitry 15. More specifically, the MR image generating function 16*a* is configured to generate a two- or three-dimensional MR image by reading the k-space data acquired by the acquiring function 15*a* of the processing circuitry 15 from the storage 13 and performing a reconstruction process such as a Fourier transform on the read k-space data. After that, the MR image generating function 16*a* is configured to store the generated MR image into the storage 13. In this situation, the MR image generating function 16*a* is an example of the generating unit.

The processing circuitry 17 includes an imaging controlling function 17*a*. The imaging controlling function 17*a* is configured to receive an input of the image acquisition conditions from the operator via the input interface 11 and to generate the imaging sequence used for acquiring the k-space data of the subject S on the basis of the input image acquisition conditions. Further, by outputting the generated imaging sequence to the processing circuitry 15, the imaging controlling function 17*a* is configured to cause the acquiring function 15*a* to acquire the k-space data. In addition, by controlling the processing circuitry 16, the imaging controlling function 17*a* is configured to have the MR image generated from the k-space data acquired by the acquiring function 15*a*. Furthermore, the imaging controlling function 17*a* is configured to read any of MR images stored in the storage 13 in response to a request from the operator and to cause the display 12 to display the read MR image.

The MRI apparatus 200 according to the present embodiment structured as described above has a function for correcting ringing artifacts in the MR image.

Further, the MRI apparatus 200 according to the present embodiment is configured to be able to provide the MR image in which the ringing artifacts have been corrected and which has a higher resolution than the image before ringing artifacts were corrected.

More specifically, the processing circuitry 17 includes an image shifting function 17*b*, a ringing correcting function 17*c*, and a combining function 17*d*. In this situation, the image shifting function 17*b* is an example of the shifting unit. The ringing correcting function 17*c* is an example of the correcting unit. The combining function 17*d* is an example of the combining unit.

Similarly to the image shifting function 152 explained in the first or the second embodiment, the image shifting function 17*b* is configured, by using the MR image generated by the MR image generating function 16*a*, to obtain a plurality of shift images resulting from shifting the positions of pixels included in the MR image by a plurality of mutually-different shift amounts on the basis of the MR image.

More specifically, the image shifting function 17*b* is configured to read the MR image generated by the MR image generating function 16*a* from the storage 13 and to perform the same processes as those performed by the image shifting function 152 explained in the first or the second embodiment by using the read MR image.

Similarly to the ringing correcting function 153 explained in the first or the second embodiment, the ringing correcting function 17*c* is configured to generate a plurality of ringing-corrected images, by determining, with respect to each of the pixels included in each of the plurality of shift images generated by the image shifting function 17*b*, a shift amount from the position of the pixel to a position where ringing artifacts will be reduced and further performing the ringing correction to correct the ringing artifacts occurring in the shift images on the basis of the determined shift amounts.

Similarly to the combining function 154 explained in the first or the second embodiment, the combining function 17*d* is configured to generate a combined image by combining, while interleaving, the pixels included in each of the plurality of ringing-corrected images generated by the ringing correcting function 17*c*.

The processing functions of the processing circuitry 14 to 17 have thus been explained. For example, the processing circuitry described above may be realized by using one or more processors. In that situation, the processing functions of the processing circuitry may be stored in the storage 13 in the form of computer-executable programs, for example. Further, the processing circuitry is configured to realize the processing functions corresponding to the programs, by reading and executing the programs from the storage 13. In other words, the processing circuitry that has read the programs has the processing functions illustrated in FIG. 25.

As explained above, in the MRI apparatus 200 according to the third embodiment, the image shifting function 17*b*, the ringing correcting function 17*c*, and the combining function 17*d* perform the same processes as those performed by the image shifting function 152, the ringing correcting function 153, and the combining function 154 explained in the first or the second embodiment, by using the MR image generated by the MR image generating function 16*a*.

Consequently, similarly to the image processing apparatus 100 explained in the first or the second embodiment, the MRI apparatus 200 according to the third embodiment is able to provide the MR image in which ringing artifacts have been corrected and which has a higher resolution than the image before ringing artifacts were corrected.

Further, in the third embodiment described above, the example was explained in which the generating unit, the shifting unit, the correcting unit, and the combining unit of the present disclosure are realized by the MR image generating function, the image shifting function, the ringing correcting function, and the combining function of the processing circuitry, respectively; however, possible embodiments are not limited to this example. For instance, instead of being realized by the MR image generating function, the image shifting function, the ringing correcting function, and the combining function described in the embodiment, the generating unit, the shifting unit, the correcting unit, and the combining unit of the present disclosure may be realized by hardware alone, software alone, or a combination of hardware and software.

Other Embodiments

It is also possible to apply the configuration of the image processing apparatus 100 described in the above embodiments, to a system intermediated by a network such as a cloud. In that situation, for example, processing circuitry provided in a server apparatus included in the system has installed therein the same processing functions as the MR image acquiring function, the image shifting function, the ringing correcting function, and the combining function described above. Further, a combined image generated by the combining function installed in the processing circuitry of the server apparatus is transmitted to a client apparatus used by a user of the system, so as to be displayed on a display or the like provided for the client apparatus.

Further, in the embodiments described above, the processing circuitry does not necessarily have to be realized by using a single processor and may be structured by combining together a plurality of independent processors, so that the processing functions are realized as a result of the processors executing the programs. Further, the processing functions of the processing circuitry may be realized as being distributed among or integrated into one or more pieces of processing circuitry, as appropriate. Furthermore, in the above embodiments, the example was explained in which the programs corresponding to the processing functions are stored in the single storage; however possible embodiments are not limited to this example. For instance, the programs corresponding to the processing functions may be stored in a distributed manner in a plurality of storages so that the processing circuitry reads and executes the programs from the storages.

The term "processor" used in the above description of the embodiments denotes, for example, a Central Processing Unit (CPU), a Graphics Processing Unit (GPU), or circuitry such as an Application Specific Integrated Circuit (ASIC) or a programmable logic device (e.g., a Simple Programmable Logic Device (SPLD), a Complex Programmable Logic Device (CPLD), or a Field Programmable Gate Array (FPGA)). In this situation, instead of having the programs saved in the storage, it is also acceptable to directly incorporate the programs in the circuitry of one or more processors. In that situation, the one or more processors are configured to realize the functions by reading and executing the programs incorporated in the circuitry thereof. Further, the processors of the present embodiments do not each necessarily have to be structured as a single piece of circuitry. It is also acceptable to structure one processor by combining together a plurality of pieces of independent circuitry so as to realize the function thereof.

In this situation, the programs executed by the one or more processors are provided as being incorporated in advance in a Read-Only Memory (ROM), storage, or the like. The programs may be provided as being recorded on a non-transitory computer-readable storage medium such as a Compact Disk Read-Only Memory (CD-ROM), a Flexible Disk (FD), a Compact Disk Recordable (CD-R), or a Digital Versatile Disk (DVD), in a file that is in an installable or executable format for the apparatuses. Further, the programs may be stored in a computer connected to a network such as the Internet so as to be provided or distributed as being downloaded via the network. For example, the programs are structured as modules including the processing functions described above. In the actual hardware, as a result of a CPU reading and executing the programs from a storage medium such as a ROM, the modules are loaded into a main storage apparatus so as to be generated in the main storage apparatus.

Further, the constituent elements of the apparatuses illustrated in the drawings of the above embodiments are based on functional concepts. Thus, it is not necessarily required to physically configure the constituent elements as indicated in the drawings. In other words, specific modes of distribution and integration of the apparatuses are not limited to those illustrated in the drawings. It is acceptable to functionally or physically distribute or integrate all or a part of the apparatuses in any arbitrary units, depending on various loads and the status of use. Further, all or an arbitrary part of the processing functions performed by the apparatuses may be realized by a CPU and a program analyzed and executed by the CPU or may be realized as hardware using wired logic.

Furthermore, with regard to the processes described in the above embodiments, it is acceptable to manually perform all or a part of the processes described as being performed automatically. Conversely, by using a publicly-known method, it is also acceptable to automatically perform all or a part of the processes described as being performed manually. Further, unless noted otherwise, it is acceptable to arbitrarily modify any of the processing procedures, the controlling procedures, specific names, and various information including various types of data and parameters that are presented in the above text and the drawings.

The various types of data handled in the present disclosure are, typically, digital data.

According to at least one aspect of the embodiments described above, it is possible to provide MR images in which ringing artifacts have been corrected and which have a higher resolution than the original MR images before ringing artifacts were corrected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the scope of the inventions as defined by the appended claims.

In relation to the embodiments described above, the following notes are presented as a number of aspects of the present disclosure and selected characteristics:

Note 1:

An image processing apparatus, comprising:

- an acquiring unit configured to acquire a magnetic resonance image;
- a shifting unit configured to obtain, on a basis of the magnetic resonance image, a plurality of shift images resulting from shifting positions of pixels included in the magnetic resonance image by a plurality of mutually-different shift amounts;
- a correcting unit configured to generate a plurality of ringing-corrected images, by determining, with respect to each of the pixels included in each of the plurality of shift images, a shift amount from the position of the pixel to a position where ringing artifacts will be reduced and further performing a ringing correction to correct the ringing artifacts occurring in the shift images on the basis of the determined shift amounts; and
- a combining unit configured to generate a combined image in which the plurality of ringing-corrected images are combined, by combining, while interleaving, pixels included in each of the plurality of ringing-corrected images.

The plurality of shift images are obtained by applying the plurality of mutually-different shift amounts. In other words, the shifting unit is configured to obtain the plurality of shift images by, for each of the shift images, applying different ones of a plurality of shift amounts to the magnetic resonance image.

The shifting unit may generate k-space data of a first ringing image in which a ringing artifact remains only in the second direction by applying a filter that suppresses higher spatial frequency components in the first direction to k-space data of the magnetic resonance image. The shifting unit may obtain a first subset of the plurality of shift images on the basis of the k-space data of the first ringing image. The first subset of the plurality of shift images may be obtained by applying an inverse fourier transform and different shift amounts to the first ringing image. The shifting unit may be further configured to generate k-space data of a second ringing image in which a ringing artifact remains only in the first direction by applying a filter that suppresses higher spatial frequency components in the second direction to the k-space data of the magnetic resonance image. The shifting unit may obtain a second subset of the plurality of second shift images on the basis of the k-space data of the second ringing image. The second subset of the plurality of shift images may be obtained by applying an inverse fourier transform and different shift amounts to the second ringing image.

The plurality of ringing corrected images may comprise a first ringing corrected image determined by determining for each of the respective pixels, a shift amount in a first direction to the respective position where ringing artifacts will be reduced. The plurality of ringing corrected images may comprise a second ringing corrected image determined by determining for each of the respective pixels, a shift amount in a second direction to the respective position where ringing artifacts will be reduced.

In some embodiments, the correcting unit is configured to generate each of the ringing corrected images from a respective subset of the plurality of shift images. A first subset of the shift images may be associated with different shift amounts in a first direction and a second subset of the shift images may be associated with different shift amounts in a second direction. The correcting unit may be configured to generate a first of the ringing corrected images by determining with respect to each of the pixels included in the first subset of shift images, the shift amount to the position where ringing artifacts will be reduced by determining the total variation for each pixel value. For the first ringing corrected image, this comprises, for each of the pixels, determining, for each of the set of different shift amounts associated with the first subset of the shift images, the difference in the signal values between the respective pixel and a predetermined number of pixels surrounding the respective pixel once the pixels have been shifted by the respective shift amount. The ringing correction function selects the one of the shift amounts for the respective pixel in dependence upon which shift amount minimizes the sum of the calculated difference values between the respective pixel and its surrounding pixels. The first ringing correction image is produced using the selected shift amounts in the first direction for each pixel. Similarly, the total variation may be determined for the pixels in the second subset of the plurality of shift images. For the second ringing corrected image, this comprises, for each of the pixels, determining, for each of the set of different shift amounts associated with the second subset of the shift images, the difference in the signal values between the respective pixel and a predetermined number of pixels surrounding the respective pixel once the pixels have been shifted by the respective shift amount. The ringing correction function selects the one of the shift amounts for the respective pixel in dependence upon which shift amount minimizes the sum of the calculated difference values between the respective pixel and its surrounding pixels. The second ringing correction image is produced using the selected shift amounts in the second direction for each pixel.

Note 2:

The shifting unit may be further configured to obtain the plurality of shift images, by using the magnetic resonance image as a first shift image of which the shift amount is 0 and generating a shift image resulting from shifting the position of the pixel sampling grid of the magnetic resonance image by a shift amount different from 0 as a second shift image.

Note 3:

The shifting unit may be further configured to obtain the plurality of shift images, by generating a shift image resulting from shifting the position of the pixel sampling grid of the magnetic resonance image by a first shift amount different from 0 as a first shift image and generating another shift image resulting from shifting the position of the pixel sampling grid of the magnetic resonance image by a second shift amount in the direction opposite to the direction used for the first shift image, as a second shift image.

Note 4:

The shifting unit may be further configured to obtain the plurality of shift images, by using the magnetic resonance image as a first shift image of which the shift amount is 0, generating a shift image resulting from shifting the position of the pixel sampling grid of the magnetic resonance image by a first shift amount different from 0 as a second shift image, and generating another shift image grid of the magnetic resonance image by a second shift amount equal to the first shift amount in the opposite direction from a direction used for the second shift image, as a third shift image.

Note 5:

The shifting unit may be further configured to obtain, on the basis of the magnetic resonance image, a plurality of first shift images resulting from shifting the position of the pixel sampling grid of the magnetic resonance image in a first direction, the correcting unit may be further configured to generate a plurality of first ringing-corrected images by performing the ringing correction on each of the plurality of first shift images, the combining unit may be further configured to generate an intermediate combined image by combining, while interleaving, pixels included in each of the plurality of first ringing-corrected images, the shifting unit may be further configured to obtain, on the basis of the intermediate combined image, a plurality of second shift images resulting from shifting the positions of pixels included in the intermediate combined image in a second direction different from the first direction, the correcting unit may be further configured to generate a plurality of second ringing-corrected images, by performing the ringing correction on each of the plurality of second shift images, and the combining unit may be further configured to generate a final combined image by combining, while interleaving, pixels included in each of the plurality of second ringing-corrected images.

Note 6:

The shifting unit may be further configured to obtain, on the basis of the magnetic resonance image, a plurality of first shift images resulting from shifting the position of the pixel sampling grid of the magnetic resonance image in a first direction, the combining unit may be further configured to generate a first intermediate combined image, by combining, while interleaving, the pixels included in each of the plurality of first shift images, the shifting unit may be further configured to obtain, on the basis of the first intermediate combined image, a plurality of second shift images resulting from shifting the positions of pixels included in the first intermediate combined image in a second direction different from the first direction, the correcting unit may be further configured to generate a plurality of first ringing-corrected images by performing the ringing correction on each of the plurality of second shift images, the combining unit may be further configured to generate a second intermediate combined image by combining, while interleaving, pixels included in each of the plurality of first ringing-corrected images, the shifting unit may be further configured to obtain, on the basis of the magnetic resonance image, a plurality of third shift images resulting from shifting the position of the pixel sampling grid of the magnetic resonance image in the second direction, the combining unit may be further configured to generate a third intermediate combined image by combining, while interleaving, the pixels included in each of the plurality of third shift images, the shifting unit may be further configured, on the basis of the third intermediate combined image, to obtain a plurality of fourth shift images resulting from shifting the positions of pixels included in the third intermediate combined image in the first direction, the correcting unit may be further configured to generate a plurality of second ringing-corrected images by performing the ringing correction on each of the plurality of fourth shift images, the combining unit may be further configured to generate a fourth intermediate combined image, by combining, while interleaving, pixels included in each of the plurality of second ringing-corrected images, and the combining unit may be further configured to generate a final combined image by adding together the second intermediate combined image and the fourth intermediate combined image.

Note 7:

The shifting unit may be further configured to generate k-space data of a first ringing image in which a ringing artifact remain along the second direction only by applying a filter that suppresses a higher spatial frequency components in the first direction to k-space data of the magnetic resonance image and configured to obtain the plurality of first shift images on the basis of the k-space data of the first ringing image, and the shifting unit may be further configured to generate k-space data of a second ringing image in which a ringing artifact remain along the first direction only by applying a filter that suppresses higher spatial frequency components in the second direction to the k-space data of the magnetic resonance image and configured to obtain the plurality of second shift images on the basis of the k-space data of the second ringing image.

Note 8:

The combining unit may be further configured to generate the combined image, by sorting the pixels included in the plurality of ringing-corrected images according to an order of the positions thereof within the magnetic resonance image and subsequently combining, while interleaving, the pixels in the sorted order.

Note 9:

The correcting unit may be further configured to estimate, with respect to each of the pixels included in the shift images, a local amplitude of ringing artifacts, and the correcting unit may be further configured to perform the ringing correction on the shift images, while determining the shift amount of each of the pixels so as to be approximately continuous with shift amounts of adjacently positioned pixels, sequentially in descending order starting with pixels having higher local amplitude on the basis of a result of estimating the local amplitude of ringing artifacts.

Note 10:

the correcting unit may be further configured to generate, as the result of estimating the local amplitude of ringing artifacts, a ringing map indicating the local amplitude of ringing artifacts with respect to the pixels included in the shift image, and the correcting unit may be further configured to perform the ringing correction on the shift images, while determining the shift amount of each of the pixels, sequentially in descending order starting with the pixels having higher local amplitude on the basis of the ringing map.

Note 11:

The correcting unit may be further configured to perform an initial ringing correction, one that does not require a ringing map, on the shift images and to generate a ringing map on the basis of a difference image between the ringing-corrected image and the shift image before ringing correction.

Note 12:

The correcting unit may be further configured to set a first threshold value related to the local amplitude of ringing artifacts, the correcting unit may be further configured to determine, with respect to each of the pixels of which the local amplitude is equal to or higher than the first threshold value, the shift amount so as to be close to the shift amounts of the adjacently positioned pixels, and the correcting unit may be further configured to determine, with respect to each of the pixels of which the local amplitude is lower than the first threshold value, the shift amount so as to be close to the shift amounts of the adjacently positioned pixels and to subsequently adjust the determined shift amounts so that the shift amounts gradually diminish, sequentially in descending order starting with the pixels having higher local amplitude.

Note 13:

The correcting unit may be further configured to set a second threshold value smaller than the first threshold value, and set the shift amount to 0 for each of the pixels of which the local amplitude of ringing artifacts is lower than the second threshold value.

Note 14:

The correcting unit may be further configured to set threshold values on the basis of the range of amplitudes of ringing artifacts across the magnetic resonance image, in combination with the number of pixels included in the magnetic resonance image. The correcting unit may be further configured to compute the residual range of amplitudes of ringing artifacts after excluding trivially low amplitudes, or extremely high amplitudes, or both, as the range of amplitudes of ringing artifacts to consider when setting the threshold values.

Note 15:

The correcting unit may be further configured to set a reference amplitude value on the basis of the range of amplitudes of ringing artifacts across the magnetic resonance image, in combination with the number of pixels included in the magnetic resonance image. After that, the correcting unit sets the threshold values by multiplying the reference amplitude value by predetermined constant parameters, one for each threshold.

The correcting unit may be further configured to set the first threshold value by multiplying the reference amplitude value by a predetermined constant parameter, and to set the second threshold value by multiplying the reference amplitude value by a another predetermined constant parameter.

Note 16:

The correcting unit may be further configured to iteratively improve the accuracy of the estimated local amplitudes and the quality of the ringing correction by re-estimating the local amplitudes of ringing artifacts and performing a ringing correction twice or multiple times.

Note 17:

An image processing method, comprising:

an acquiring step of acquiring a magnetic resonance image;

a shifting step of obtaining, on a basis of the magnetic resonance image, a plurality of shift images resulting from shifting positions of pixels included in the magnetic resonance image by a plurality of mutually-different shift amounts;

a correcting step of generating a plurality of ringing-corrected images, by determining, with respect to each of the pixels included in each of the plurality of shift images, a shift amount from the position of the pixel to a position where ringing artifacts will be reduced and further performing a ringing correction to correct the ringing artifacts occurring in the shift images on the basis of the determined shift amounts; and a combining step of generating a combined image in which the plurality of ringing-corrected images are combined, by combining, while interleaving, pixels included in each of the plurality of ringing-corrected images.

Note 18:

A magnetic resonance imaging apparatus, comprising:

a generating unit configured to generate a magnetic resonance image;

a shifting unit configured to obtain, on a basis of the magnetic resonance image, a plurality of shift images resulting from shifting positions of pixels included in the magnetic resonance image by a plurality of mutually-different shift amounts;

a correcting unit configured to generate a plurality of ringing-corrected images, by determining, with respect to each of the pixels included in each of the plurality of shift images, a shift amount from the position of the pixel to a position where ringing artifacts will be reduced and further performing a ringing correction to correct the ringing artifacts occurring in the shift images on the basis of the determined shift amounts; and a combining unit configured to generate a combined image in which the plurality of ringing-corrected images are combined, by combining, while interleaving, pixels included in each of the plurality of ringing-corrected images.

What is claimed is:

1. An image processing apparatus, comprising:

processing circuitry configured to acquire a magnetic resonance image;

obtain, based on the magnetic resonance image, a plurality of shift images having mutually-different shift amounts in a first direction and resulting from shifting positions of pixels included in the magnetic resonance image by the mutually-different shift amounts, wherein the processing circuitry is configured to transform the magnetic resonance image into k-space and then perform the shifting in k-space to produce the plurality of shift images as k-space data;

generate a plurality of ringing-corrected images, by determining, with respect to each of the pixels included in each of the plurality of shift images, a shift amount from a position of the pixel to a position where ringing artifacts will be reduced, and further performing a ringing correction to correct the ringing artifacts occurring in the shift images based on the determined shift amounts; and generate a combined image in which the plurality of ringing-corrected images are combined, by combining, while interleaving, pixels included in each of the plurality of ringing-corrected images.

2. The image processing apparatus according to claim 1, wherein the processing circuitry is further configured to obtain the plurality of shift images, by using the magnetic resonance image as a first shift image of which the shift amount is 0 and generating a shift image resulting from shifting a position of a pixel sampling grid of the magnetic resonance image by a shift amount different from 0 as a second shift image.

3. The image processing apparatus according to claim 1, wherein the processing circuitry is further configured to obtain the plurality of shift images, by generating a shift image resulting from shifting a position of a pixel sampling grid of the magnetic resonance image by a first shift amount different from 0 as a first shift image, and generating another shift image resulting from shifting the position of the pixel sampling grid of the magnetic resonance image by a second shift amount in a direction opposite to a direction used for the first shift image, as a second shift image.

4. The image processing apparatus according to claim 1, wherein the processing circuitry is further configured to obtain the plurality of shift images, by using the magnetic resonance image as a first shift image of which the shift amount is 0, generating a shift image resulting from shifting a position of a pixel sampling grid of the magnetic resonance image by a first shift amount different from 0 as a second shift image, and generating another shift image resulting from shifting the position of the pixel sampling grid of the magnetic resonance image by a second shift amount equal to the first shift amount in a direction opposite to a direction used for the second shift image, as a third shift image.

5. The image processing apparatus according to claim 1, wherein the processing circuitry is further configured to obtain, based on the magnetic resonance image, a plurality of first shift images resulting from shifting a position of a pixel sampling grid of the magnetic resonance image in the first direction, the first shift images being expressed as k-space data, the processing circuitry is further configured to generate a plurality of first ringing-corrected images by performing the ringing correction on each of the plurality of first shift images, the processing circuitry is further configured to generate an intermediate combined image by combining, while interleaving, pixels included in each of the plurality of first ringing-corrected images, the processing circuitry is further configured to obtain, based on the intermediate combined image, a plurality of second shift images resulting from shifting positions of pixels included in the intermediate combined image in a second direction different from the first direction, the second shift images being expressed as k-space data, the processing circuitry is further configured to generate a plurality of second ringing-corrected images, by performing the ringing correction on each of the plurality of second shift images, and the processing circuitry is further configured to generate a final combined image by combining, while interleaving, pixels included in each of the plurality of second ringing-corrected images.

6. The image processing apparatus according claim 1, wherein the processing circuitry is further configured to obtain, based on the magnetic resonance image, a plurality of first shift images resulting from shifting, in k-space, a position of a pixel sampling grid of the magnetic resonance image in the first direction, the processing circuitry is further configured to generate a first intermediate combined image, by combining, while interleaving, pixels included in each of the plurality of first shift images, the processing circuitry is further configured to obtain, based on the first intermediate combined image, a plurality of second shift images resulting from shifting positions of pixels included in the first intermediate combined image in a second direction different from the first direction, the processing circuitry is further configured to generate a plurality of first ringing-corrected images by performing the ringing correction on each of the plurality of second shift images, the processing circuitry is further configured to generate a second intermediate combined image by combining, while interleaving, pixels included in each of the plurality of first ringing-corrected images, the processing circuitry is further configured to obtain, based on the magnetic resonance image, a plurality of third shift images resulting from shifting, in k-space, the position of the pixel sampling grid of the magnetic resonance image in the second direction, the processing circuitry is further configured to generate a third intermediate combined image by combining, while interleaving, the pixels included in each of the plurality of third shift images, the processing circuitry is further configured, based on the third intermediate combined image, to obtain a plurality of fourth shift images resulting from shifting, in k-space, positions of pixels included in the third intermediate combined image in the first direction, the processing circuitry is further configured to generate a plurality of second ringing-corrected images by performing the ringing correction on each of the plurality of fourth shift images, the processing circuitry is further configured to generate a fourth intermediate combined image, by combining, while interleaving, pixels included in each of the plurality of second ringing-corrected images, and the processing circuitry is further configured to generate a final combined image by adding together the second intermediate combined image and the fourth intermediate combined image.

7. The image processing apparatus according to claim 6, wherein the processing circuitry is further configured to generate k-space data of a first ringing image in which a ringing artifact remains along the second direction only by applying a filter that suppresses higher spatial frequency components in the first direction to k-space data of the magnetic resonance image, and obtain the plurality of first shift images based on the k-space data of the first ringing image, and the processing circuitry is further configured to generate k-space data of a second ringing image in which a ringing artifact remains along the first direction only by applying a filter that suppresses higher spatial frequency components in the second direction to the k-space data of the magnetic resonance image, and obtain the plurality of second shift images based on the k-space data of the second ringing image.

8. The image processing apparatus according to claim 1, wherein the processing circuitry is further configured to generate the combined image, by sorting the pixels included in the plurality of ringing-corrected images according to an order of positions thereof within the magnetic resonance image and subsequently combining, while interleaving, the pixels in the sorted order.

9. An image processing method, comprising:

acquiring a magnetic resonance image;

obtaining, based on the magnetic resonance image, a plurality of shift images having mutually-different shift amounts in a first direction and resulting from shifting positions of pixels included in the magnetic resonance image by the mutually-different shift amounts, wherein the obtaining of the plurality of shift images includes transforming the magnetic resonance image into k-space and then performing the shifting in k-space to produce the plurality of shift images as k-space data:

generating a plurality of ringing-corrected images, by determining, with respect to each of the pixels included in each of the plurality of shift images, a shift amount from a position of the pixel to a position where ringing artifacts will be reduced and further performing a ringing correction to correct the ringing artifacts occurring in the shift images based on the determined shift amounts; and generating a combined image in which the plurality of ringing-corrected images are combined, by combining, while interleaving, pixels included in each of the plurality of ringing-corrected images.

10. A magnetic resonance imaging apparatus, comprising:

processing circuitry configured to generate a magnetic resonance image;

obtain, based on the magnetic resonance image, a plurality of shift images having mutually-different shift amounts in a first direction and resulting from shifting positions of pixels included in the magnetic resonance image by the mutually-different shift amounts, wherein the processing circuitry is configured to transform the magnetic resonance image into k-space and then perform the shifting in k-space to produce the plurality of shift images as k-space data;

generate a plurality of ringing-corrected images, by determining, with respect to each of the pixels included in each of the plurality of shift images, a shift amount from a position of the pixel to a position where ringing artifacts will be reduced and further performing a ringing correction to correct the ringing artifacts occurring in the shift images based on the determined shift amounts; and generate a combined image in which the plurality of ringing-corrected images are combined, by combining, while interleaving, pixels included in each of the plurality of ringing-corrected images.

* * * * *